(12) United States Patent
Holec et al.

(10) Patent No.: US 11,266,014 B2
(45) Date of Patent: Mar. 1, 2022

(54) LED LIGHTING SYSTEMS AND METHOD

(71) Applicant: Metrospec Technology, L.L.C., Mendota Heights, MN (US)

(72) Inventors: Henry V. Holec, Mendota Heights, MN (US); Wm. Todd Crandell, Minnetonka, MN (US)

(73) Assignee: Metrospec Technology, L.L.C., Mendota Heights, MN (US)

( * ) Notice: Subject to any disclaimer, the term of this patent is extended or adjusted under 35 U.S.C. 154(b) by 0 days.

(21) Appl. No.: 16/450,366

(22) Filed: Jun. 24, 2019

(65) Prior Publication Data
US 2020/0053875 A1   Feb. 13, 2020

Related U.S. Application Data

(63) Continuation-in-part of application No. 13/592,090, filed on Aug. 22, 2012, now Pat. No. 10,334,735, (Continued)

(51) Int. Cl.
*H01R 13/717* (2006.01)
*H05K 1/11* (2006.01)
(Continued)

(52) U.S. Cl.
CPC ............ *H05K 1/0293* (2013.01); *H01R 4/02* (2013.01); *H01R 12/00* (2013.01); *H01R 12/523* (2013.01);
(Continued)

(58) Field of Classification Search
CPC .. H05K 1/0293; H05K 1/0266; H05K 1/0269; H05K 1/0292; H05K 1/0298;
(Continued)

(56) References Cited

U.S. PATENT DOCUMENTS 2,697,811 A   12/1954   Deming
2,731,609 A   1/1956   Sobell
(Continued)

FOREIGN PATENT DOCUMENTS

CN   201242082   5/2009
CN   201731316   2/2011
(Continued)

OTHER PUBLICATIONS

"Final Office Action," for U.S. Appl. No. 14/216,182, dated Jul. 17, 2015 (9 pages).
(Continued)

*Primary Examiner* — Timor Karimy
(74) *Attorney, Agent, or Firm* — Pauly, DeVries Smith & Deffner LLC

(57) ABSTRACT

Embodiments of the invention include LED lighting systems and methods. For example, in some embodiments, an LED lighting system is included. The LED lighting system can include a flexible layered circuit structure that can include a top thermally conductive layer, a middle electrically insulating layer, a bottom thermally conductive layer, and a plurality of light emitting diodes mounted on the top layer. The LED lighting system can further include a housing substrate and a mounting structure. The mounting structure can be configured to suspend the layered circuit structure above the housing substrate with an air gap disposed in between the bottom thermally conductive layer of the flexible layered circuit structure and the housing substrate. The distance between the layered circuit structure and the support layer can be at least about 0.5 mm. Other embodiments are also included herein.

7 Claims, 57 Drawing Sheets

Related U.S. Application Data which is a continuation-in-part of application No. 13/411,322, filed on Mar. 2, 2012, now Pat. No. 8,525,193, and a continuation-in-part of application No. 13/190,639, filed on Jul. 26, 2011, now Pat. No. 8,500,456, and a continuation-in-part of application No. 13/158,149, filed on Jun. 10, 2011, now Pat. No. 8,851,356, which is a continuation of application No. 12/372,499, filed on Feb. 17, 2009, now Pat. No. 7,980,863, said application No. 13/190,639 is a continuation-in-part of application No. 12/406,761, filed on Mar. 18, 2009, now Pat. No. 8,007,286, said application No. 13/411,322 is a continuation of application No. 12/043,424, filed on Mar. 6, 2008, now Pat. No. 8,143,631.

(60) Provisional application No. 61/043,006, filed on Apr. 7, 2008, provisional application No. 61/037,595, filed on Mar. 18, 2008, provisional application No. 61/028,779, filed on Feb. 14, 2008.

(51) Int. Cl.
| | |
|---|---|
| *H05K 1/02* | (2006.01) |
| *H05K 1/14* | (2006.01) |
| *H05K 3/36* | (2006.01) |
| *H01R 12/52* | (2011.01) |
| *H01R 4/02* | (2006.01) |
| *H01R 12/00* | (2006.01) |
| *F21Y 107/30* | (2016.01) |
| *F21Y 115/10* | (2016.01) |
| *H05K 3/00* | (2006.01) |

(52) U.S. Cl.
CPC .......... *H01R 13/717* (2013.01); *H05K 1/0266* (2013.01); *H05K 1/0269* (2013.01); *H05K 1/0292* (2013.01); *H05K 1/0298* (2013.01); *H05K 1/11* (2013.01); *H05K 1/113* (2013.01); *H05K 1/118* (2013.01); *H05K 1/14* (2013.01); *H05K 1/144* (2013.01); *H05K 3/363* (2013.01); *F21Y 2107/30* (2016.08); *F21Y 2115/10* (2016.08); *H05K 1/147* (2013.01); *H05K 3/0061* (2013.01); *H05K 2201/041* (2013.01); *H05K 2201/09481* (2013.01); *H05K 2201/09918* (2013.01); *H05K 2201/10106* (2013.01); *H05K 2201/2027* (2013.01); *H05K 2203/0228* (2013.01)

(58) Field of Classification Search
CPC .......... H05K 1/11; H05K 1/113; H05K 1/118; H05K 1/14; H05K 1/144; H05K 1/147; H05K 3/363; H01R 4/02; H01R 12/00; H01R 12/523; H01R 13/717; F21Y 2107/30; F21Y 2115/10
See application file for complete search history.

(56) References Cited

U.S. PATENT DOCUMENTS

| | | |
|---|---|---|
| 3,028,573 A | 4/1962 | Stoehr |
| 3,086,189 A | 4/1963 | Robbins |
| 3,270,251 A | 8/1966 | Evans |
| 3,401,369 A | 9/1968 | Plamateer et al. |
| 3,499,098 A | 3/1970 | Mcgahey et al. |
| 3,585,403 A | 6/1971 | Gribbons |
| 3,628,999 A | 12/1971 | Schneble, Jr. et al. |
| 3,640,519 A | 2/1972 | William et al. |
| 3,745,091 A | 7/1973 | Mccormick |
| 3,896,076 A | 7/1975 | Watanabe et al. |
| 3,932,689 A | 1/1976 | Watanabe et al. |
| 3,962,520 A | 6/1976 | Watanabe et al. |
| 4,017,847 A | 4/1977 | Burford et al. |
| 4,150,421 A | 4/1979 | Nishihara et al. |
| 4,173,035 A | 10/1979 | Hoyt |
| 4,249,303 A | 2/1981 | Greenwood et al. |
| 4,250,536 A | 2/1981 | Barringer et al. |
| 4,285,780 A | 8/1981 | Schachter |
| 4,388,136 A | 6/1983 | Jacobus et al. |
| 4,515,304 A | 5/1985 | Berger |
| 4,521,969 A | 6/1985 | Greenwood |
| 4,526,432 A | 7/1985 | Cronin et al. |
| 4,533,188 A | 8/1985 | Miniet |
| 4,618,194 A | 10/1986 | Kwilos |
| 4,685,210 A | 8/1987 | King et al. |
| 4,761,881 A | 8/1988 | Bora et al. |
| 4,795,079 A | 1/1989 | Yamada |
| 4,815,981 A | 3/1989 | Mizuno |
| 4,842,184 A | 6/1989 | Miller, Jr. |
| 4,871,315 A | 10/1989 | Noschese |
| 4,950,527 A | 8/1990 | Yamada |
| 4,991,290 A | 2/1991 | Mackay |
| 5,001,605 A | 3/1991 | Savagian et al. |
| 5,041,003 A | 8/1991 | Smith et al. |
| 5,093,985 A | 3/1992 | Houldsworth et al. |
| 5,103,382 A | 4/1992 | Kondo et al. |
| 5,155,904 A | 10/1992 | Majd |
| 5,176,255 A | 1/1993 | Seidler |
| 5,224,023 A | 6/1993 | Smith et al. |
| 5,254,910 A | 10/1993 | Yang |
| 5,375,044 A | 12/1994 | Guritz |
| 5,404,044 A | 4/1995 | Booth et al. |
| 5,440,454 A | 8/1995 | Hashimoto et al. |
| 5,478,008 A | 12/1995 | Takahashi |
| 5,511,719 A | 4/1996 | Miyake et al. |
| 5,523,695 A | 6/1996 | Lin |
| 5,563,777 A | 10/1996 | Miki et al. |
| 5,575,554 A | 11/1996 | Guritz |
| 5,579,574 A | 12/1996 | Colleran et al. |
| 5,585,675 A | 12/1996 | Knopf |
| 5,598,627 A | 2/1997 | Saka et al. |
| 5,677,598 A | 10/1997 | De et al. |
| 5,724,446 A | 3/1998 | Liu et al. |
| 5,887,158 A | 3/1999 | Sample et al. |
| 5,917,149 A | 6/1999 | Barcley et al. |
| 5,920,465 A | 7/1999 | Tanaka |
| 5,984,691 A | 11/1999 | Brodsky et al. |
| 6,018,326 A | 1/2000 | Rudisill |
| 6,040,624 A | 3/2000 | Chambers et al. |
| 6,065,666 A | 5/2000 | Backlund |
| 6,089,442 A | 7/2000 | Ouchi et al. |
| 6,095,405 A | 8/2000 | Kim et al. |
| 6,100,475 A | 8/2000 | Degani et al. |
| 6,113,248 A | 9/2000 | Mistopoulos et al. |
| 6,130,823 A | 10/2000 | Lauder et al. |
| 6,137,816 A | 10/2000 | Kinbara |
| 6,147,724 A | 11/2000 | Yoshii et al. |
| 6,199,273 B1 | 3/2001 | Kubo et al. |
| 6,226,862 B1 | 5/2001 | Neuman |
| 6,239,716 B1 | 5/2001 | Pross et al. |
| 6,299,337 B1 | 10/2001 | Bachl et al. |
| 6,299,469 B1 | 10/2001 | Glovatsky et al. |
| 6,310,445 B1 | 10/2001 | Kashaninejad |
| 6,319,019 B1 | 11/2001 | Kwon et al. |
| 6,372,997 B1 | 4/2002 | Hill et al. |
| 6,384,339 B1 | 5/2002 | Neuman |
| 6,428,189 B1 | 8/2002 | Hochstein |
| 6,429,383 B1 | 8/2002 | Sprietsma et al. |
| 6,443,179 B1 | 9/2002 | Benavides et al. |
| 6,448,661 B1 | 9/2002 | Kim et al. |
| 6,449,836 B1 | 9/2002 | Miyake et al. |
| 6,465,084 B1 | 10/2002 | Curcio et al. |
| 6,481,874 B2 | 11/2002 | Petroski |
| 6,498,440 B2 | 12/2002 | Stam et al. |
| 6,517,218 B2 | 2/2003 | Hochstein |
| 6,548,895 B1 | 4/2003 | Benavides et al. |
| 6,555,756 B2 | 4/2003 | Nakamura et al. |
| 6,574,113 B2 | 6/2003 | Armezzani et al. |
| 6,578,986 B2 | 6/2003 | Swaris et al. |
| 6,580,228 B1 | 6/2003 | Chen et al. |

(56) References Cited

U.S. PATENT DOCUMENTS

| | | |
|---|---|---|
| 6,589,594 B1 | 7/2003 | Hembree |
| 6,601,292 B2 | 8/2003 | Li et al. |
| 6,651,322 B1 | 11/2003 | Currie |
| 6,657,297 B1 | 12/2003 | Jewram et al. |
| 6,729,888 B2 | 5/2004 | Imaeda |
| 6,746,885 B2 | 6/2004 | Cao |
| 6,784,027 B2 | 8/2004 | Streubel |
| 6,833,526 B2 | 12/2004 | Sinkunas et al. |
| 6,846,094 B2 | 1/2005 | Luk |
| 6,851,831 B2 | 2/2005 | Karlicek, Jr. et al. |
| 6,884,313 B2 | 4/2005 | Lee et al. |
| 6,897,622 B2 | 5/2005 | Lister |
| 6,898,084 B2 | 5/2005 | Misra |
| 6,902,099 B2 | 6/2005 | Motonishi et al. |
| 6,919,529 B2 | 7/2005 | Franzen et al. |
| 6,936,855 B1 | 8/2005 | Harrah |
| 6,963,175 B2 | 11/2005 | Archenhold et al. |
| 6,966,674 B2 | 11/2005 | Tsai |
| 6,991,473 B1 | 1/2006 | Balcome et al. |
| 6,996,674 B2 | 2/2006 | Chiu et al. |
| 7,023,147 B2 | 4/2006 | Colby et al. |
| 7,037,114 B1 | 5/2006 | Eiger et al. |
| 7,086,756 B2 | 8/2006 | Maxik |
| 7,086,767 B2 | 8/2006 | Sidwell et al. |
| 7,114,831 B2 | 10/2006 | Popovich et al. |
| 7,114,837 B2 | 10/2006 | Yagi et al. |
| 7,149,097 B1 | 12/2006 | Shteynberg et al. |
| 7,199,309 B2 | 4/2007 | Chamberlin et al. |
| 7,204,615 B2 | 4/2007 | Arik et al. |
| 7,210,818 B2 | 5/2007 | Luk et al. |
| 7,248,245 B2 | 7/2007 | Adachi et al. |
| 7,253,449 B2 | 8/2007 | Wu |
| 7,256,554 B2 | 8/2007 | Lys |
| 7,262,438 B2 | 8/2007 | Mok et al. |
| 7,263,769 B2 | 9/2007 | Morimoto et al. |
| 7,276,861 B1 | 10/2007 | Shteynberg et al. |
| 7,284,882 B2 | 10/2007 | Burkholder |
| 7,325,955 B2 | 2/2008 | Lucas et al. |
| 7,331,796 B2 | 2/2008 | Hougham et al. |
| 7,341,476 B2 | 3/2008 | Soeta |
| 7,344,279 B2 | 3/2008 | Mueller et al. |
| 7,377,669 B2 | 5/2008 | Farmer et al. |
| 7,377,787 B1 | 5/2008 | Eriksson |
| 7,394,027 B2 | 7/2008 | Kaluzni et al. |
| 7,397,068 B2 | 7/2008 | Park et al. |
| 7,448,923 B2 | 11/2008 | Uka |
| 7,459,864 B2 | 12/2008 | Lys |
| 7,497,695 B2 | 3/2009 | Uchida et al. |
| 7,502,846 B2 | 3/2009 | Mccall |
| 7,514,880 B2 | 4/2009 | Huang et al. |
| 7,543,961 B2 | 6/2009 | Arik et al. |
| 7,547,124 B2 | 6/2009 | Chang et al. |
| 7,550,930 B2 | 6/2009 | Cristoni et al. |
| 7,553,051 B2 | 6/2009 | Brass et al. |
| 7,556,405 B2 | 7/2009 | Kingsford et al. |
| 7,556,406 B2 | 7/2009 | Petroski et al. |
| 7,573,210 B2 | 8/2009 | Ashdown et al. |
| 7,583,035 B2 | 9/2009 | Shteynerg et al. |
| 7,598,685 B1 | 10/2009 | Shteynberg et al. |
| 7,656,103 B2 | 2/2010 | Shteynberg et al. |
| 7,665,999 B2 | 2/2010 | Hougham et al. |
| 7,696,628 B2 | 4/2010 | Ikeuchi et al. |
| 7,710,047 B2 | 5/2010 | Shteynberg et al. |
| 7,710,050 B2 | 5/2010 | Preston et al. |
| 7,777,236 B2 | 8/2010 | Pachler |
| 7,800,315 B2 | 9/2010 | Shteynberg et al. |
| 7,800,316 B2 | 9/2010 | Haug et al. |
| 7,806,572 B2 | 10/2010 | Mcfadden et al. |
| 7,810,955 B2 | 10/2010 | Stimac et al. |
| 7,852,009 B2 | 12/2010 | Coleman et al. |
| 7,852,300 B2 | 12/2010 | Shteynberg et al. |
| 7,880,400 B2 | 2/2011 | Zhou et al. |
| 7,888,881 B2 | 2/2011 | Shteynberg et al. |
| 7,902,769 B2 | 3/2011 | Shteynberg et al. |
| 7,902,771 B2 | 3/2011 | Shteynbert et al. |
| 7,943,940 B2 | 5/2011 | Boonekamp et al. |
| 7,952,294 B2 | 5/2011 | Shteynberg et al. |
| 7,956,554 B2 | 6/2011 | Shteynberg et al. |
| 7,977,698 B2 | 7/2011 | Ling et al. |
| 7,980,863 B1 | 7/2011 | Holec et al. |
| 8,004,211 B2 | 8/2011 | Van Erp |
| 8,007,286 B2 | 8/2011 | Holec et al. |
| 8,011,806 B2 | 9/2011 | Shiraishi et al. |
| 8,038,329 B2 | 10/2011 | Takahasi et al. |
| 8,045,312 B2 | 10/2011 | Shrier |
| 8,061,886 B1 | 11/2011 | Kraus, Jr. et al. |
| 8,065,794 B2 | 11/2011 | En et al. |
| 8,067,896 B2 | 11/2011 | Shteynberg et al. |
| 8,075,477 B2 | 12/2011 | Nakamura et al. |
| 8,115,370 B2 | 2/2012 | Huang |
| 8,124,429 B2 | 2/2012 | Norman |
| 8,137,113 B2 | 3/2012 | Ouchi et al. |
| 8,143,631 B2 | 3/2012 | Crandell et al. |
| 8,162,200 B2 | 4/2012 | Buchwalter et al. |
| 8,166,650 B2 | 5/2012 | Thomas |
| 8,210,422 B2 | 7/2012 | Zadesky |
| 8,210,424 B2 | 7/2012 | Weibezahn |
| 8,227,962 B1 | 7/2012 | Su |
| 8,232,735 B2 | 7/2012 | Shteynberg et al. |
| 8,242,704 B2 | 8/2012 | Lethellier |
| 8,253,349 B2 | 8/2012 | Shteynberg et al. |
| 8,253,666 B2 | 8/2012 | Shteynberg et al. |
| 8,264,169 B2 | 9/2012 | Shteynberg et al. |
| 8,264,448 B2 | 9/2012 | Shteynberg et al. |
| 8,277,078 B2 | 10/2012 | Tanaka |
| 8,278,840 B2 | 10/2012 | Logiudice et al. |
| 8,410,720 B2 | 4/2013 | Holec et al. |
| 8,500,456 B1 | 8/2013 | Holec et al. |
| 8,525,193 B2 | 9/2013 | Crandell et al. |
| 8,618,669 B2 | 12/2013 | Furuta |
| 8,698,423 B2 | 4/2014 | Zhang et al. |
| 8,710,764 B2 | 4/2014 | Holec et al. |
| 8,716,952 B2 | 5/2014 | Van De Ven |
| 8,847,516 B2 | 9/2014 | Chobot |
| 8,851,356 B1 | 10/2014 | Holec et al. |
| 8,866,416 B2 | 10/2014 | Burrows et al. |
| 8,947,389 B1 | 2/2015 | Shin et al. |
| 8,968,006 B1 | 3/2015 | Holec et al. |
| 9,049,769 B2 | 6/2015 | Secilmis |
| 9,185,755 B2 | 11/2015 | Sutardja et al. |
| 9,253,844 B2 | 2/2016 | Grajcar |
| 9,271,363 B2 | 2/2016 | Takatsu |
| 9,320,109 B2 | 4/2016 | Lai |
| 9,341,355 B2 | 5/2016 | Crandell et al. |
| 9,357,639 B2 | 5/2016 | Holec et al. |
| 9,474,154 B2 | 10/2016 | Johansson et al. |
| 9,538,604 B2 | 1/2017 | Yadav et al. |
| 9,544,969 B2 | 1/2017 | Baddela et al. |
| 9,668,307 B2 | 5/2017 | Roberts et al. |
| 9,736,946 B2 | 8/2017 | Holec et al. |
| 10,334,735 B2 | 6/2019 | Holec et al. |
| 10,499,511 B2 | 12/2019 | Holec et al. |
| 10,849,200 B2 | 11/2020 | Holec et al. |
| 10,905,004 B2 | 1/2021 | Holec et al. |
| 2001/0000906 A1 | 5/2001 | Yoshikawa et al. |
| 2001/0004085 A1 | 6/2001 | Gueissaz |
| 2002/0014518 A1 | 2/2002 | Totani et al. |
| 2002/0043402 A1 | 4/2002 | Juskey et al. |
| 2002/0094705 A1 | 7/2002 | Driscoll et al. |
| 2002/0105373 A1 | 8/2002 | Sudo |
| 2002/0135993 A1 | 9/2002 | Ueyama et al. |
| 2002/0148636 A1 | 10/2002 | Belke et al. |
| 2002/0179331 A1 | 12/2002 | Brodsky et al. |
| 2003/0040166 A1 | 2/2003 | Moshayedi |
| 2003/0052594 A1 | 3/2003 | Matsui et al. |
| 2003/0053279 A1 | 3/2003 | Meehleder et al. |
| 2003/0062195 A1 | 4/2003 | Arrigotti et al. |
| 2003/0072153 A1 | 4/2003 | Matsui et al. |
| 2003/0079341 A1 | 5/2003 | Miyake et al. |
| 2003/0092293 A1 | 5/2003 | Ohtsuki et al. |
| 2003/0094305 A1 | 5/2003 | Ueda |
| 2003/0098339 A1 | 5/2003 | Totani et al. |
| 2003/0137839 A1 | 7/2003 | Lin |
| 2003/0146018 A1 | 8/2003 | Sinkunas et al. |

(56) References Cited

U.S. PATENT DOCUMENTS

| | | |
|---|---|---|
| 2003/0193789 A1 | 10/2003 | Karlicek, Jr. |
| 2003/0193801 A1 | 10/2003 | Lin et al. |
| 2003/0199122 A1 | 10/2003 | Wada et al. |
| 2003/0223210 A1 | 12/2003 | Chin |
| 2004/0007981 A1 | 1/2004 | Shibata et al. |
| 2004/0055784 A1 | 3/2004 | Joshi et al. |
| 2004/0060969 A1 | 4/2004 | Imai et al. |
| 2004/0079193 A1 | 4/2004 | Kokubo et al. |
| 2004/0087190 A1 | 5/2004 | Miyazawa et al. |
| 2004/0090403 A1 | 5/2004 | Huang |
| 2004/0239243 A1 | 12/2004 | Roberts et al. |
| 2004/0264148 A1 | 12/2004 | Burdick, Jr. et al. |
| 2005/0056923 A1 | 3/2005 | Moshayedi |
| 2005/0067472 A1 | 3/2005 | Ohtsuki et al. |
| 2005/0133800 A1 | 6/2005 | Park et al. |
| 2005/0207156 A1 | 9/2005 | Wang et al. |
| 2005/0239300 A1 | 10/2005 | Yasumura et al. |
| 2005/0242160 A1 | 11/2005 | Nippa et al. |
| 2005/0272276 A1 | 12/2005 | Ooyabu |
| 2006/0000877 A1 | 1/2006 | Wang et al. |
| 2006/0022051 A1 | 2/2006 | Patel et al. |
| 2006/0025023 A1 | 2/2006 | Ikeda et al. |
| 2006/0038542 A1 | 2/2006 | Park et al. |
| 2006/0128174 A1 | 6/2006 | Jang et al. |
| 2006/0181878 A1 | 8/2006 | Burkholder |
| 2006/0220051 A1 | 10/2006 | Fung et al. |
| 2006/0221609 A1 | 10/2006 | Ryan |
| 2006/0245174 A1 | 11/2006 | Ashdown et al. |
| 2006/0284640 A1 | 12/2006 | Wang et al. |
| 2007/0015417 A1 | 1/2007 | Caveney et al. |
| 2007/0054517 A1 | 3/2007 | Hidaka et al. |
| 2007/0064054 A1 | 3/2007 | Hayden et al. |
| 2007/0077688 A1 | 4/2007 | Hsu et al. |
| 2007/0141868 A1 | 6/2007 | Park |
| 2007/0157464 A1 | 7/2007 | Jeon et al. |
| 2007/0171145 A1 | 7/2007 | Coleman et al. |
| 2007/0184675 A1 | 8/2007 | Ishikawa et al. |
| 2007/0194428 A1 | 8/2007 | Sato et al. |
| 2007/0210722 A1 | 9/2007 | Konno et al. |
| 2007/0216987 A1 | 9/2007 | Hagood et al. |
| 2007/0217202 A1 | 9/2007 | Sato |
| 2007/0252268 A1 | 11/2007 | Chew et al. |
| 2007/0257623 A1 | 11/2007 | Johnson et al. |
| 2008/0031640 A1 | 2/2008 | Fukui |
| 2008/0045077 A1 | 2/2008 | Chou et al. |
| 2008/0062661 A1 | 3/2008 | Choi et al. |
| 2008/0138576 A1 | 6/2008 | Nozu et al. |
| 2008/0143379 A1 | 6/2008 | Norman |
| 2008/0144322 A1 | 6/2008 | Norfidathul et al. |
| 2008/0160795 A1 | 7/2008 | Chen et al. |
| 2008/0191642 A1 | 8/2008 | Slot et al. |
| 2008/0232047 A1 | 9/2008 | Yamada et al. |
| 2008/0249363 A1 | 10/2008 | Nakamura et al. |
| 2008/0254653 A1 | 10/2008 | Uka |
| 2008/0310141 A1 | 12/2008 | Mezouari |
| 2008/0311771 A1 | 12/2008 | Cho |
| 2009/0029570 A1 | 1/2009 | Ikeuchi et al. |
| 2009/0079357 A1 | 3/2009 | Shteynberg et al. |
| 2009/0103302 A1 | 4/2009 | Lin et al. |
| 2009/0117373 A1 | 5/2009 | Wisniewski et al. |
| 2009/0140415 A1 | 6/2009 | Furuta |
| 2009/0191725 A1 | 7/2009 | Vogt et al. |
| 2009/0205200 A1 | 8/2009 | Rosenblatt et al. |
| 2009/0226656 A1 | 9/2009 | Crandell et al. |
| 2009/0230883 A1 | 9/2009 | Haug |
| 2009/0251068 A1 | 10/2009 | Holec et al. |
| 2009/0301544 A1 | 12/2009 | Minelli |
| 2009/0308652 A1 | 12/2009 | Shih |
| 2010/0008090 A1 | 1/2010 | Li et al. |
| 2010/0012271 A1 | 1/2010 | Krawinkel |
| 2010/0018763 A1 | 1/2010 | Barry |
| 2010/0026208 A1 | 2/2010 | Shteynberg et al. |
| 2010/0059254 A1 | 3/2010 | Sugiyama et al. |
| 2010/0093190 A1 | 4/2010 | Miwa et al. |
| 2010/0109536 A1 | 5/2010 | Jung et al. |
| 2010/0110682 A1 | 5/2010 | Jung et al. |
| 2010/0167561 A1 | 7/2010 | Brown et al. |
| 2010/0187005 A1 | 7/2010 | Yeh |
| 2010/0213859 A1 | 8/2010 | Shteynberg et al. |
| 2010/0220046 A1 | 9/2010 | Plotz et al. |
| 2010/0308738 A1 | 12/2010 | Shteynberg et al. |
| 2010/0308739 A1 | 12/2010 | Shteynberg et al. |
| 2011/0019399 A1 | 1/2011 | Van et al. |
| 2011/0024180 A1 | 2/2011 | Ko |
| 2011/0031894 A1 | 2/2011 | Van |
| 2011/0051448 A1 | 3/2011 | Owada |
| 2011/0068701 A1 | 3/2011 | Van et al. |
| 2011/0096545 A1 | 4/2011 | Chang |
| 2011/0115411 A1 | 5/2011 | Shteynberg et al. |
| 2011/0121754 A1 | 5/2011 | Shteynberg et al. |
| 2011/0157897 A1 | 6/2011 | Liao et al. |
| 2011/0172658 A1 | 7/2011 | Gelbart et al. |
| 2011/0177700 A1 | 7/2011 | Jia et al. |
| 2011/0230067 A1 | 9/2011 | Champion et al. |
| 2011/0309759 A1 | 12/2011 | Shteynberg et al. |
| 2011/0311789 A1 | 12/2011 | Loy et al. |
| 2012/0002438 A1 | 1/2012 | Gourlay |
| 2012/0014108 A1 | 1/2012 | Greenfield et al. |
| 2012/0068622 A1 | 3/2012 | Ward |
| 2012/0081009 A1 | 4/2012 | Shteynberg et al. |
| 2012/0081018 A1 | 4/2012 | Shteynberg et al. |
| 2012/0097784 A1 | 4/2012 | Liao et al. |
| 2012/0162990 A1 | 6/2012 | Crandell et al. |
| 2012/0188771 A1 | 7/2012 | Kraus et al. |
| 2012/0195024 A1 | 8/2012 | Kawaguchi et al. |
| 2012/0281411 A1 | 11/2012 | Kajiya et al. |
| 2013/0070452 A1 | 3/2013 | Urano et al. |
| 2013/0128582 A1 | 5/2013 | Holec et al. |
| 2013/0169187 A1 | 7/2013 | Lai |
| 2013/0207556 A1 | 8/2013 | Grajcar |
| 2013/0320523 A1 | 12/2013 | Lee et al. |
| 2014/0015414 A1 | 1/2014 | Holec et al. |
| 2014/0168982 A1 | 6/2014 | Crandell et al. |
| 2014/0197743 A1 | 7/2014 | Holec et al. |
| 2014/0203729 A1 | 7/2014 | Van De Ven |
| 2014/0210357 A1 | 7/2014 | Yan et al. |
| 2014/0361711 A1 | 12/2014 | Takahashi |
| 2015/0173183 A1* | 6/2015 | Holec ................ H05K 3/363 361/803 |
| 2015/0189765 A1 | 7/2015 | Holec et al. |
| 2017/0055346 A1 | 2/2017 | Holec et al. |
| 2017/0280532 A1 | 9/2017 | Akiyama |
| 2018/0063968 A1 | 3/2018 | Holec et al. |
| 2020/0107412 A1 | 4/2020 | Holec et al. |
| 2020/0275556 A1 | 8/2020 | Holec et al. |

FOREIGN PATENT DOCUMENTS

| | | |
|---|---|---|
| CN | 102788284 | 11/2012 |
| EP | 0961351 | 12/1999 |
| EP | 1814369 | 8/2007 |
| EP | 2888517 | 7/2015 |
| GB | 2483942 | 3/2012 |
| JP | 59186388 | 10/1984 |
| JP | 01319993 | 12/1989 |
| JP | 05090726 | 4/1993 |
| JP | 05090748 | 4/1993 |
| JP | 05090749 | 4/1993 |
| JP | H05299565 | 11/1993 |
| JP | H11297388 | 10/1999 |
| JP | 2002043737 | 2/2002 |
| JP | 2002117707 | 4/2002 |
| JP | 2002341317 | 11/2002 |
| JP | 2005285960 | 10/2005 |
| JP | 2006080227 | 3/2006 |
| JP | 2008159908 | 7/2008 |
| JP | 2010153549 | 7/2010 |
| JP | 2011169791 | 9/2011 |
| KR | 20070025033 | 3/2007 |

(56) References Cited

FOREIGN PATENT DOCUMENTS

| WO | 2011064107 | 6/2011 |
|---|---|---|
| WO | 2014031567 | 2/2014 |

OTHER PUBLICATIONS

"Final Office Action," for U.S. Appl. No. 15/165,678 dated Nov. 4, 2019 (15 pages).
"LM317L 3-Terminal Adjustable Regulator," Texas Instruments Device Specification Brochure rev. Oct. 2014 (31 pages).
"NF2L757GRT-V1," Nichia Corporation Specifications for Warm White LED Brochure available at least as early as Jul. 19, 2017 (29 pages).
"NF2W757GRT-V1," Nichia Corporation Specifications for White LED brochure available at least as early as Jul. 19, 2017 (26 pages).
"NFSL757GT-V1," Nichia Corporation Specifications for Warm White LED Brochure available at least as early as Jul. 19, 2017 (22 pages).
"NFSW757GT," Nichia Corporation Specifications for White LED Brochure available at least as early as Jul. 19, 2017 (24 pages).
"Non Final Office Action," for U.S. Appl. No. 14/216,182, dated Feb. 25, 2016 (31 pages).
"Non-Final Office Action," for U.S. Appl. No. 16/585,846 dated Feb. 6, 2020 (38 pages).
"Response to Final Office Action," for U.S. Appl. No. 14/216,182, dated Jul. 17, 2015 and filed with the USPTO dated Jan. 15, 2016 (8 pages).
"Response to Non-Final Office Action," for U.S. Appl. No. 14/216,182, dated Nov. 26, 2014 and filed with the USPTO dated Apr. 24, 2015 (7 pages).
"Response to Non-Final Office Action," for U.S. Appl. No. 15/165,768 filed with the USPTO dated Oct. 15, 2019 (11 pages).
"3M Thermally Conductive Adhesive Transfer Tapes—Technical Data," Electronic Adhesives and Specialties Department, Engineered Adhesives Division, Sep. 2002, (pp. 1-6).
"Communication Pursuant to Rules 161(1) and 162 EPC," for European Patent Application No. 13763341.8, dated Apr. 7, 2015 (2 pages).
"Custom LUXEON Design Guide," Application Brief AB12, Mar. 2006 (14 pages).
"Derwent-Acc-No. 1984-298425," corresponds to JP-59-186388A (1984).
"Derwent-Acc-No. 2010-J09039," corresponds to JP-201 0-153549A (1984).
"DRAGONtape DT6 Data Sheet," Sep. 2007 (4 pages).
"DRAGONtape Product Information Bulletin," Osram Sylvania, 2007, 2 pages.
"DRAGONtape Product Information Bulletin," Osram, Nov. 2005 (4 pages).
"File History," for U.S. Appl. No. 12/372,499, filed Feb. 17, 2009 to Dec. 19, 2011 (321 pages).
"File History," for U.S. Appl. No. 12/406,761, filed Mar. 18, 2009 to Aug. 11, 2011 (257 pages).
"File History," for U.S. Appl. No. 13/592,090, filed Aug. 22, 2012 to Jun. 5, 2019 (451 pages).
"Final Office Action," for U.S. Appl. No. 13/158,149, dated Mar. 6, 2013 (11 pages).
"Final Office Action," for U.S. Appl. No. 14/506,251, dated Mar. 15, 2016 (17 pages).
"Final Office Action," for U.S. Appl. No. 15/165,678 dated Jul. 11, 2018 (10 pages).
"Final Office Action," for U.S. Appl. No. 15/165,678 dated Jul. 31, 2017 (13 pages).
"Final Office Action," for U.S. Appl. No. 15/165,678 dated Mar. 12, 2019 (16 pages).
"Final Office Action," for U.S. Appl. No. 15/675,938 dated Feb. 20, 2019 (17 pages).
"Final Office Action," For U.S. Appl. No. 14/015,679, dated Dec. 16, 2014 (19 pages).
"Final Office Action," dated Aug. 7, 2012 in U.S. Appl. No. 13/190,639, "Interconnectable Circuit Boards," (25 pages).
"Final Office Action," dated Mar. 15, 2012 in co pending U.S. Appl. No. 12/419,879, "Solid State Lighting Circuit and Controls"(10 pages).
"Flex Connectors User's Guide," Osram Sylvania, Oct. 2007 (6 pages).
"Fr406 High Performance Epoxy Laminate and Prepreg," Isola, 2006 (2 pages).
"Fr406: High Performance Epoxy Laminate and Prepreg," http://www.isola-group.com/en/products/name/details.shtl?13, Mar. 2008 (1 page).
"High Performance Epoxy Laminate and Prepreg," Isola, Mar. 2007 (3 pages).
"International Preliminary Report on Patentability," for PCT/US2013/055658 dated Mar. 5, 2015 (7 pages).
"International Search Report and Written Opinion," for PCT/US2013/055658 dated Jan. 15, 2014 (10 pages).
"Ipc-4101B: Specification for Base Materials for Rigid and Multilayer Printed Boards," Mar. 2006 (109 pages).
"Kapton Polyimide Film," DuPont Electronics, http://www2.dupont.com/Kapton/en_US/index.html, Feb. 2008 (9 pages).
"Linear Products," Osram Sylvania, http://www.sylvanaia.com/BusinessProducts/Innovations/LED+Systems/Linear/, 2004 (1 page).
"LINEARlight Flex & Power Flex LED Systems," Osram Sylvania, http://www/sylvania.com/AboutUs/Pressxpress/Innovation/LightingNews(US)/2007/USLi, Sep. 2007 (3 pages).
"LINEARlight Flex Topled, Flexible LED Strip," Osran Sylvania LED Systems Specification Guide (2007), p. 100.
"LINEARlight Power Flex, Flexible LED Strip," Osran Sylvania LED Systems Specification Guide, 2007, p. 96.
"LINEARlight Power Flex: Flexible High Light Output LED Modules," Osram Sylvania, Apr. 2008.
"LINEARlight Power Flex: LM10P Data Sheet," May 2007 (4 pages).
Murray, Cameron T. et al., "3M Thermally Conductive Tapes," 3M Electronic Markets Materials Division, Mar. 2004 (39 pages).
"Nichia Application Note," Oct. 31, 2003 (p. 5).
"Non Final Office Action," dated Mar. 5, 2012 in co pending U.S. Appl. No. 13/190,639, "Printed Circuit Board Interconnect Construction"(12 pages).
"Non Final Office Action," dated Jul. 26, 2011 in co pending U.S. Appl. No. 12/419,879, "Solid State Lighting Circuit and Controls"(16 pages).
"Non-Final Office Action," for U.S. Appl. No. 13/158,149, dated Jul. 3, 2013 (32 pages).
"Non-Final Office Action," for U.S. Appl. No. 13/944,610, dated Mar. 18, 2014 (20 pages).
"Non-Final Office Action," for U.S. Appl. No. 14/015,679, dated Apr. 1, 2014 (7 pages).
"Non-Final Office Action," for U.S. Appl. No. 14/506,251 dated Dec. 9, 2016 (11 pages).
"Non-Final Office Action," for U.S. Appl. No. 14/506,251 dated Sep. 29, 2015 (38 pages).
"Non-Final Office Action," for U.S. Appl. No. 15/165,678 dated Feb. 16, 2018 (22 pages).
"Non-Final Office Action," for U.S. Appl. No. 15/165,678 dated Jul. 16, 2019 (14 pages).
"Non-Final Office Action," for U.S. Appl. No. 15/165,678 dated Oct. 18, 2018 (10 pages).
"Non-Final Office Action," for U.S. Appl. No. 15/165,678 dated Jan. 20, 2017 (31 pages).
"Non-Final Office Action," for U.S. Appl. No. 15/675,938 dated Oct. 9, 2018 (40 pages).
"Non-Final Office Action," for U.S. Appl. No. 14/015,679 dated Jun. 19, 2015 (9 pages).
"Non-Final Office Action," For U.S. Appl. No. 14/216,182 dated Nov. 26, 2014 (7 pages).
"Non-Final Office Action," dated Oct. 1, 2012 in U.S. Appl. No. 13/411,322, "Layered Structure for Use With High Power Light Emitting Diode Systems," (18 pages).

(56) References Cited

OTHER PUBLICATIONS

"Non-Final Office Action," dated Aug. 22, 2012 in co-pending U.S. Appl. No. 13/158,149, "Flexible Circuit Board Interconnection and Methods," (27pages).
"Non-Final Office Action," dated Aug. 3, 2012 in U.S. Appl. No. 12/419,879, "Solid State Lighting Circuit and Controls," (17 pages).
"Notice of Allowance and Fee(s) Due," for U.S. Appl. No. 13/190,639, dated Mar. 7, 2013 (10 pages).
"Notice of Allowance," for U.S. Appl. No. 13/944,610, dated Nov. 18, 2013 (11 pages).
"Notice of Allowance," For U.S. Appl. No. 13/944,610, dated Oct. 31, 2014 (11 pages).
"Notice of Allowance," for U.S. Appl. No. 13/158,149 dated Feb. 11, 2014 (12 pages).
"Notice of Allowance," for U.S. Appl. No. 13/158,149 dated Jun. 6, 2014 (12 pages).
"Notice of Allowance," for U.S. Appl. No. 13/791,228 dated Dec. 10, 2013 (36 pages).
"Notice of Allowance," for U.S. Appl. No. 14/015,679 dated Jan. 13, 2016 (10 pages).
"Notice of Allowance," for U.S. Appl. No. 14/015,679 dated Oct. 26, 2015 (10 pages).
"Notice of Allowance," for U.S. Appl. No. 14/633,726 dated Jan. 25, 2016 (35 pages).
"Notice of Allowance," for U.S. Appl. No. 15/675,938 dated Jul. 19, 2019 (10 pages).
"Notice of Allowance," from U.S. Appl. No. 13/190,639 dated Apr. 4, 2013, 12 pages.
"Notice of Allowance," from U.S. Appl. No. 13/411,322 dated May 10, 2013, 29 pages.
"Notice of Allowance," dated Nov. 16, 2011 in co-pending U.S. Appl. No. 12/043,424, "Layered Structure for Use With High Power Light Emitting Diode Systems," (9 pages).
"Notice of Allowance," dated Dec. 3, 2012 in co pending U.S. Appl. No. 12/419,879, "Solid State Lighting Circuit and Controls" (17 pages).
"Notice of Allowance," dated Nov. 26, 2012 in co-pending U.S. Appl. No. 13/190,639, "Interconnectable Circuit Board," (14 pages).
"Nud4001—High Current LED Driver," Semiconductor Components Industries, LLC http://onsemi.com, Jun. 2006 (8 pages).
O'Malley, Kieran "Using the NUD4001 to Drive High Current LEDs," http://onsemi.com, Feb. 2005 (4 pages).
"Product Information Bulletin HF2STick XB: Hi-Flux 2nd Generation Module," Osram Sylvania, Jan. 2008 (4 pages).
"Response Non-Final Office Action," for U.S. Appl. No. 14/015,679 dated Jun. 19, 2015 and filed with the USPTO Sep. 18, 2015 (5 pages).
"Response to Final Office Action," for U.S. Appl. No. 13/158,149 dated Jun. 6, 2013 (10 pages).
"Response to Final Office Action," for U.S. Appl. No. 15/165,678 filed with the USPTO dated Jun. 21, 2019 (11 pages).
"Response to Final Office Action," for U.S. Appl. No. 14/015,679 dated Dec. 16, 2014 and filed with the USPTO May 15, 2015 (5 pages).
"Response to Final Office Action," for U.S. Appl. No. 14/506,251 dated Mar. 15, 2016 and filed with the USPTO Sep. 15, 2016 (10 pages).
"Response to Final Office Action," for U.S. Appl. No. 15/165,678 filed with the USPTO dated Sep. 12, 2018 (11 pages).
"Response to Final Office Action," for U.S. Appl. No. 15/165,678 dated Jul. 31, 2017 and filed with the USPTO Jan. 18, 2018 (12 pages).
"Response to Final Office Action," for U.S. Appl. No. 15/675,938 filed with the USPTO dated Jun. 20, 2019 (13 pages).
"Response to Final Office Action," dated Mar. 15, 2012, in co-pending U.S. Appl. No. 12/419,879, filed with USPTO Jun. 15, 2012 (8 pages).
"Response to Final Office Action," dated Aug. 7, 2012, in co-pending U.S. Appl. No. 13/190,639, file with USPTO Nov. 7, 2012, 14 pages.
"Response to Non-Final Office Action," for U.S. Appl. No. 13/158,149 dated Feb. 21, 2013 (12 pages).
"Response to Non-Final Office Action," for U.S. Appl. No. 13/190,639 dated Jul. 26, 2012 (17 pages).
"Response to Non-Final Office Action," for U.S. Appl. No. 13/158,149 dated Jan. 2, 2014 (14 pages).
"Response to Non-Final Office Action," for U.S. Appl. No. 13/944,610 dated Mar. 18, 2014 and filed with the USPTO Sep. 18, 2014 (9 pages).
"Response to Non-Final Office Action," for U.S. Appl. No. 14/015,679 dated Apr. 1, 2014 and filed with the USPTO Oct. 1, 2014 (6 pages).
"Response to Non-Final Office Action," for U.S. Appl. No. 14/506,251 dated Sep. 29, 2015 and filed with the USPTO Jan. 27, 2016 (10 pages).
"Response to Non-Final Office Action," for U.S. Appl. No. 14/506,251 dated Dec. 9, 2016 and filed with the USPTO Mar. 23, 2017 (6 pages).
"Response to Non-Final Office Action," for U.S. Appl. No. 15/165,678 filed with the USPTO dated Jan. 2, 2019 (10 pages).
"Response to Non-Final Office Action," for U.S. Appl. No. 15/165,678, filed with the USPTO dated May 30, 2018 (17 pages) for Non-Final Office Action dated Feb. 16, 2018.
"Response to Non-Final Office Action," for U.S. Appl. No. 15/165,678 dated Jan. 20, 2017 and filed with the USPTO Jul. 20, 2017 (10 pages).
"Response to Non-Final Office Action," for U.S. Appl. No. 15/675,938 filed with the USPTO dated Jan. 2, 2019 (10 pages).
"Response to Non-Final Office Action," dated Aug. 3, 2012, in co-pending U.S. Appl. No. 12/419,879, filed with USPTO Nov. 5, 2012 (7 pages).
"Response to Non-Final Office Action," dated Jul. 26, 2011, in co-pending U.S. Appl. No. 12/419,879, filed with USPTO Dec. 27, 2011, (7 pages).
"Response to Non-Final Office Action," dated Oct. 1, 2012 in U.S. Appl. No. 13/411,322, "Layered Structure for Use With High Power Light Emitting Diode Systems," (6 pages).
"Restriction Requirement," dated Sep. 7, 2011 in co-pending U.S. Appl. No. 13/190,639, "Printed Circuit Board Interconnect Construction" (6 pages).
"Specifications for Nichia Chip Type Warm White LED, Model: NS6L083T," Nichia Corporation, Jun. 2006, 3 pages.
"Specifications for Nichia Chip Type White LED Model: NS6W083AT," Nichia Corporation, No. STSE-CC7134, <Cat.No.070706>, date unknown (14 pages).
"TechniMask ISR 1000 Series," Technic, Inc., http://www.technic.com/pwb/solderisr1000.htm, 2003 (1 page).
"Thermal Management for LED Applications Solutions Guide," The Bergquist Company, date unknown (6 pages).
"T-lam System—Thermally Conductive Circuit Board Materials," http://www.lairdtech.com/pages/products/T-Lam-System.asp, Feb. 2008 (7 pages).
Fjelstad, Joseph "Flexible Circuit Technology, Third Edition," Br Publishing, Incorporated, 2007 (237 pages).
"Notice of Allowance," for U.S. Appl. No. 16/585,846 dated Jul. 22, 2020 (8 pages).
"Notice of Allowance," for U.S. Appl. No. 15/165,678 dated Aug. 16, 2020 (11 pages).
"Notice of Allowance," for U.S. Appl. No. 15/165,678 dated Jun. 10, 2020 (15 pages).
"Response to Final Office Action," for U.S. Appl. No. 15/164,678 filed May 1, 2020 (12 pages).
"Response to Non-Final Office Action," for U.S. Appl. No. 16/585,846 filed Jul. 2, 2020 (12 pages).
"Non-Final Office Action," for U.S. Appl. No. 16/689,127 dated May 25, 2021 (38 pages).

* cited by examiner

LED LIGHTING SYSTEMS AND METHOD

This application is a continuation-in-part of U.S. application Ser. No. 13/592,090, filed Aug. 22, 2012, which is a continuation-in-part of U.S. application Ser. No. 13/158,149, filed Jun. 10, 2011, now U.S. Pat. No. 8,851,356, which is a continuation-in-part of U.S. application Ser. No. 12/372,499, filed Feb. 17, 2009, now U.S. Pat. No. 7,980,863, which claims the benefit of U.S. Provisional Application No. 61/028,779, filed Feb. 14, 2008, and U.S. Provisional Application No. 61/037,595, filed on Mar. 18, 2008, the contents of all of which are herein incorporated by reference.

U.S. application Ser. No. 13/592,090 is also a continuation-in-part of U.S. application Ser. No. 13/190,639, filed Jul. 26, 2011, now U.S. Pat. No. 8,500,456, which is a continuation of U.S. application Ser. No. 12/406,761, filed Mar. 18, 2009, now U.S. Pat. No. 8,007,286, which claims the benefit of U.S. Provisional Application No. 61/037,595, filed on Mar. 18, 2008, and U.S. Provisional Application No. 61/043,006, filed Apr. 7, 2008, the contents of all of which are herein incorporated by reference.

U.S. application Ser. No. 13/592,090 is also a continuation-in-part of U.S. application Ser. No. 13/411,322, filed Mar. 2, 2012, now U.S. Pat. No. 8,525,193, which is a continuation of U.S. application Ser. No. 12/043,424, filed Mar. 6, 2008, now U.S. Pat. No. 8,143,631, the contents of all of which are herein incorporated by reference.

FIELD OF THE INVENTION

The present invention relates to light emitting diode (LED) lighting system and methods.

BACKGROUND OF THE INVENTION

Solid state lighting (SSL) circuits (or LED lighting systems) are predicted to achieve widespread adoption in commercial lighting applications. Solid state lighting is more efficient in converting electricity to light than incandescent, fluorescent, and compact fluorescent systems. As such solid state lighting stands to greatly increase the energy efficiency of many lighting applications including street lighting, sign lighting, residential lighting, commercial lighting, etc.

SUMMARY OF THE INVENTION

Embodiments of the invention include LED lighting systems and methods. For example, in some embodiments, an LED lighting system is included. The LED lighting system can include a flexible layered circuit structure that can include a top thermally conductive layer, a middle electrically insulating layer, a bottom thermally conductive layer, and a plurality of light emitting diodes mounted on the top layer. The LED lighting system can further include a housing substrate and a mounting structure. The mounting structure can be configured to suspend the layered circuit structure above the housing substrate with an air gap disposed in between the bottom thermally conductive layer of the flexible layered circuit structure and the housing substrate. The distance between the layered circuit structure and the support layer can be at least about 0.5 mm. In some embodiments, the flexible layered circuit structure is attached to the mounting structure in a releasable manner. In some embodiments, the flexible layered circuit structure is releasable from the mounting structure without the use of tools. In some embodiments, the flexible layered circuit structure is configured for replacement.

In some embodiments, an LED lighting system is included. The LED lighting system can include a flexible layered circuit structure can include a top thermally conductive layer, a middle electrically insulating layer, a bottom thermally conductive layer, a plurality of light emitting diodes mounted on the bottom layer, a housing substrate, and a mounting structure. The mounting structure can be configured to suspend the layered circuit structure above the housing substrate with an air gap disposed in between bottom thermally conductive layer of the flexible layered circuit structure and the housing substrate, wherein the distance between the layered circuit structure and the support layer is at least about 0.5 mm.

In some embodiments, a method for making an LED lighting system is included. The method for making an LED lighting system can include obtaining a flexible layered circuit structure that can include, a top thermally conductive layer, a middle electrically insulating layer, a bottom thermally conductive layer. The method can further include suspending the flexible layered circuit structure above a housing substrate with an air gap disposed in between the bottom thermally conductive layer of the flexible layered circuit structure and the housing substrate, wherein the distance between the layered circuit structure and the housing substrate is at least about 0.5 mm, and connecting the flexible layered circuit structure to a power source.

In some embodiments, a method for operating an LED lighting system is included. The method for operating an LED lighting system can include providing electrical current to an LED lighting circuit, the LED lighting circuit including a plurality of light emitting diodes, the LED lighting circuit disposed upon a flexible layered circuit structure can include a top thermally conductive layer, a middle electrically insulating layer, a bottom thermally conductive layer, and dissipating heat from the light emitting diodes to ambient air through the top surface of the top thermally conductive layer and the bottom surface of the bottom thermally conductive layer.

In some embodiments, an LED lighting system is included. The LED lighting system can include a flexible layered circuit structure can include a top thermally conductive layer, a middle electrically insulating layer, a bottom thermally conductive layer, a plurality of light emitting diodes mounted on the top layer, the flexible layered circuit structure formed into a loop. The loop can be disposed within a housing. The loop can be separated from the housing by an air gap. The loop can be disposed sideways to the support structure.

This summary is an overview of some of the teachings of the present application and is not intended to be an exclusive or exhaustive treatment of the present subject matter. Further details are found in the detailed description and appended claims. Other aspects will be apparent to persons skilled in the art upon reading and understanding the following detailed description and viewing the drawings that form a part thereof, each of which is not to be taken in a limiting sense. The scope of the present invention is defined by the appended claims and their legal equivalents.

BRIEF DESCRIPTION OF THE FIGURES

The invention may be more completely understood in connection with the following drawings, in which.

While the invention is susceptible to various modifications and alternative forms, specifics thereof have been shown by way of example and drawings, and will be described in detail. It should be understood, however, that the invention is not limited to the particular embodiments described. On the contrary, the intention is to cover modifications, equivalents, and alternatives falling within the spirit and scope of the invention.

DETAILED DESCRIPTION OF THE INVENTION

The embodiments of the present invention described herein are not intended to be exhaustive or to limit the invention to the precise forms disclosed in the following detailed description. Rather, the embodiments are chosen and described so that others skilled in the art can appreciate and understand the principles and practices of the present invention.

All publications and patents mentioned herein are hereby incorporated by reference. The publications and patents disclosed herein are provided solely for their disclosure. Nothing herein is to be construed as an admission that the inventors are not entitled to antedate any publication and/or patent, including any publication and/or patent cited herein.

Solid state lighting stands to greatly increase the energy efficiency of many lighting applications including street lighting, sign lighting, residential lighting, commercial lighting, etc. However, one design challenge associated with LED lighting systems is the dissipation of heat. In particular, it is important consider the junction temperature in an LED (the p-n junction temperature) lighting system. If this temperature rises above the prescribed level recommended by the LED manufacturer, the lifetime of the LED as well as its intensity and color may be affected.

Mounting an LED carrying circuit on a heat sink, or adding secondary heat sinks is one approach to heat dissipation. However, this can add additional cost to the finished product in addition to constraining design flexibility. Applicants have developed various embodiments of LED lighting systems that can provide sufficient heat dissipation without the need for directly mounting the LED carrying circuit onto a large heat sink or any substantial secondary heat sinks. Such embodiments can successfully maintain the junction temperature of the LEDs below the critical temperature.

Figure 1A:
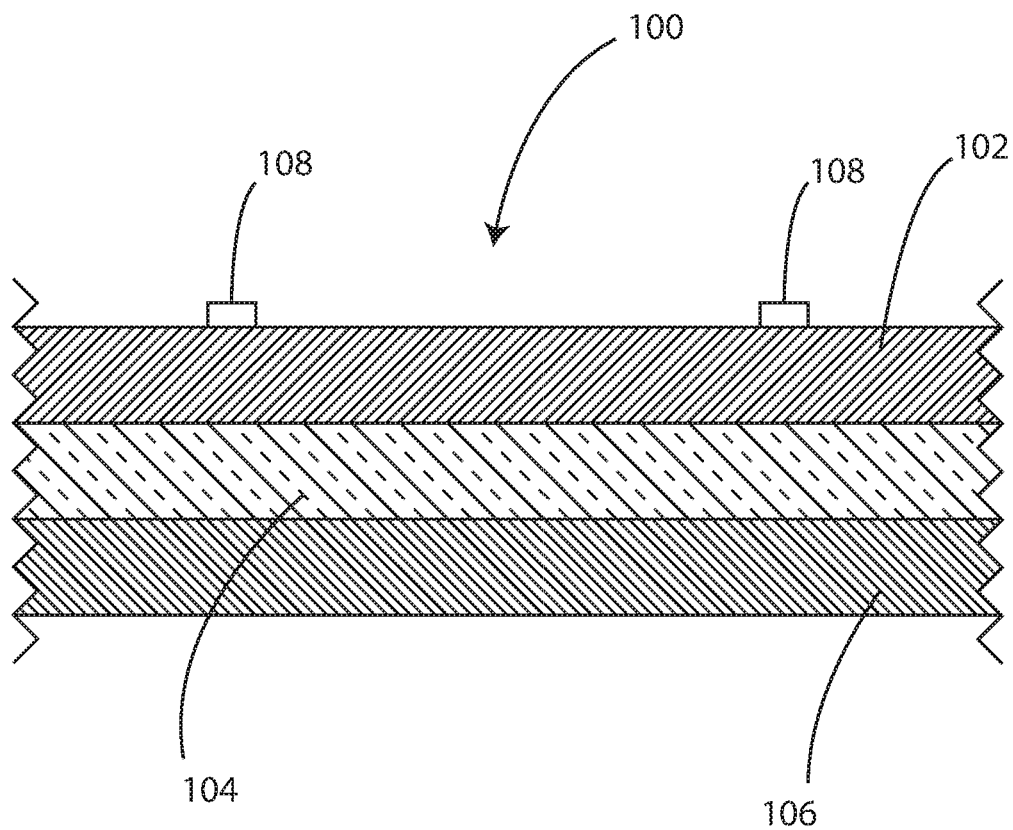
FIG. 1A is a cross sectional schematic view of a flexible layered circuit structure in accordance with various embodiments herein.

Referring now to FIG. 1A, a cross sectional schematic view is shown of a flexible layered circuit structure 100 in accordance with various embodiments herein. The flexible layered circuit structure can include a top thermally conductive layer 102, a middle electrically insulating layer 104, and a bottom thermally conductive layer 106. In some embodiments, the top, middle, and bottom layers combined have a thermal resistance of less than 10 degrees Celsius per Watt. A plurality of light emitting diodes 108 can be mounted on the top thermally conductive layer 102. When electrical current is passed through the circuit on the top surface of the top thermally conductive layer, one or more of the LEDs can be energized and emit visible light.

In some embodiments, a commercially available FR4 material can be used as a starting material and is modified to create the layered circuit structure. The FR4 material preferably includes a layer of fiberglass sandwiched between two layers of copper. An example of a suitable FR4 material is FR406 manufactured by Isola Group of Chandler, Ariz. The top layer can include one of the two layers of copper, the intermediate layer can include a layer of fiberglass, and the bottom layer can include the other of the two layers of copper. It is recognized that other suitable FR4 materials could be used and that these layers could be either manufactured or purchased in this form.

Prior to modification, the top layer can be copper approximately 0.5 to 4.0 ounces per square foot and approximately 0.0007 to 0.0056 inch thick, 0.25 to 48.00 inches wide, and 0.50 to 48.00 inches long. Although copper is a preferred material, it is recognized that other suitable electrically conductive materials such as but not limited to aluminum could be used. The top, copper layer can be modified to include a thermally conductive printed or etched electrical circuit using standard electrical circuit design tools and techniques well known in the art and can then be coated with a protective coating using standard solder masking and labeling techniques. An example of a suitable protective coating that could be used is TechniMask ISR 1000 manufactured by Technic, Inc. of Cranston, R.I. The top layer can be designed in such a way as to provide receptacles and mounting surfaces for LEDs and other SMT electrical components proximate the top surface.

The intermediate layer can be an electrically insulating thermally conductive layer, in some embodiments made of fiberglass approximately 0.005 to 0.020 inch thick, 0.25 to 48.00 inches wide, and 0.50 to 48.00 inches long. The fiberglass has a breakdown voltage of greater than 5 kilovolts (kV), a tensile strength of 55 kips per square inch (ksi), and a flexural strength of 91 kips per square inch (ksi). The thermal conductivity of the fiberglass can be 0.3 to 0.4 Watts per meter per degrees Kelvin (W/mK). Although fiberglass is a preferred material, it is recognized that other suitable materials such as but not limited to polymer or ceramic blended dielectrics may be used.

Prior to modification, the bottom layer can be copper approximately 0.5 to 4.0 ounces per square foot and can be approximately 0.0007 to 0.0056 inch thick, 0.25 to 48.00 inches wide, and 0.50 to 48.00 inches long. Although copper is a preferred material, it is recognized that other suitable electrically conductive materials such as but not limited to aluminum could be used. The bottom, copper layer can be modified into a heat spreading copper circuit laterally and along its longitudinal axis proximate the bottom surface in order to rapidly spread the heat through the bottom layer. In some embodiments, the exposed copper proximate the bottom surface of the bottom layer can then be tinned. The bottom layer can include thermally conductive printed circuits, which are printed or etched using solder mask printing, photo etching, and solder masking techniques well known in the art for producing electrical circuits. In various embodiments, the bottom layer can include solid coverage of thermally conductive material (such as copper) across an area equal to a majority of the surface area with no direct electrical connection to the top layer.

The flexible layered circuit structure can be at least semi-flexible in some embodiments, not rigid. The flexible layered circuit structure can be any desired length, which could be as long as 250 feet or more. The strip can bend (for example along the lengthwise axis in a direction from the top of the flexible layered circuit structure to the bottom of the flexible layered circuit structure, or bottom to top) sufficiently to achieve a radius of curvature of 6 inches. In some embodiments, the strip can bend sufficiently to achieve a radius of curvature of 1 inch. In some embodiments, the flexible layered circuit structure can be wrapped about the hub of a reel for storage until use. The flexible layered circuit structure can also twist relative to its longitudinal axis up to 10 degrees per inch.

Figure 1B:
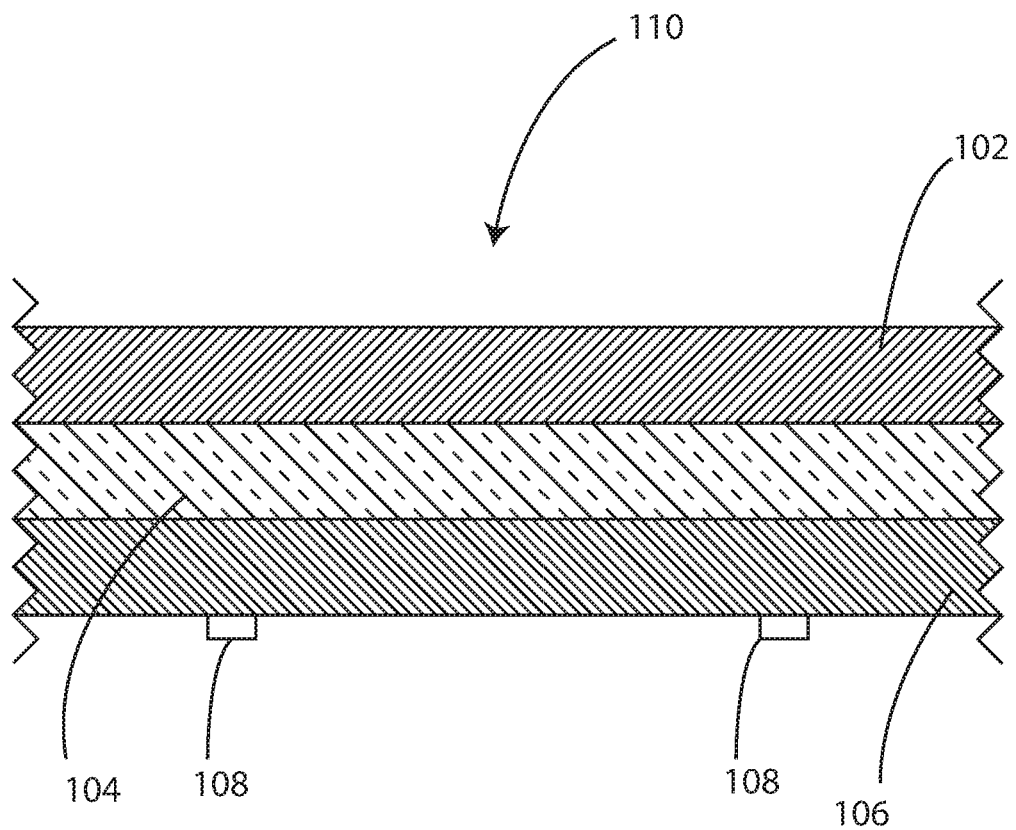
FIG. 1B is a cross sectional schematic view of a flexible layered circuit structure in accordance with various embodiments herein.

In some embodiments, light emitting diodes can be mounted on the bottom layer of the flexible layered circuit structure. Referring now to FIG. 1B, a cross sectional schematic view is shown of a flexible layered circuit structure 110 in accordance with various embodiments herein. The flexible layered circuit structure 110 can include a top thermally conductive layer 102, a middle electrically insulating layer 104, and a bottom thermally conductive layer 106. A plurality of light emitting diodes 108 can be mounted on the bottom thermally conductive layer 106.

Figure 1C:
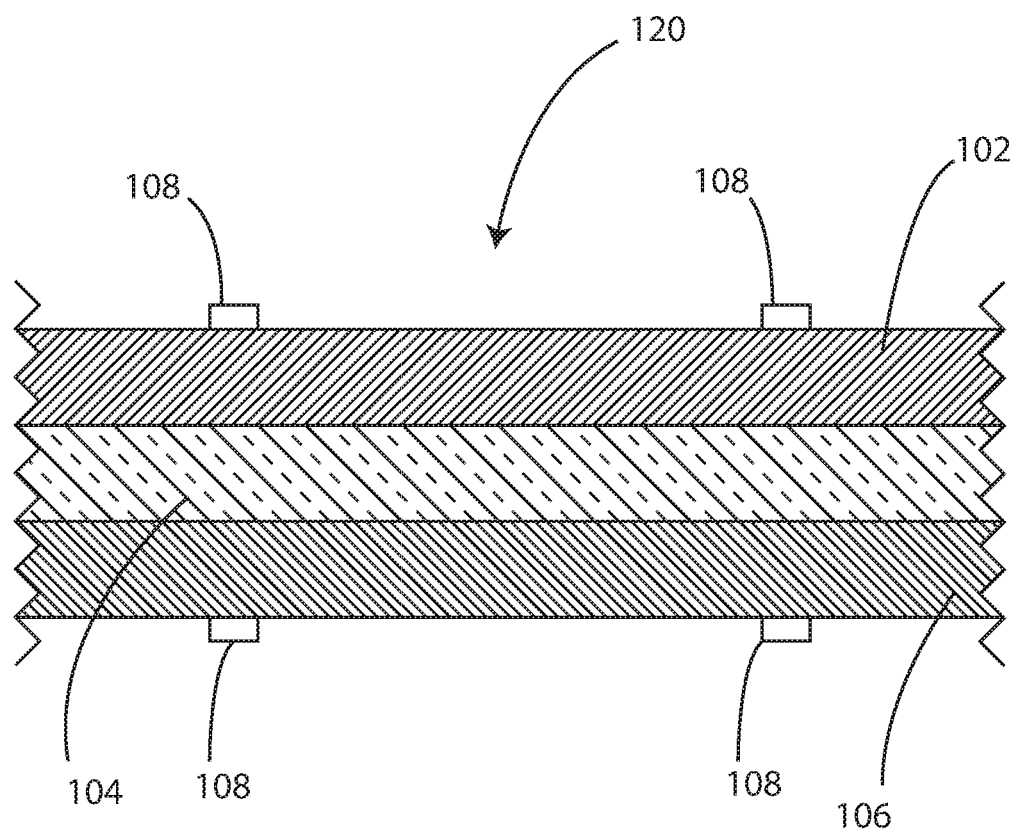
FIG. 1C is a cross sectional schematic view of a flexible layered circuit structure in accordance with various embodiments herein.

In some embodiments, light emitting diodes can be mounted on both the top and the bottom layers of the flexible layered circuit structure. Referring now to FIG. 1C, a cross sectional schematic view is shown of a flexible layered circuit structure 120 in accordance with various embodiments herein. The flexible layered circuit structure 120 can include a top thermally conductive layer 102, a middle electrically insulating layer 104, and a bottom thermally conductive layer 106. A plurality of light emitting diodes 108 can be mounted on the top thermally conductive layer 102 and the bottom thermally conductive layer 106.

Figure 1D:
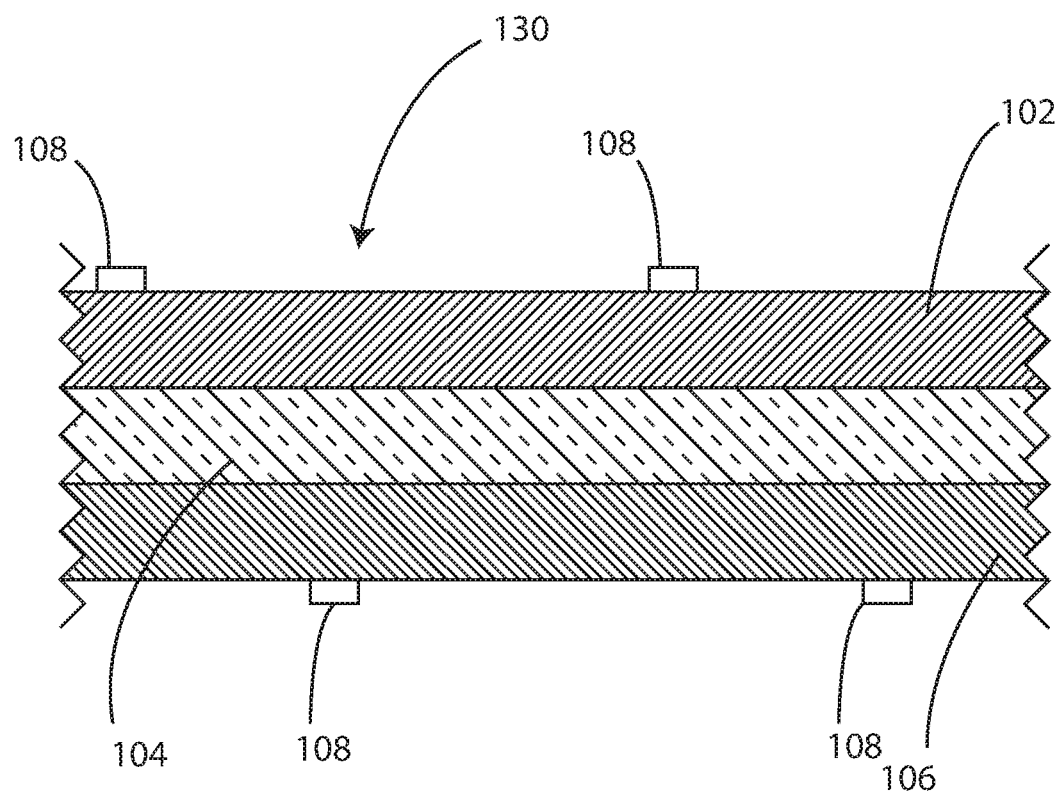
FIG. 1D is a cross sectional schematic view of a flexible layered circuit structure in accordance with various embodiments herein.

When light emitting diodes are mounted on both the top thermally conductive layer 102 and the bottom thermally conductive layer 106, it will be appreciated that the light emitting diodes can be placed directed opposite on another (such as in FIG. 1C) or they can be offset from one another to avoid the concentration of too much heat in a particular spot. Referring now to FIG. 1D, a cross sectional schematic view is shown of a flexible layered circuit structure 130 in accordance with various embodiments herein. The flexible layered circuit structure 130 can include a top thermally conductive layer 102, a middle electrically insulating layer 104, and a bottom thermally conductive layer 106. A plurality of light emitting diodes 108 can be mounted on the top thermally conductive layer 102 and the bottom thermally conductive layer 106, but offset such that the positions of the light emitting diodes 108 on the top do not match with the positions of the light emitting diodes 108 on the bottom.

Figure 2:
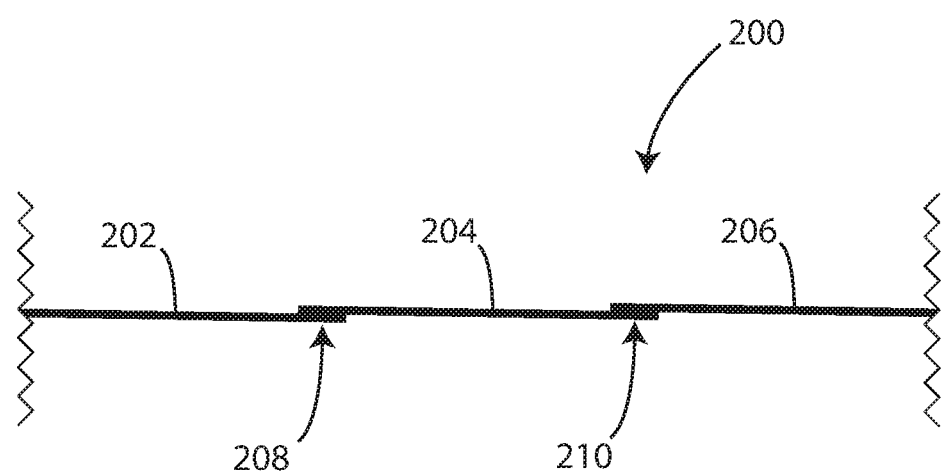
FIG. 2 is a schematic side view of a flexible layered circuit structure in accordance with various embodiments herein.

It will be appreciated that flexible layered circuit structures as used in various embodiments herein can be either be unitary segments or can be formed of multiple segments that are bonded to on another at joints. Referring now to FIG. 2, a schematic side view is shown of a flexible layered circuit structure 200 in accordance with various embodiments herein. In this view, it can be seen that the flexible layered circuit structure is formed of a first segment 202, a second segment 204, and a third segment 206. The first segment 202 is bonded to the second segment 204 at a first overlapping joint 208. The first overlapping joint 208 can provide electrical communication between the circuitry on the first segment 202 and the circuitry on the second segment 204. The second segment 204 is bonded to the third segment 206 at a second overlapping joint 210. The second overlapping joint 210 can provide electrical communication between the circuitry on the second segment 204 and the circuitry on the third segment 206. Connections between segments can continue in this manner such that the overall length of the flexible layered circuit structure can be as long as it desired.

Figure 3:
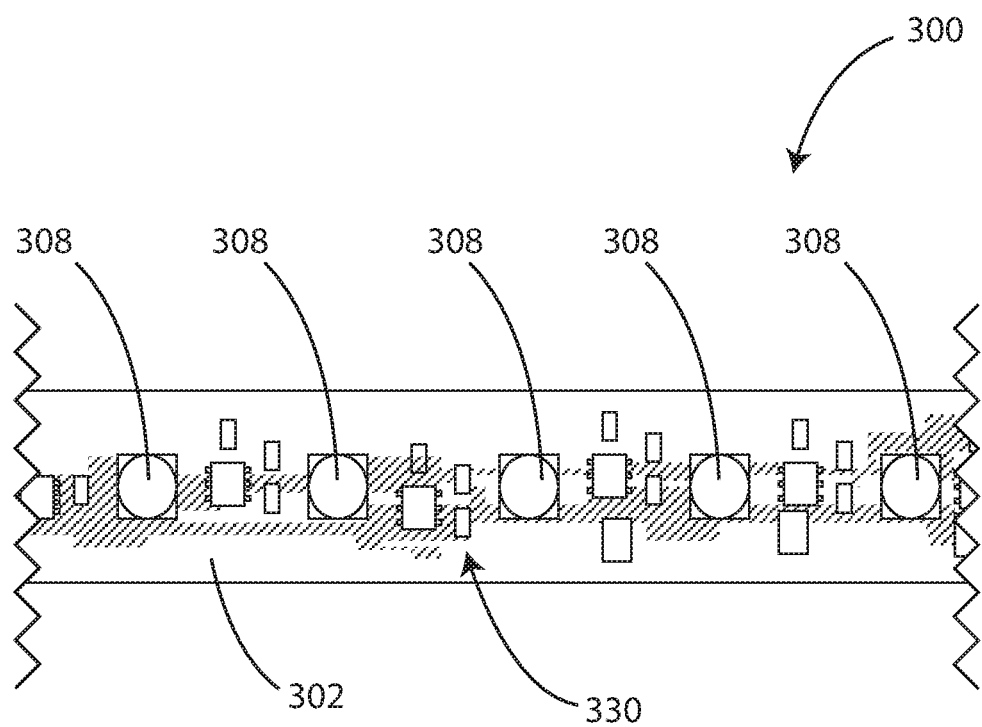
FIG. 3 is a schematic top view of a flexible layered circuit structure in accordance with various embodiments herein.

Referring now to FIG. 3, a schematic top view is shown of a portion 300 of the flexible layered circuit structure 200 of FIG. 2. The flexible layered circuit structure includes a top thermally conductive layer 302. A plurality of light emitting diodes 308 are mounted on the top thermally conductive layer 302. A variety of circuitry and/or components 330 can be etched into or mounted on the top thermally conductive layer 302. The circuitry and components 330 can include various items including, but not limited to, resistors, capacitors, traces, linear drivers, and the like. An example of a suitable LED is NS3W083A manufactured by Nichia Corporation of Detroit, Mich. An example of a suitable liner driver is NUD4001 manufactured by ON Semiconductor of Phoenix, Ariz.

In some embodiments, the light emitting diodes mounted on the top layer have a power of between 0.25 and 3 watts per inch squared of the surface area of the bottom layer.

Figure 4:
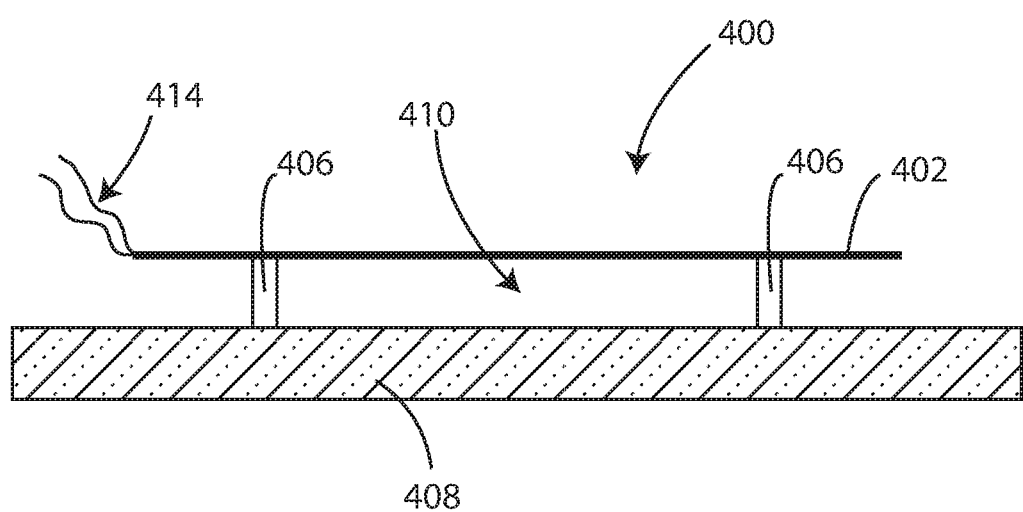
FIG. 4 is a schematic side view of an LED lighting system in accordance with various embodiments herein.

In various embodiments, a mounting structure can be used to suspend the flexible layered circuit structure above a housing substrate. It will be appreciated that the mounting structure can take on many different forms. Referring now to FIG. 4, a schematic side view is shown of an LED lighting system 400 in accordance with various embodiments herein. The LED lighting system 400 can include a flexible layered circuit structure 402 and electrical leads 414 to provide electrical current to the flexible layered circuit structure 402. The flexible layered circuit structure 402 can be suspended above a housing substrate 408, such that there is an air gap 410 disposed in between the bottom thermally conductive layer of the flexible layered circuit structure 402 and the housing substrate 408. In some embodiments, the air gap 410 is present under at least about 80% of the surface area of the bottom of the flexible layered circuit structure 402. A mounting structure can be used to suspend the flexible layered circuit structure. In this embodiment, the mounting structure can include one or more posts 406 or standoffs. The posts 406 can serve to hold the flexible layered circuit structure 402 in place. In some embodiments, the posts can be configured to exert tension on the flexible layered circuit structure in the direction of the lengthwise axis of the flexible layered circuit structure such that it is maintained taut.

The air gap 410 can be of various sizes. In some embodiments, the air gap can be at least about 0.5 mm. In some embodiments, the air gap can be from between 0.5 mm and 100 mm. In some embodiments, the air gap can be from between 1 mm and 50 mm. In some embodiments, the air gap can be from between 2 mm and 25 mm. In some embodiments, the air gap can be between about 40% and 60% of the width of the flexible layered circuit structure.

The air gap can serve to promote heat dissipation off of the bottom layer of the flexible layered circuit structure. In particular, the LED lighting system can be configured so as to have thermal transfer properties sufficient to allow the system to maintain a thermal equilibrium at or below the critical junction temperatures for the LEDs without the need for the addition of secondary heat sinking. The critical junction temperatures can vary based on the specific LED model and manufacturer. However, critical junction temperatures can range from 100 degrees Celsius or less for some LED models to 150 degrees Celsius or more for others. In some embodiments, the junction temperature can be kept below 150 degrees Celsius. In some embodiments, the junction temperature can be kept below 140 degrees Celsius. In some embodiments, the junction temperature can be kept below 130 degrees Celsius. In some embodiments, the junction temperature can be kept below 120 degrees Celsius.

In some embodiments, the junction temperature can be kept below 110 degrees Celsius. In some embodiments, the junction temperature can be kept below 100 degrees Celsius. In some embodiments, the junction temperature can be kept below 90 degrees Celsius.

In various embodiments, the mounting structure can include many different specific structural elements. By way of example, in some embodiments, the mounting structure can include a fastener, a hook, a pin, a clip, a spring clip, a tab and/or tab receptacle. In various embodiments, the mounting structure can be directly or indirectly attached to the housing substrate. In some embodiments, the flexible layered circuit structure can be attached to the mounting structure in a releasable manner. In some embodiments, the flexible layered circuit structure can be releasable form the mounting structure in such a way that specialized tools are not required and thus the flexible layered circuit structure can be released from the mounting structure by hand. In this manner, the flexible layered circuit structure can be configured for replacement. In some embodiments, the mounting structure can be used to align the flexible layered circuit structure with secondary optics or a diffuser.

The housing substrate can include many different materials. In some embodiments, the housing substrate can include organic or inorganic structural materials. In some embodiments, the housing substrate can be a material including, but not limited to, metals, polymers, cellulosic materials, composites, glass, stone and the like. In various embodiments, the housing substrate can be opaque, transparent, or semi-transparent.

Figure 5:
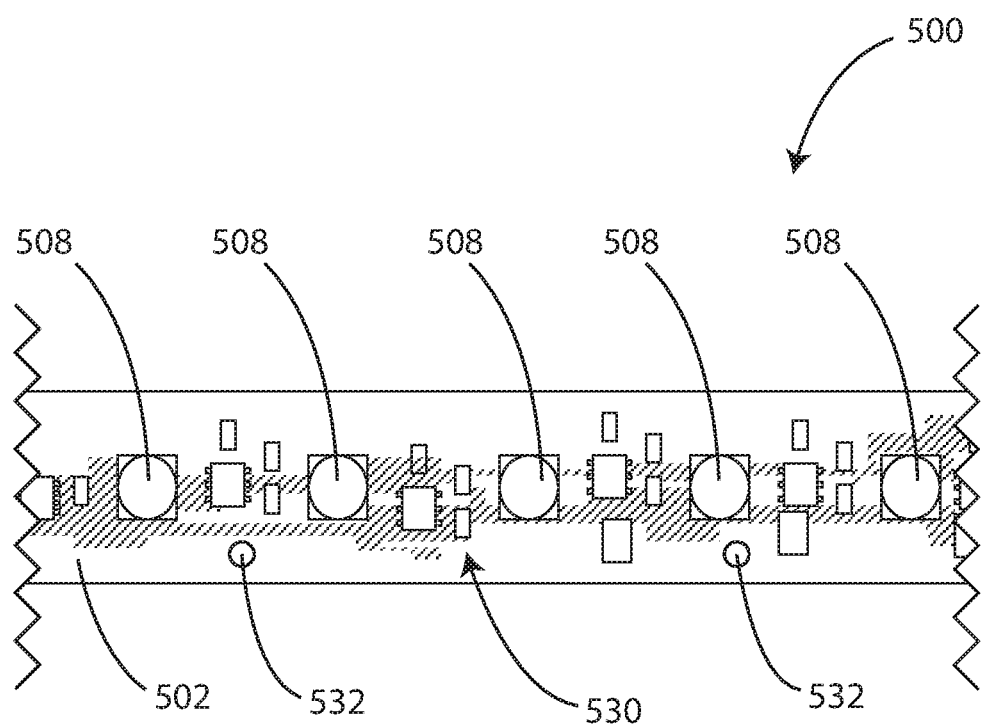
FIG. 5 is a schematic side view of an LED lighting system in accordance with various embodiments herein.

It will be appreciated that the mounting structure can be attached to the flexible layered circuit structure in many different ways. For example, in the context of posts, the posts can attach to the bottom, side, or ends of the flexible layered circuit structure. In some embodiments, the flexible layered circuit structure can include structural features so as to facilitate connection with the mounting structure. By way of example, in some embodiments the flexible layered circuit structure can define notches or apertures in order to facilitate connection with the mounting structure. Referring now to FIG. 5, a schematic top view is shown of a portion of an LED lighting system in accordance with various embodiments herein. The flexible layered circuit structure includes a top thermally conductive layer 502. A plurality of light emitting diodes 508 are mounted on the top thermally conductive layer 502. A variety of circuitry 530 can be etched into or disposed on the top thermally conductive layer 502. In addition, a plurality of apertures 532 are formed in the flexible layered circuit structure. These apertures 532 can be configured to engage a mounting structure, or a portion thereof.

Figure 6:
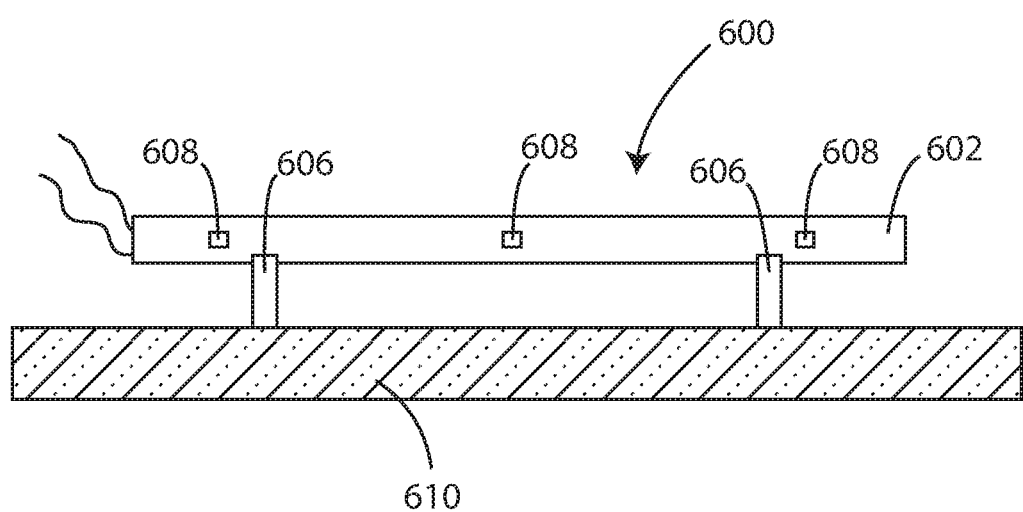
FIG. 6 is a schematic side view of an LED lighting system in accordance with various embodiments herein.

Referring now to FIG. 6, a schematic side view is shown of an LED lighting system 600 in accordance with various embodiments herein. In this embodiment, the flexible layered circuit structure 602 carrying the light emitting diodes 608 is oriented on its side (or lateral side or lateral edge) relative to posts 606, which can serve as a mounting structure to maintain an air gap in between the flexible layered circuit structure 602 and the housing substrate 610. As such, in this embodiment the mounting structure can engage a lateral side of the flexible layered circuit structure.

Figure 7:
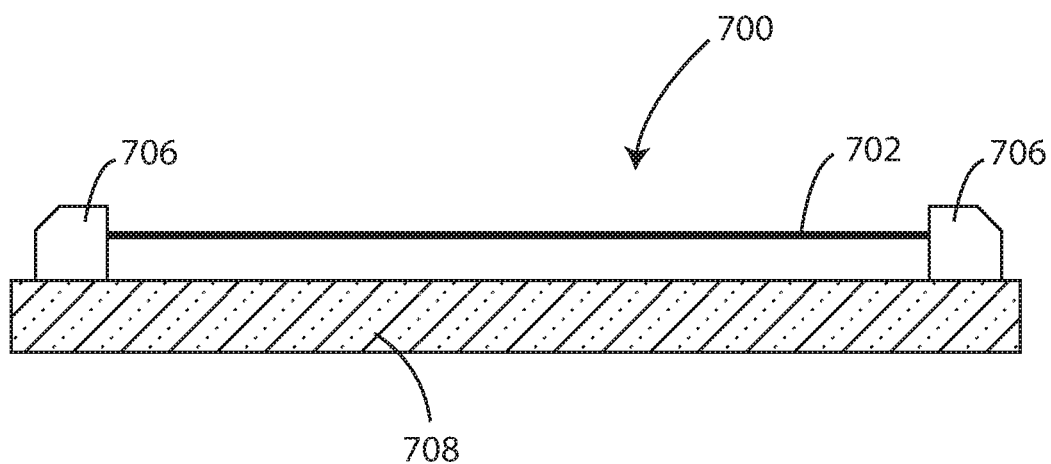
FIG. 7 is a schematic side view of an LED lighting system in accordance with various embodiments herein.

Referring now to FIG. 7, a schematic side view is shown of an LED lighting system 700 in accordance with various embodiments herein. In this view, the flexible layered circuit structure 702 is suspended above the housing substrate 708 through mounting structure elements 706. In this case, the ends of the flexible layered circuit structure interface with the mounting structure elements 706, however, it will be appreciated that other portions of the flexible layered circuit structure 702 can interface with the mounting structure elements 706.

Figure 8:
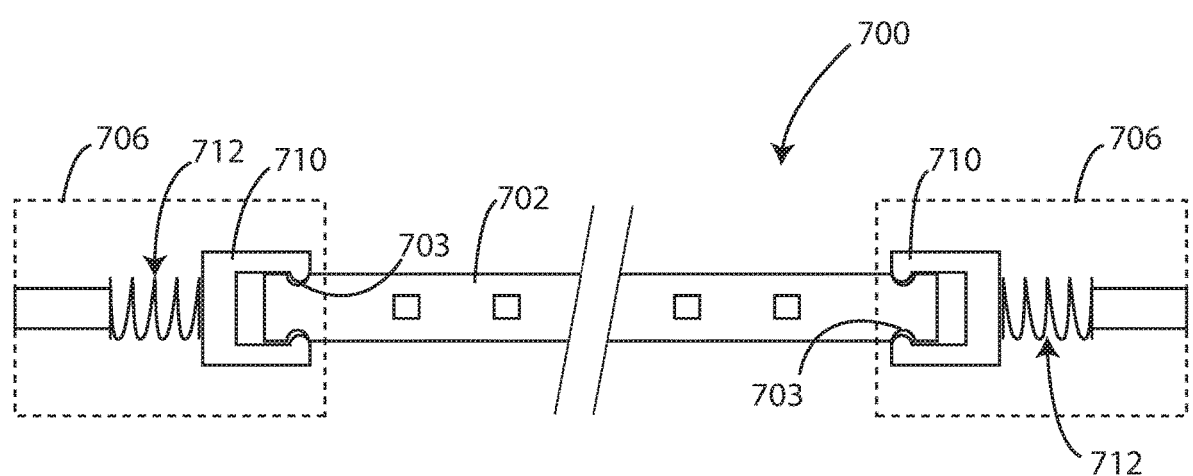
FIG. 8 is a schematic cut away top view of an LED lighting system in accordance with various embodiments herein.

Referring now to FIG. 8, a schematic cut away top view is shown of an LED lighting system 700 in accordance with various embodiments herein. In this view, one example of how the flexible layered circuit structure 702 can be attached to the mounting structure elements 706 is shown. The flexible layered circuit structure 702 can define notches 703 near the ends of the flexible layered circuit structure 702. The mounting structure elements 706 can include an engagement member 710 that passes into the notches 703 in order to grip the flexible layered circuit structure 702. The mounting structure elements 706 can also include a tensioner 712. The tensioner 712 can provide spring force in order to apply tension to the flexible layered circuit structure in order to make it taut. In some embodiments, the tensioner 712 can be configured to maintain a tension force of at least about one ounce (0.28 N). The tensioner 712 can be configured to maintain a tension force on the flexible layered circuit structure despite thermal expansion of the flexible layered circuit structure. By way of example, in some embodiments, the tensioner can be configured to maintain a tension force of at least one ounce (0.28 N) despite thermal expansion of the flexible layered circuit structure of up to 1 millimeter per meter in length of the flexible layered circuit structure. In some embodiments, the tensioner 712 can include a spring. In some embodiments, the mounting structure is used to take up variable length or mechanical tolerances in the construction of the flexible layered circuit structure.

Figure 9:
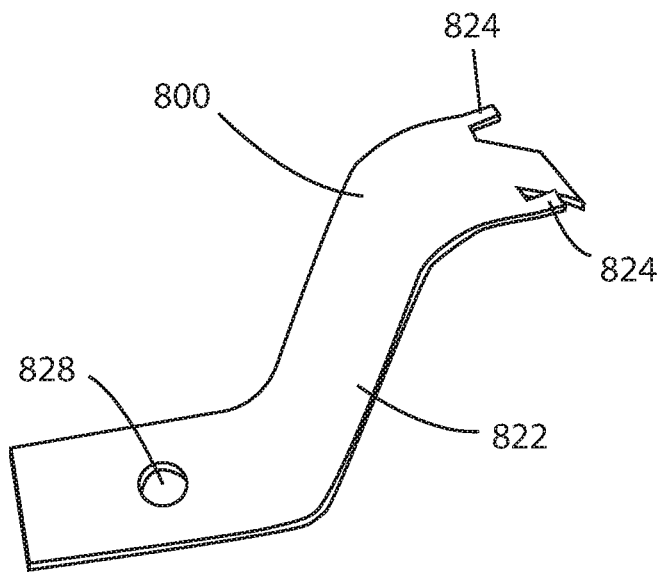
FIG. 9 is a schematic view of a portion of a mounting structure in accordance with various embodiments herein.
Figure 10:
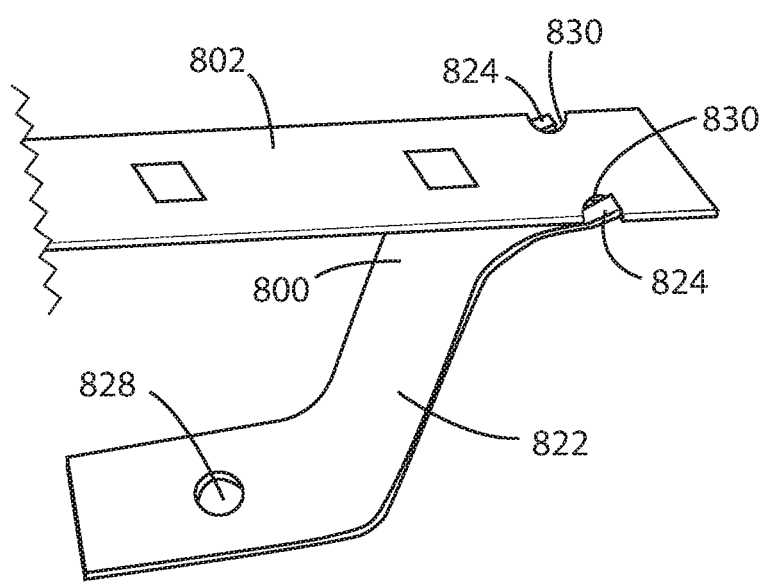
FIG. 10 is a schematic view of a portion of a mounting structure interfaced with a flexible layered circuit structure in accordance with various embodiments herein.

Referring now to FIG. 9, a schematic view of a portion of a mounting structure 800 is shown in accordance with various embodiments herein. The mounting structure 800 can include tabs 824 (or projections). The mounting structure 800 can include a body portion 822 and an aperture 828 to facilitate mounting to another component such as a housing substrate. Referring now to FIG. 10, a schematic view of a portion of a mounting structure 800 interfaced with a flexible layered circuit structure 802 is shown in accordance with various embodiments herein. In this view, it can be seen that the tabs 824 fit within the notches 830 in the flexible layered circuit structure to support it and hold it in place. In addition, the body portion 822 can be capable of being flexed to generate a spring force that can be exerted on the flexible layered circuit structure 802. In this embodiment, the mounting structure for a single end of the flexible layered circuit structure can be formed of a single piece of material, such as a metal or a polymer. However, in other embodiments the mounting structure can include multiple pieces of material.

Figure 11:
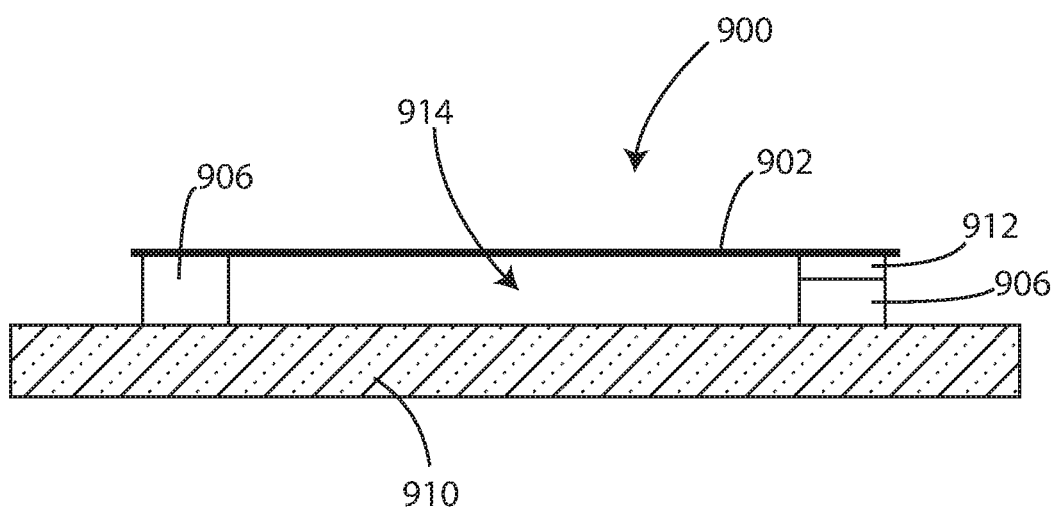
FIG. 11 is a schematic side view of an LED lighting system in accordance with various embodiments herein.

Referring now to FIG. 11, a schematic side view is shown of an LED lighting system 900 in accordance with various embodiments herein. The LED lighting system 900 can include a flexible layered circuit structure 902. The flexible layered circuit structure 902 can be suspended above a housing substrate 910, such that there is an air gap 914 disposed in between the bottom thermally conductive layer of the flexible layered circuit structure 902 and the housing substrate 910. A mounting structure can be used to suspend the flexible layered circuit structure. In this embodiment, the mounting structure can include one or more blocks 906. The blocks 906 can serve to hold the flexible layered circuit structure 902 in place. In some embodiments, the posts can be configured to exert tension on the flexible layered circuit structure in the direction of the lengthwise axis of the flexible layered circuit structure such that it is maintained taut (e.g., the tension is exerted in a direction away from the middle of the flexible layered circuit structure). In some embodiments, a tensioner 912 can be disposed between the block 906 and the flexible layered circuit structure 902. In this embodiment, for example, the tensioner 912 can include a spring-loaded connection point (such as a hook or tab receptacle) to exert tension on the flexible layered circuit structure 902. In some embodiments, the tensioner 912 can be configured to move with respect to the block 906 in order to apply tension to the flexible layered circuit structure 902. By way of example, the block 906 can move within a channel formed in the block 906.

Figure 12:
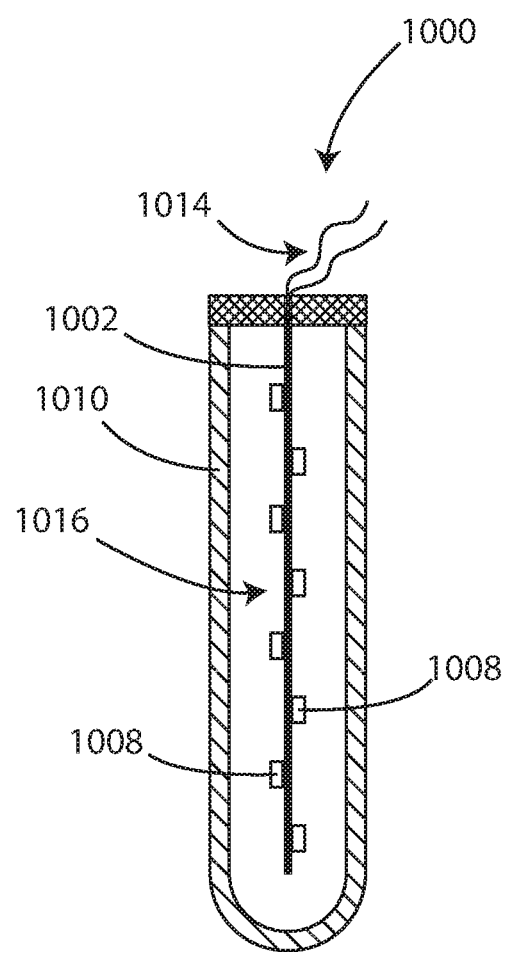
FIG. 12 is a schematic side view of an LED lighting system in accordance with various embodiments herein.

Referring now to FIG. 12, a schematic side view is shown of an LED lighting system 1000 in accordance with various embodiments herein. The LED lighting system 1000 can include a flexible layered circuit structure 1002. Light emitting diodes 1008 can be mounted on the flexible layered circuit structure 1002. The flexible layered circuit structure 1002 can be suspended inside a cavity defined by a housing substrate 1010. There can be an air gap 1016 disposed in between the flexible layered circuit structure 1002 and the housing substrate 1010. Leads 1014 can be arranged to provide electrical current to the flexible layered circuit structure 1002.

Figure 13:
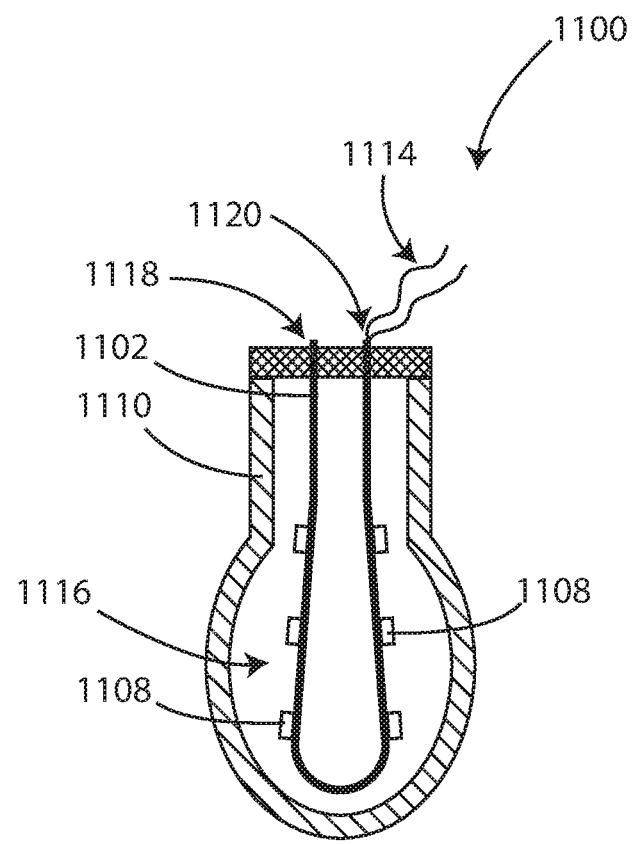
FIG. 13 is a schematic side view of an LED lighting system in accordance with various embodiments herein.

Referring now to FIG. 13, a schematic side view is shown of an LED lighting system 1100 in accordance with various embodiments herein. The LED lighting system 1100 can include a flexible layered circuit structure 1102. Light emitting diodes 1108 can be mounted on the flexible layered circuit structure 1102. In this embodiment, the flexible layered circuit structure 1102 can assume a U shape such that the first end 1118 and the second end 1120 are disposed adjacent to one another. The flexible layered circuit structure 1102 can be suspended inside a cavity defined by a housing substrate 1110. There can be an air gap 1116 disposed in between the flexible layered circuit structure 1102 and the housing substrate 1110. Leads 1114 can be arranged to provide electrical current to the flexible layered circuit structure 1102.

Figure 14:
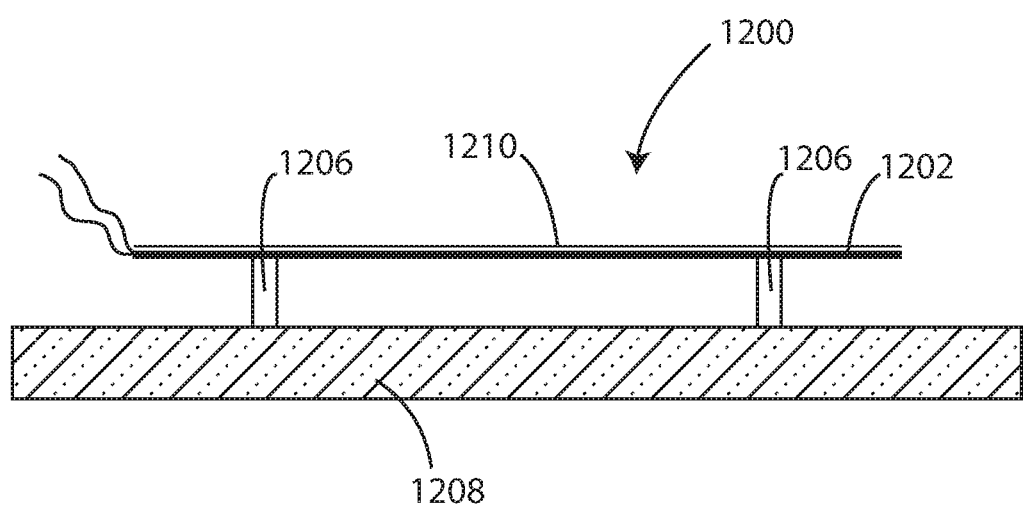
FIG. 14 is a schematic side view of an LED lighting system in accordance with various embodiments herein.

Referring now to FIG. 14, a schematic side view is shown of an LED lighting system 1200 in accordance with various embodiments herein. The LED lighting system 1200 can include a flexible layered circuit structure 1202 and electrical leads to provide electrical current to the flexible layered circuit structure 1202. Material can be disposed over the top of flexible layered circuit structure 1202 (and thus over the top of LEDs in various embodiments) such as optics 1210, secondary optics, or a diffuser. The flexible layered circuit structure 1202 can be suspended above a housing substrate 1208, such that there is an air gap disposed in between the bottom thermally conductive layer of the flexible layered circuit structure 1202 and the housing substrate 1208. A mounting structure can be used to suspend the flexible layered circuit structure. In this embodiment, the mounting structure can include one or more posts 1206 or standoffs.

Figure 15:
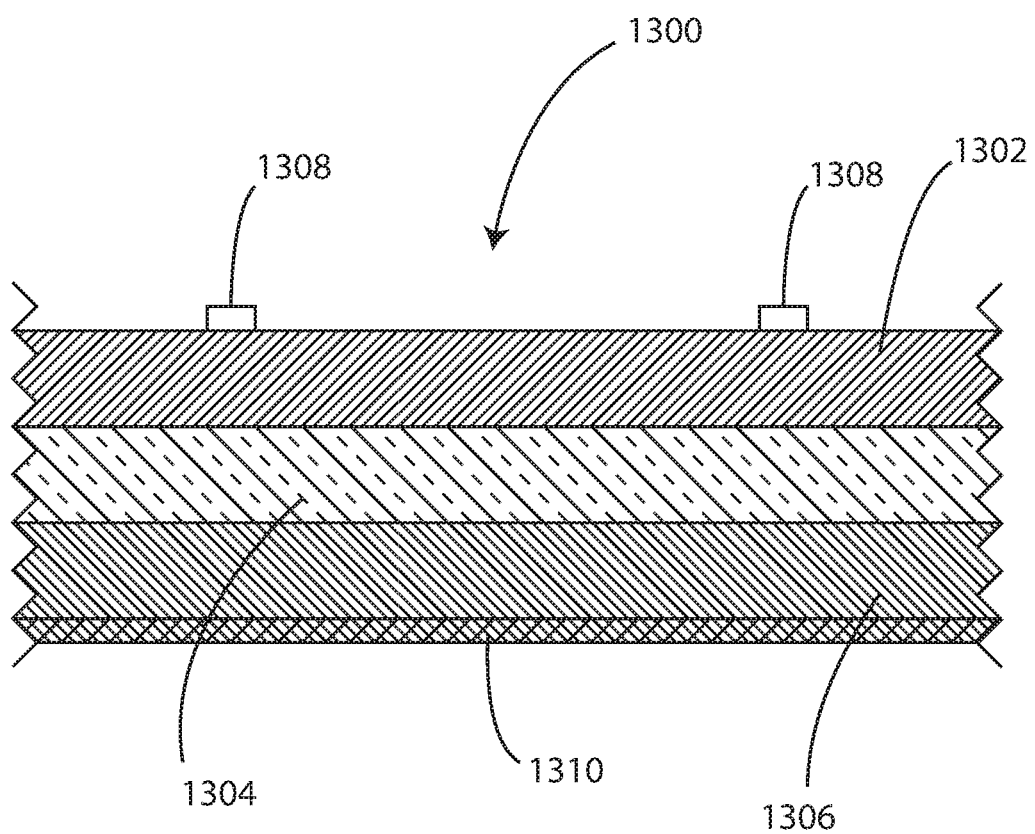
FIG. 15 is a schematic cross-sectional view of a flexible layered circuit structure in accordance with various embodiments herein.

It will be appreciated that various modifications can be made in order to enhance heat dissipation in the system. By way of example, various modifications can be made to the flexible layered circuit structure in order to enhance heat dissipation. Referring now to FIG. 15, a schematic cross sectional view is shown of a flexible layered circuit structure 1300 in accordance with various embodiments herein. The flexible layered circuit structure can include a top thermally conductive layer 1302, a middle electrically insulating layer 1304, and a bottom thermally conductive layer 1306. A plurality of light emitting diodes 1308 can be mounted on the top thermally conductive layer 1302. A coating 1310 can be disposed on the bottom thermally conductive layer 1306, the coating 1310 comprising a material with properties that enhance heat transfer. For example, in some embodiments, the coating can be a thermally conductive and emissive material. In some embodiments, the coating can be a material such as tinning.

In some embodiments, additional structural features can be disposed on the bottom layer in order to assist in heat dissipation. By way of example, structural features including, but not limited to, heat slugs, cooling fins, heat conductive projections, and the like can be mounted on the bottom surface of the bottom layer in order to aid in heat dissipation.

Figure 16:
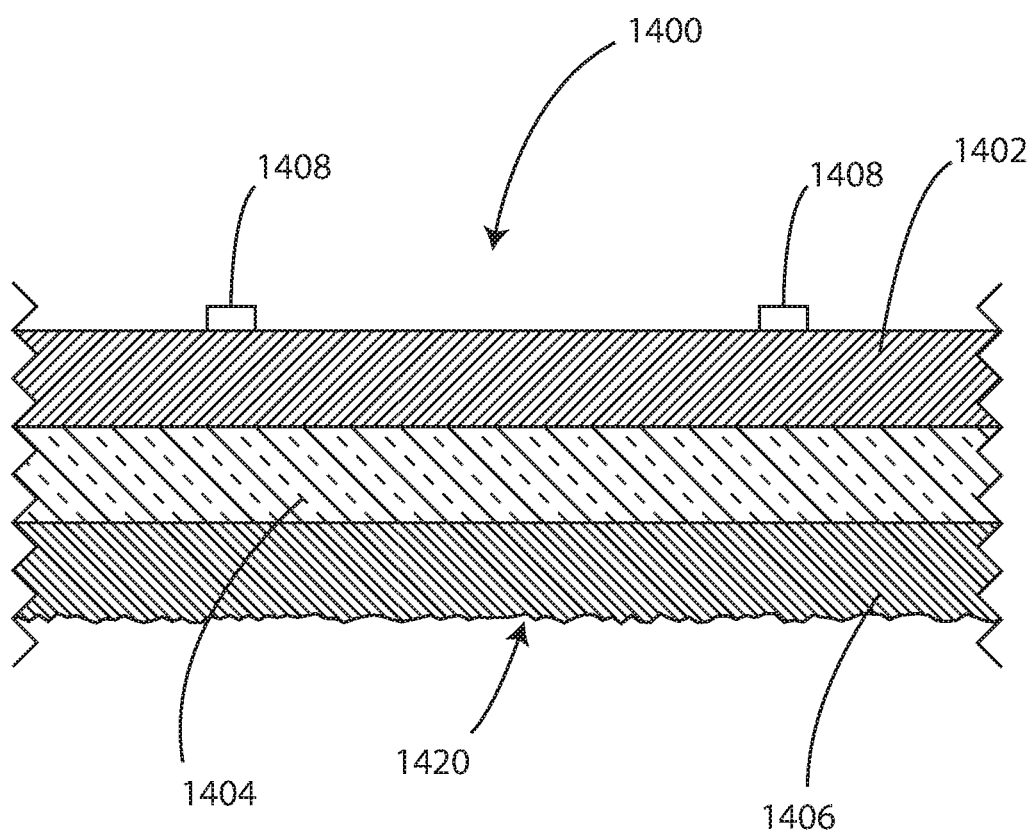
FIG. 16 is a schematic cross-sectional view of a flexible layered circuit structure in accordance with various embodiments herein.

In some embodiments, the flexible layered circuit structure can be altered in order to enhance heat transfer. Referring now to FIG. 16, a schematic cross sectional view is shown of a flexible layered circuit structure 1400 in accordance with various embodiments herein in accordance with various embodiments herein. The flexible layered circuit structure can include a top thermally conductive layer 1402, a middle electrically insulating layer 1404, and a bottom thermally conductive layer 1406. A plurality of light emitting diodes 1408 can be mounted on the top thermally conductive layer 1402. In this embodiment, the bottom surface 1420 of the bottom thermally conductive layer 1406 can have a surface topology that is different than a standard flat surface. By way of example, the surface can have numerous peaks and valleys (or be textured) in order to increase the surface area.

In some embodiments, the textured surface can have a surface area at least 10 percent greater than an equally sized substantially flat surface. In some embodiments, the textured surface can have a surface area at least 20 percent greater than an equally sized substantially flat surface. In some embodiments, the textured surface can have a surface area at least 30 percent greater than an equally sized substantially flat surface. In some embodiments, the textured surface can have a surface area at least 40 percent greater than an equally sized substantially flat surface. In some embodiments, the textured surface can have a surface area at least 80 percent greater than an equally sized substantially flat surface. In some embodiments, the textured surface can have a surface area at least 100 percent greater than an equally sized substantially flat surface.

Figure 17:
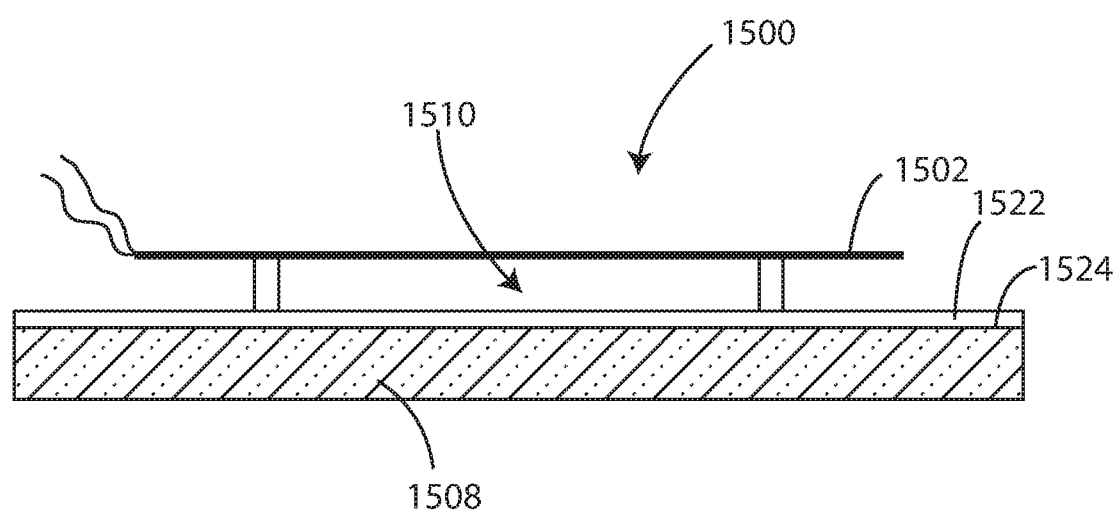
FIG. 17 is a schematic side view of an LED lighting system in accordance with various embodiments herein.

Referring now to FIG. 17, a schematic side view is shown of an LED lighting system 1500 in accordance with various embodiments herein. The LED lighting system 1500 can include a flexible layered circuit structure 1502 and electrical leads to provide electrical current to the flexible layered circuit structure 1502. The flexible layered circuit structure 1502 can be suspended above a housing substrate 1508, such that there is an air gap 1510. The top surface 1524 of the housing substrate 1508 can be coated with a layer of material 1522 to enhance heat flow across the air gap 1510.

In some embodiments, a fan can be included to enhance heat dissipation by causing movement of air over surfaces of the flexible layered circuit structure.

It will be appreciated that various methods are also included herein. The method for making an LED lighting system can include obtaining a flexible layered circuit structure that can include, a top thermally conductive layer, a middle electrically insulating layer, a bottom thermally conductive layer. The method can further include suspending the flexible layered circuit structure above a housing substrate with an air gap disposed in between the bottom thermally conductive layer of the flexible layered circuit structure and the housing substrate, wherein the distance between the layered circuit structure and the housing substrate is at least about 0.5 mm, and connecting the flexible layered circuit structure to a power source.

In some embodiments, suspending includes attaching the flexible layered circuit structure to a mounting structure. In some embodiments, the mounting structure provides the connection to the power source. In some embodiments, the method can further include cutting the flexible layered circuit structure to a desired length. In some embodiments, the method can include unwinding the flexible layered circuit structure from a storage reel prior to cutting. In some embodiments, suspending can include attaching the flexible layered circuit structure to a mounting structure that provides a tension force along the length of the flexible layered circuit structure. In some embodiments, the method can further include applying a tension force of at least one ounce (0.28 N) to the flexible layered circuit structure. In some embodiments, the method can further include removing the flexible layered circuit structure from the position suspended above a housing substrate. In some embodiments, the action of removing the flexible layered circuit structure can be accomplished without tools. In some embodiments, the method can further include replacing the flexible layered circuit structure with another flexible layered circuit structure.

Figure 18:
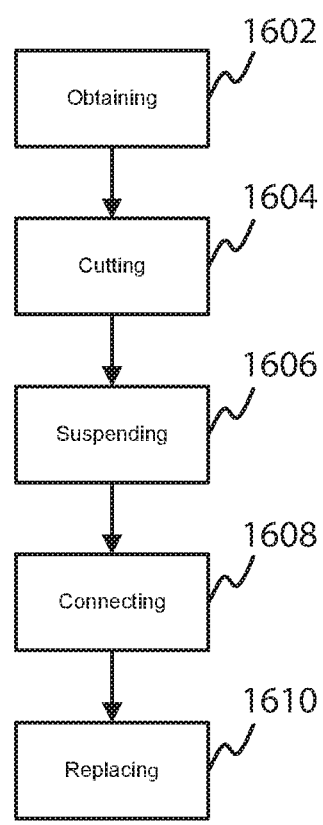
FIG. 18 is a flowchart of a method of making an LED lighting system in accordance with various embodiments herein.

Referring now to FIG. 18, a flow chart is shown of a method of making an LED lighting system in accordance with various embodiments herein. The method can include an operation of obtaining a flexible layered circuit structure 1602. Optionally, in some embodiments, the method can further include an operation of cutting the flexible layered circuit structure to a desired length 1604. In various embodiments, the method can further include an operation of suspending the flexible layered circuit structure above a housing substrate 1606. In some embodiments, the method can further include an operation of connecting the flexible layered circuit structure to a power source 1608. Optionally, in some embodiments, the method can include a step of replacing the flexible layered circuit structure with another flexible layered circuit structure 1610. In various embodiments the flexible layer circuit structure can be removed, and optionally replaced, without the use of tools (for example without the need to remove soldering from elements of the system).

In some embodiments, a method for operating an LED lighting system is included. The method for operating an LED lighting system can include providing electrical current to an LED lighting circuit, the LED lighting circuit including a plurality of light emitting diodes, the LED lighting circuit disposed upon a flexible layered circuit structure can include a top thermally conductive layer, a middle electrically insulating layer, and a bottom thermally conductive layer. The method can further include dissipating heat from the light emitting diodes to ambient air through the top surface of the top thermally conductive layer and the bottom surface of the bottom thermally conductive layer.

Embodiments of the present invention described below describe interconnections providing advantages over both traditional and more recent methods of interconnect such as the newly introduced FlexRAD™ system of continuous connection. Embodiments of the present invention include aspects addressing the strength, reliability and usability of interconnects between the semi-flexible substrates in order to produce long strips or continuous reels for ease in fixture assembly.

Embodiments of the present invention provide for a thin board substrate, which makes the connector flexible enough to conform to normal variations of board thickness, solder height and mechanical mounting height differences. The thin board substrate allows heat and solder to easily flow through the connector from top to bottom. An electrical insulating layer within the thin board is both thin enough to enable a high degree of thermal conductivity and is able to maintain high levels of breakdown isolation. The material chosen for the electrically insulating layer enhances thermal conductivity.

The thin board substrate adds flexibility to the connection, reducing stress at the solder joint associated with the use of rigid pins and other types of connectors. This assists in preventing tearing of the printed circuit board pads on the board when bending stresses are introduced. The thin board substrate materials and thicknesses assist in handling solder melt temperatures without delamination or damage. Copper pads on the bottom side of the connector are designed to match the pads of the boards to be connected; in spacing, area and thermal characteristics.

Copper pads on a top side can receive heat (e.g., from a soldering iron) and provide a path for conduction through the electrically insulating substrate and/or a plated through hole to the pads on the bottom. The copper conductors are used to connect the pads to be mated to the printed circuit boards. The copper conductors can be thick to accommodate high currents. Copper conductors can be run on top or under the connector insulating substrate, depending on requirements for isolation, current carrying capacity and protection.

Embodiments of the present invention provide for copper foils designed to maintain gap distances between connections for electrical isolation. Connections and conductors are protected from damage or shorting by being covered by the connector body. Connections and conductors can be further protected from moisture by the simple addition of an under fill layer of potting material, an encapsulent or an overcoat of potting material or encapsulant.

Plated holes located at the pad positions, through the connector board allow solder and heat to flow down into the connection both to facilitate solder connections and to enable rapid connection. The plated holes located at the pad positions take up excess solder when solder paste is used to make connections or when solder is applied manually. The plated holes located at the pad positions can be used to store solder paste for later reflow.

Embodiments of the present invention provide for sealing of solder paste in the holes at the pad positions so the paste remains fresh for later use. The sealing may include a thin solder layer, a thin flux layer or a thin plastic or metallic peel-off material.

Angled or other geometric patterns in the pad and copper conductors support connections for offset or angled printed circuit boards. Multiple pad sets and associated conductor connections allow splitting of conduction paths.

A masking coating over the top and the bottom of the connector board (open at the pads), reduces the opportunity for solder shorts and improve the appearance of the connector. The masking material can be chosen to match the color and characteristics of the boards being jointed to minimize the visibility of the connector.

The connectors can be easily formed for vertical step offsets. Connectors onto which other circuits can be used, including pads and geometries for wire or other conventional types of connectors, as well as terminations and active circuitry. The connectors can be stackable. Connectors with substrate can extend well beyond pad areas providing mechanical support. Connectors with additional pads can provide additional strain relief.

The pad geometries may match existing pinned connectors to allow an option to alternate use of pinned connectors. The thin board can be designed to be cut with scissors or a simple shear. Printed lines at the top of the strip or matrix can show expected cut lines; providing guidance. Copper pads, holes and conductors can be a sufficient space from the cutting location to assure only electrically insulating substrate will be cut.

Embodiments of the present invention provide for intimate contact between metal pads with minimal fill layer of solder to increase joint strength. Larger pads can be used to increase the strength, both because of the larger solder contact area, but also because of the larger areas of contact and adhesion between pad and insulating substrate. Larger areas of conductor surrounding exposed, soldered pad apertures increase the strength both by offering more area for adhesion between conductors and the insulating substrate, but also because they add to the conductor structure. The spacing of the pads for maximum array width and height increases the joint strength against shear and rotational forces and torques. A space between pad and edges of the board can be maintained to increase strength by decreasing leverage and converting stresses into surface pressures away from the joint.

Embodiments of the present invention disclose increasing the number of holes leading from the top surface to the pad, which increases the strength by adding more areas of solder fill. The increased number of holes also increases the probability of having a better percentage of solder fill. The choice of solder type and composition can have an impact on joint strength. Lead baring solders have lower tensile strength then their lead free counterparts. Higher tensile strength increases the fracture strength of the connection.

Embodiments of the present invention provide for the application of thermal tape or adhesive across the bottom side of the joint to increase joint strength. The application of potting material or other adhesives or coatings of the structure adds additional strength to the joint. In the areas of board overlap, excluding the conductive pad locations, adhesive can be added to increase joint strength.

Embodiments of the present invention enable connection of two or more circuit boards to construct various forms, including linear strips and two and three dimensional arrays and matrix forms. Embodiments of the present invention include construction of flat grids of circuit boards, as well as grids able to be formed around curved surfaces or sharp corners. In alternate embodiments three dimensional shapes may be formed.

Figure 19:
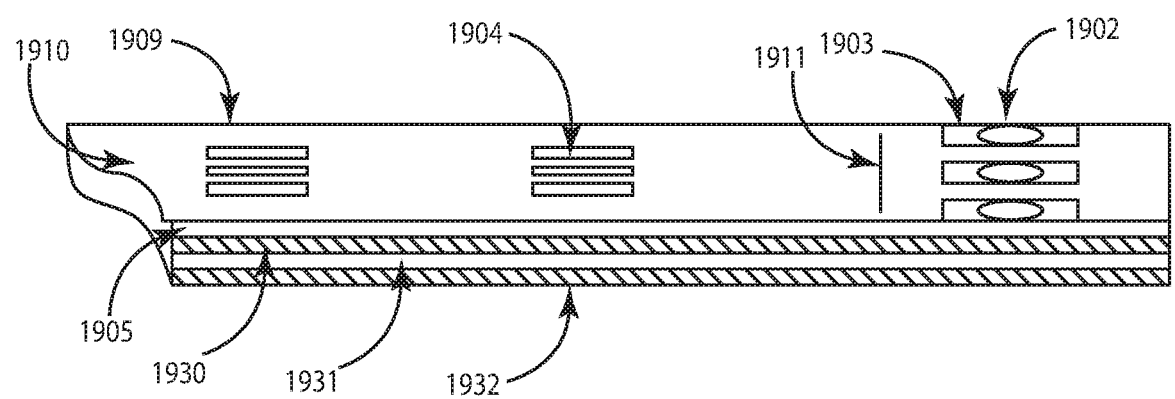
FIG. 19 shows a top and cut away view exposing layers of a circuit board with connection pads in an embodiment of the present invention.
Figure 26A:
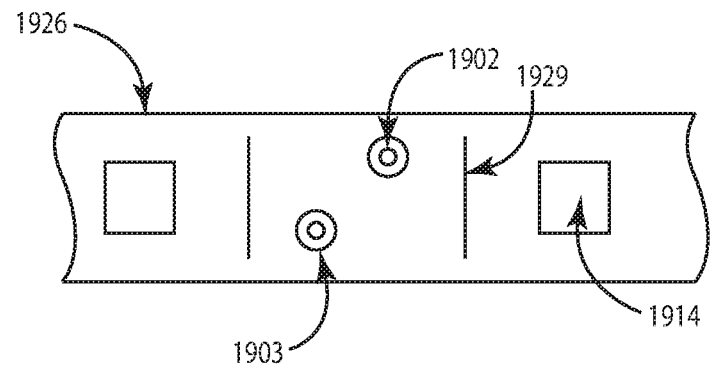
FIG. 26A shows a top view of the top board for a mid-length connection in an embodiment of the present invention.

With reference to FIG. 19, a top and cut away view exposing layers of a circuit board with connection pads in an embodiment of the present invention is shown. The circuit board 1909 can have two electrically conductive layers 1930, 1932 with a thin electrical isolating material 1931 sandwiched in between. The inventors chose the electrically conductive layers to be 2 oz. copper. The inventors also chose the inner insulating layer to be 0.012 inch thick fiberglass composite material. Circuit paths of various designs can be etched into the top and bottom conductive layers 1930, 1932 to produce the circuit conductive paths. Plated through holes 1902 can be added at metal pads 1903 and plated through with conductive metal to form a connection between top and bottom. Additional thin layers of non-conductive solder repelling material 1905 (solder masks) can be added to the top and bottom of the board 1909 to restrict the movement of solder and protect the circuit paths from the pads 1903. The solder mask 1905 is interrupted to expose conductive pads 1904 for mounting electronic components 1913, as well as pads 1903 used for board interconnect. On top of the solder mask 1910, visible markings may be printed consisting of text and other circuit markings, and special alignment marks 1911, 1917 (FIG. 20A), 28 (FIG. 26C) and 29 (FIG. 26A) or cut marks 1933, 1934 (FIG. 31C).

In one embodiment the circuit boards 1901 (FIG. 20A) and 1909 consisted of a thin, low thermal mass substrate base material comprised of two electrically conductive layers with a thin, electrically isolating material sandwiched in between. Electrically conductive layers used for proof of concept testing consisted of 2 oz. copper. The thin, semi-flexible circuit boards can be designed with regions of conductors and pads allowing them to function as connectors, enabling the mating of one board to another. The circuit board consists of a thin, low thermal mass substrate base material comprised of two electrically conductive layers with a thin, electrically isolating material sandwiched in between. Electrically conductive layers used were of 2 oz. copper. The inner insulating layer was chosen to be 0.012 inch thick fiberglass composite material. Both of these are common to circuit board fabrication, however generally used for inner layers of a multilayer circuit board, not for circuit board in completion. Circuit patterns 1960 (FIG. 22B) of various designs were etched into the top and bottom conductive layers to produce the circuit conductive paths. Holes 1902 are added at the pad locations 1903 and plated through with conductive metal to form a connection between top and bottom. Additional thin layers of non-conductive, solder repelling material 1905 (solder masks) were added to the top and bottom of the board to restrict the movement of solder and protect the circuit paths away from the pads.

Circuit materials and thicknesses are of a design which allows circuit boards 1901, 1909 to be cut with a conventional shear or scissors 1937 at any of several locations enabling later trimming to length or separation. It is fully contemplated circuit boards could be laser cut as well to obtain individual circuit strips or arrays. Electrical components, including LED emitters can be assembled onto circuit boards by conventional methods of electronic solder assembly.

Copper conductors can be used for connecting pads 1904, 1903 to be mated with other electronic components 1913. These are etched or formed from the conductive layers 1930, 1932 described above. These circuit paths can be printed in almost any pattern commonly used in circuit boards and can be patterned to receive electronic components 1913 such as LEDs 1914 or integrated circuits. The copper conductors can be very thick and wide to accommodate high currents. In an embodiment 2 oz. copper was used with a conductor width of 0.040 inch to enable a low voltage drop across the connector when carrying up to 5 amps of current.

It is recognized there may be one or more conductive layers in the circuit board structure.

Copper foils are designed to maintain gap distances between connections for electrical isolation. In an embodiment, voltage isolations of up to 500 V were maintained by maintaining a distance of 0.025 inches between copper foils. By increasing the spacing, substantially higher isolations can be achieved. Copper conductors can be run on top of or under the connector insulating substrate, depending on requirements for isolation, current carrying capacity and protection.

Circuit boards 1901, 1909 can incorporate a variety of circuits, including pads and geometries for wire or other conventional types of connectors, as well as being able to incorporate terminations and active circuitry. The thin circuit board described above is particularly well suited because of its high thermally conductive structure for power and heat creating circuits. In one implementation, the circuitry for high current driver 19013 (e.g., one semiconductor #NUD4001 operating at 24 VDC) along with a LED string 1914 was added to the top side of the board. Both the top side FIG. 20A and bottom side FIG. 20B of the board were designed with large metal (e.g., copper) foils and pads which could translate heat through the thin insulating material 1931 by effectively creating a large area for heat transfer from the top copper layer 1930 through the less thermally conductive insulating layer 1931 and to the bottom copper layer 1932.

Connections and conductors can be further protected from moisture by the simple addition of an under fill layer of potting material or an encapsulent or an overcoat of potting material or encapsulant 1924. Potting compounds or conformal coatings are commonly used in the industry to provide this type of protection. This type of connector is particularly suitable for these coatings because it is essentially flat with no recesses or areas which must be protected from contact with the coatings.

The material chosen for the electrical insulating layer 1931 enhances thermal conductivity. In one embodiment the electrically insulating layer 1931 was chosen as a high temperature variant of FR4 fiberglass with a glass transition temperature of 170° C., although other materials can be used. A higher than normal temperature rating of the material is intentionally used to gain more thermal margin allowing for the very rapid heating (and probable overheating during manual assembly) of the thin boards due to their low thermal mass. Even higher temperature materials would be helpful in the case higher melting temperature solders are to be used. It is helpful to use an insulating layer 1931 both durable at high temperatures and as highly thermally conductive as possible for this construction. Thermal conductivity is helpful for the cases of solder iron or point heat source assembly because it aides in rapid transfer of heat from the top side of the pads 1903 to pads 1907 below.

Figure 20A:
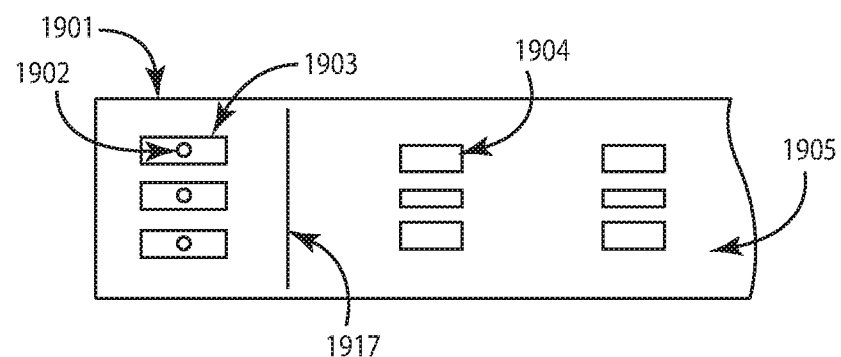
FIG. 20A shows a top view of top board pads and holes in an embodiment of the present invention.
Figure 20B:
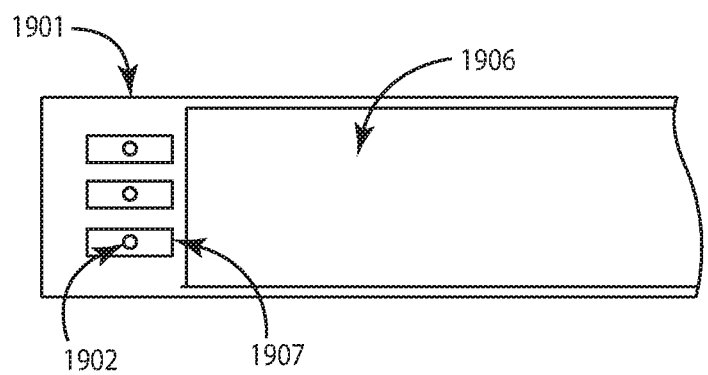
FIG. 20B shows a bottom view of top board pads and holes in an embodiment of the present invention.

With reference to FIG. 20A, a top view of circuit board 1901 shows electrically conductive connection pads 1903 and plated through holes 1902. Conductive pads 1904 are designed to accept electronic components 1913 and printed alignment mark 1917 as shown. FIG. 20B, show the bottom side of the same circuit board 1901 with additional connection pads 1907 and plated through holes 1902. In this embodiment a large conductive area 1906 was exposed to enable good thermal transfer and heat spreading from top side components and circuit paths to the bottom side. Optionally, the same area could be used for additional conductive paths and mounting of electronic components.

Figure 21:
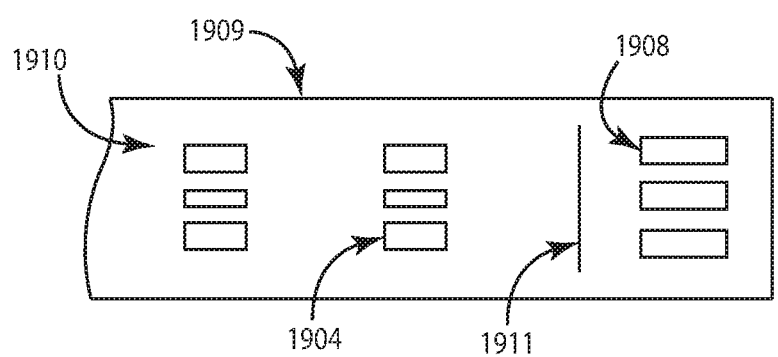
FIG. 21 shows a top view of bottom board receiving pad geometry in an embodiment of the present invention.

With reference to FIG. 21, the top side of a second circuit board 1909 is shown. Electrically conductive connection pads 1908 are designed to match the geometry and locations of the bottom side connection pads 1907 of circuit board 1901. Electrical components may be optionally mounted at exposed conductive pads 1904 on this circuit board. In this embodiment an alignment mark 1911 is printed on top of the solder mask 1905.

Figure 22A:
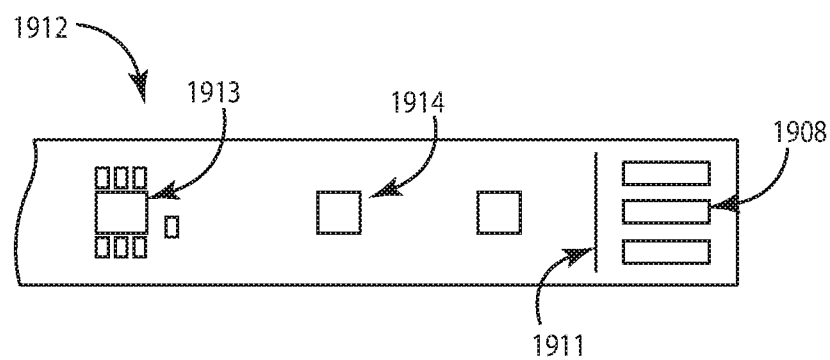
FIG. 22A shows a top view of an assembled board prior to joining in an embodiment of the present invention.

With reference to FIG. 22A, a fully assembled circuit board 1912 is shown with electronic components 1913 including LED's 1914 mounted onto the board.

Figure 22B:
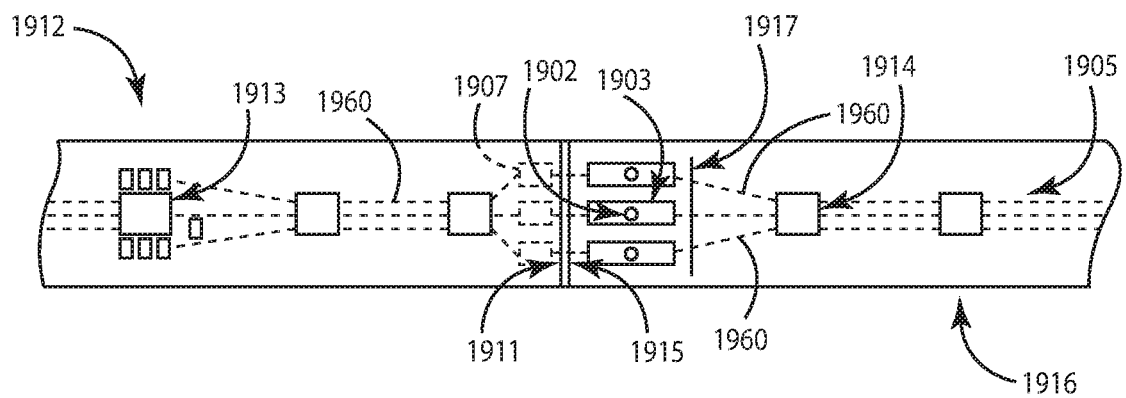
FIG. 22B shows a top view of joined boards in an embodiment of the present invention.

With reference to FIG. 22B, two fully assembled circuit boards 1912, 1916 are joined together. The lower circuit board 1912 alignment mark 1911 is used to align the edge 1915 of the upper circuit board 1916 so that the connection pads 1908, 1907 are in alignment. The upper circuit alignment mark 1917 is used to align the edge of the lower circuit board. It is recognized one or both of these alignment marks may be of different shapes or forms or omitted in the joining process. It is also recognized mechanical alignment devices may be used including tooling holes, slots and sighting holes. However, in this embodiment, the inventors chose linear marks for simplicity and for visual verification of alignment accuracy.

Figure 23:
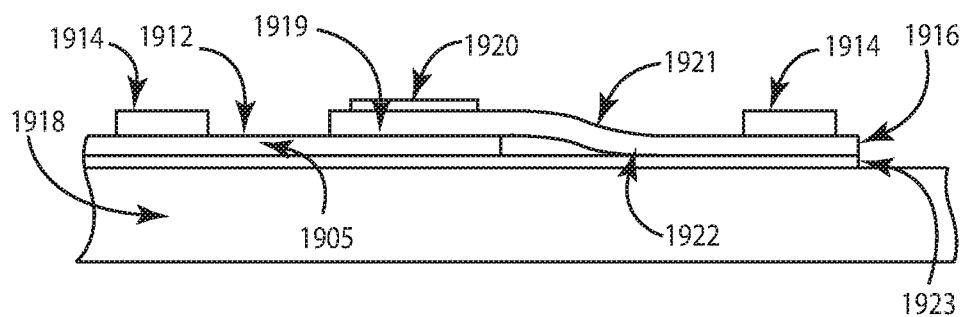
FIG. 23 shows a top profile view of an overlapping joint between boards in an embodiment of the present invention.

The circuit boards can be overlapped for interconnection (see FIG. 22B, FIG. 23). This is very useful if the connector board contains active circuitry and it is beneficial to connect multiple boards, such as in the fabrication of arrays of boards (see FIG. 28). The overlapping connections are highly advantageous to the assembly of strips consisting of multiple circuit boards (see FIG. 31C). In a practical application, they are used to make long circuit board strips or arrays of solid-state lighting circuits (e.g., high power LED emitters used as the individual light sources).

Thin board substrate materials and thicknesses are chosen to handle solder melt temperatures without delamination or damage. Alternate choices for board insulating material are possible such as Thermagon™ in cases where higher temperature resilience and higher thermal conductivity are needed. An embodiment was developed for use with lower temperature solders (e.g., leaded). Copper pads 1907 on the bottom side of the upper board 1901 are designed to match the pads of the bottom receiving board 1908 in spacing, in area and in thermal characteristics.

With reference to FIG. 23, a side profile view of an overlapping joint between boards in an embodiment of the present invention is shown. In this embodiment a connection 1919 is made by either welding or soldering the conductive pads 1907 from the top board 1916 to the bottom board conductive pads 1908 on the bottom board 1912. The size of pads 1907, 1908 factors into both the quality of the connection and the mechanical stress the connection can sustain. Also, by embedding or closely connecting through holes 1902 to pads 1907, 1908 the mechanical performance is improved. The metal plating and optional solder fill through holes 1902 links the top side pads 1903 to bottom side 1908 making the bottom side very difficult to pull off (delaminate) from the insulating layer 1931. In the embodiment, holes of 0.036 inch diameter are used to promote heat transfer, conduct solder and add enough structure to strengthen the joint. Lapped joints add strength by adding additional contact area, by reducing leverage, and by changing certain forces from shearing and tensile to compressive.

The interconnect aspect of FIG. 23 allows for the coupling of circuit boards without a connector or any other device between them.

Plated through holes 1902 located at pad positions 1903, 1907 through circuit board 1916 allow solder and heat to flow down into the connection both to facilitate solder connection and to enable rapid connection. The rate of heat transfer being increased by this structure has the additional benefit of speeding up solder melting and cooling both during manual soldering and reflow processing. This saves time and results in better, more repeatable and stronger joints. It is known in the industry faster cooling times result in stronger, more uniform solder joints.

Thin circuit boards can be easily mechanically formed for vertical step offsets 1921. In experiments run on these boards, bends up to a right angle could be performed with the conductors (or any foils crossing the bend) on the inside radius of the bend.

Figure 24:
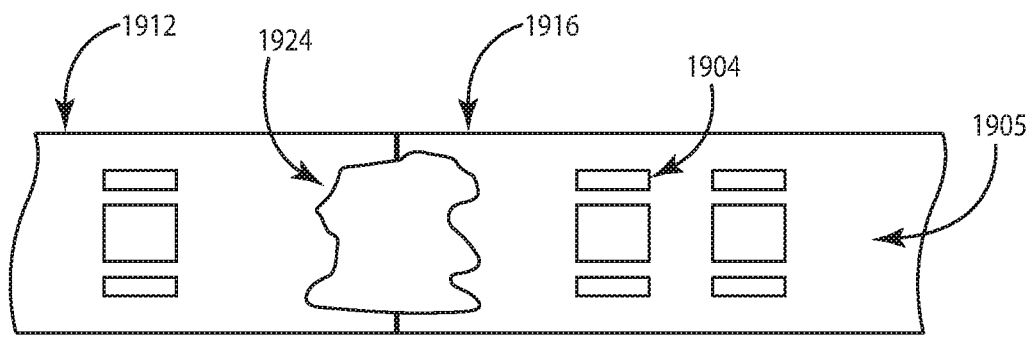
FIG. 24 shows a top profile view of potting material used to strengthen and protect connection joints in an embodiment of the present invention.

The application of tape or adhesive 1923, across the bottom side of joint 1920, further increases joint strength for handling. Viscous tapes act as a spring and dampener to certain stresses, moving forces away from the joint. The application of potting material 1924 or other adhesives or coatings of structure adds additional strength to joint 1920 as well as protection from mechanical damage and/or moisture (see FIG. 24).

The application of tape or adhesive 1923 on the bottom side of the board assembly 1922, allows the assembled strip or array to be directly fastened to a chassis, enclosure, or heat sink 1918 without the use of mechanical fasteners. In applications for high power LEDs it is particularly useful to have the tape or adhesive be highly thermally conductive so heat can easily flow from the circuit boards to the heat sink 1918. In one embodiment, a thermally conductive adhesive tape (e.g., 3M™ product #8810) was applied to the back side. The board assembly 1922 can then be adhered to a heat sink 1918. The resulting structure maintained excellent heat transfer to the heat sink, which is particularly helpful in high brightness LED applications.

Intimate contact between metal pads with minimal fill layer of solder increases strength for joint 1919. A thick layer of solder decreases strength but adds some flexibility to the joint. Solder has generally a much lower tensile and shear strength than the conductors it joins. Further, solder tends to have a course crystalline structure and is susceptible to fracturing. A thin layer of solder between copper pads (used the pad material) is much less susceptible to fracturing both because of smaller (or incomplete) crystal formation, and because stresses are transferred locally to the stronger copper, instead of into the solder itself.

A number of experiments were conducted to determine solder wetting and flow paths for various pad geometries using the thin connectors in surface mount applications. After it is melted, solder tends to wet to the metal pads 1903 and exposed conductors of printed circuit boards 1901 and 1909. It moves by capillary action to actively fill small gaps and spaces between pads 1907 and 1908, particularly pads in flat surface-to-surface contact. If solder was applied in exactly the correct amount, the solder would simply fill the joints. But even in small excess, the solder would press outside of the pad areas promoting shorts and lower electrical isolation. Holes, recesses or pockets between the pads were tried and did take up the excess solder. However, the approach was to design in plated holes 1902 within the area of the pads 1903 and 1907 taking up the solder through capillary action, effectively pulling excesses into rather than out of the joint. In the embodiment, the holes were approximately 50% of the diameter of the pad, giving ample room for significant variances in solder application.

As a further improvement, plated holes 1902 can be used as receptacles for solder paste so boards 1912, 1916 could be ready for joining by heat alone. Flux and activating resins, which are commonly incorporated into solder paste, are needed for high quality solder joints. In one embodiment, the same plated holes 1902 absorb excess solder used to store solder prior to thermal joining. Further, it is recognized the holes can be filled with either solder paste or separated layers of hard solder and flux resin. In one experiment, solder wire with a core of flux resin was press fit in holes 1902 and sheared to match the bottom surface plane of the circuit board 1901. This was another effective way of putting solder and flux into plated holes 1902. Sealing of solder paste in holes 1902 at pad positions 1903 and 1907 is helpful so paste remains fresh for later use. Sealing may include a thin solder layer, a thin flux layer or a thin plastic or metallic peel-off material.

The thin circuit board as described is flexible enough to conform to normal variations of board thickness, solder height, and mechanical mounting height differences. Goals for high reliability connections include robustness, both in mechanical strength and in integrity of the electrical connection. Several designs and methods were explored and found to improve both mechanical strength, and in many cases to improve the electrical connection integrity. By increasing the number of pads 1903, 1907 and 1908 used in the connector, mechanical strength was benefited. Simple multiplication of the number of contacts added to the strength by spreading stress across the added contacts. Redundant parallel contacts reduce electrical resistance and add to the general integrity of electrical connection.

Increasing the size of the pads 1907 and 1908 increases the strength both because of the larger solder contact area, but also because of the larger areas of contact and adhesion between pad and insulating substrate. In multiple trials, larger pads consistently increased the strength as measured in pull tests and in bending tests. Larger areas of conductor surrounding exposed soldered pad apertures increase the strength both by offering more area for adhesion between the conductor and the insulating substrate, but also because they add to the conductor structure.

Increasing the distance across a set of pads or span increases the joint strength against shear and rotational forces and torques. Shear and rotational forces (torques) are common during handling of the joined boards. Of particular use, the assembly of multiple boards into long strips presents the opportunity to put very high torques on the joint connection because of the length and lever arm advantage. Preventing damage due to rotational forces is helpful to having reliable joints when the strips are packaged and used in their multiple forms including strips and continuous reeled lengths.

By increasing the distance of the pads from the overlapping edges of the board, the inventors have found a decreased leverage on the individual connections by converting stresses into surface pressures away from the joint. By increasing the number of holes 1902 leading from top surface to the pads below, an increase in the strength is discovered by adding more copper cylindrical connections and rivet like columns of solder fill linking top to bottom. Increased number of holes also increases the probability of having a better percentage of solder fill between the boards. The choice of solder type and composition can have a direct impact on joint strength. Lead baring solders have lower tensile strength then their lead free counterparts. Higher tensile strength increases the fracture strength of the connection.

Angled or other geometric patterns in the connection pad and copper conductors support connections for offset or angled printed circuit boards. Multiple pad sets and associated conductor connections allow splitting of conduction paths.

As part of the printed circuit board fabrication process, mask coatings can be placed over top of circuit boards and the bottom of circuit boards (open at the pads), reducing the opportunity for solder shorts and improving the appearance of the connector or overlapping joint. In the embodiments, the mask coating 1905 was chosen to match the color and characteristics of the boards being jointed so to minimize the visibility of connection 1920.

In the areas of board overlap, excluding the conductive pad locations, adhesive applied between top and bottom board can be added to increase joint strength. The board connections with overlapping joints can be used to construct elongated strips or arrays of multiple circuit boards (see FIG. 28 and FIG. 31C). Mass parallel construction of long circuit board strips carrying high intensity LEDs for SSL applications has been achieved using these connection types.

Figure 25:
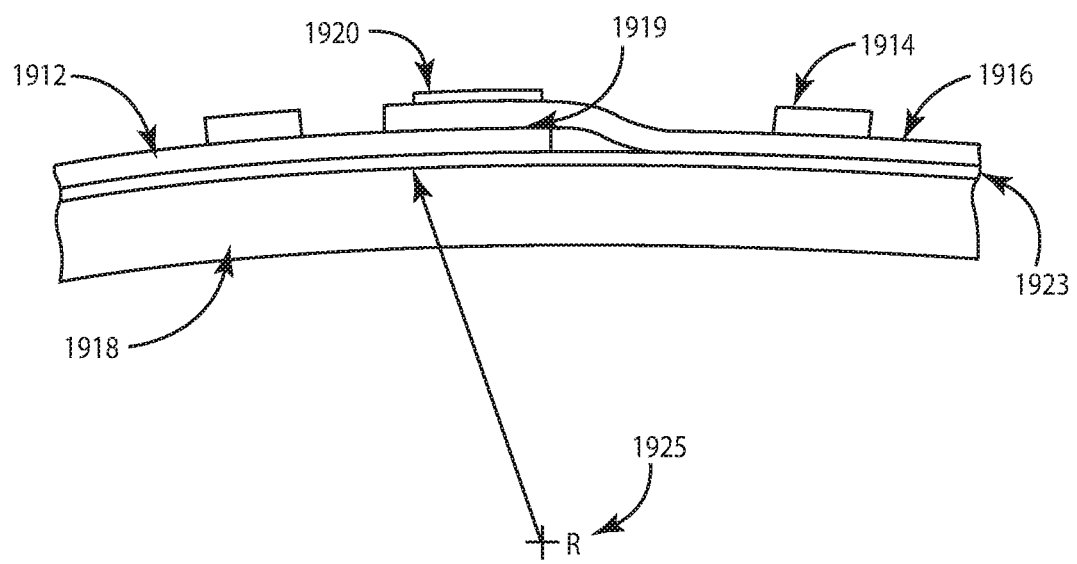
FIG. 25 shows a side view of a joint assembly of a flexible strip with curvature in an embodiment of the present invention.

With reference to FIG. 25, a side profile view of a board to board connector joint is shown in an embodiment of the present invention. Thin circuit boards 1912 and 1916 make connection 1920 with an overlapping joint. The circuit boards and connection are flexible enough to conform to normal variations of board thickness, solder height and mechanical mounting height differences in many applications. In this embodiment, board to board connection is shown to bend with a radius 1925 of less than 1 inch. The circuit boards are adhered to a heat sink 1918 by double sided thermal adhesive tape 1923, affecting a permanent and highly thermally conductive bond. The inventors have conceived of several other methods of attachment, including liquid adhesives, solder or welded bonds, mechanical fasteners, and spring tensioning. In high power LED applications, it is particularly helpful to have a good thermal connection to the heat sink because lower LED device temperatures improve brightness, efficiency and increase the expected life.

Figure 26B:
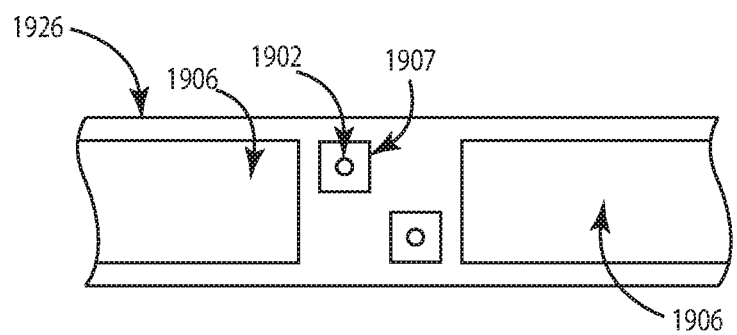
FIG. 26B shows a bottom view of the top board for a mid-length connection in an embodiment of the present invention.

With reference to FIG. 21A, an alternate embodiment is depicted placing the location of connection away from the end of the board. The layered construction of the circuit board has been described (see FIG. 19). Conductive pads 1903 are shown with plated through holes 1902 which pass through to pads 1907 on the underside of the board 1926. Printed alignment marks 1929 provide guidance for connecting overlapping boards. The circuit board may be pre-assembled with electronic components, such as LEDs 1914 and associated drive components. FIG. 26B shows the underside of the circuit board 1926. The plated through holes 1902 provide electrically conductive paths from the pads 1903 at the top of the board to pads 1907 at the bottom. Thermally conductive pads 1906 may be etched or formed into the lower conductive layer enabling heat to better transfer and spread from the conductors, pads and components at the top of the circuit board. The bottom side pads 1907 may be electrically isolated from the thermally conductive pads 1906.

Figure 26C:
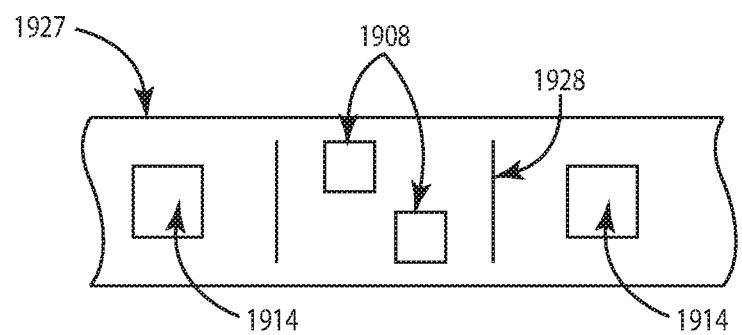
FIG. 26C shows a top view of the bottom board for a mid-length connection in an embodiment of the present invention.

FIG. 26C shows the top side of another circuit board 1927 in this embodiment connecting to the circuit board 1926. Electrically conductive pads 1908 are designed to receive connection from the previously described board. Additional alignment marks 1928 are used to guide in the assembly of the two boards.

Figure 27:
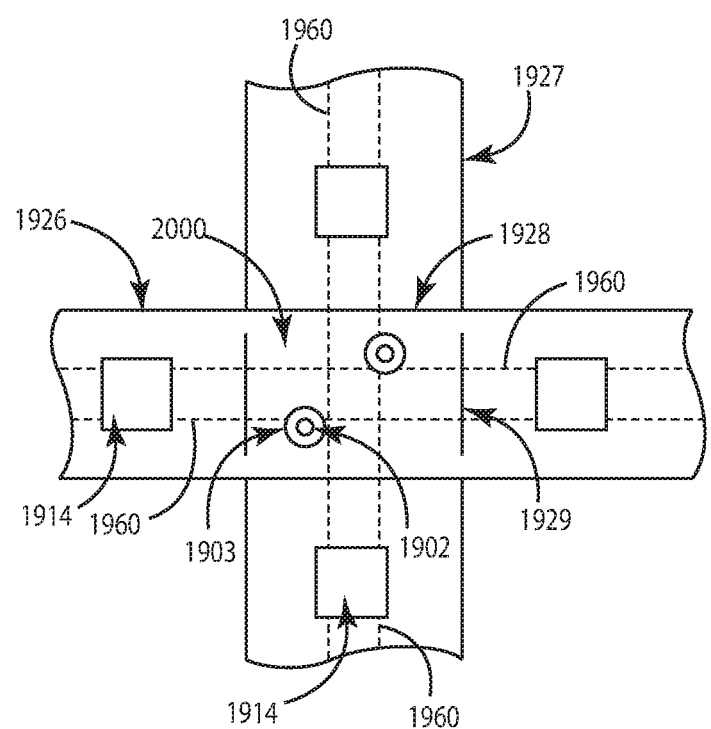
FIG. 27 shows a top view of an overlapping connection used in strip array construction in an embodiment of the present invention.

With reference to FIG. 27, two circuit boards 1926 and 1927 are joined at a right angle. Alignment marks 1928 from the lower circuit board are used to locate the second circuit board squarely providing vertical guidance. Alignment marks 1929 from the upper circuit board 1926 align to the edges of the lower circuit board 1927, providing horizontal guidance. As described earlier, solder or welding may be used to join the two boards forming a reliable joint 2000, forming electrical connections between circuitry of the two boards.

The inventors conceive circuit boards may be joined at any angle and at any location within the circuit boards in accordance with this invention. Further, there are no limits to the number of locations and the number of circuit boards joined.

Figure 28:
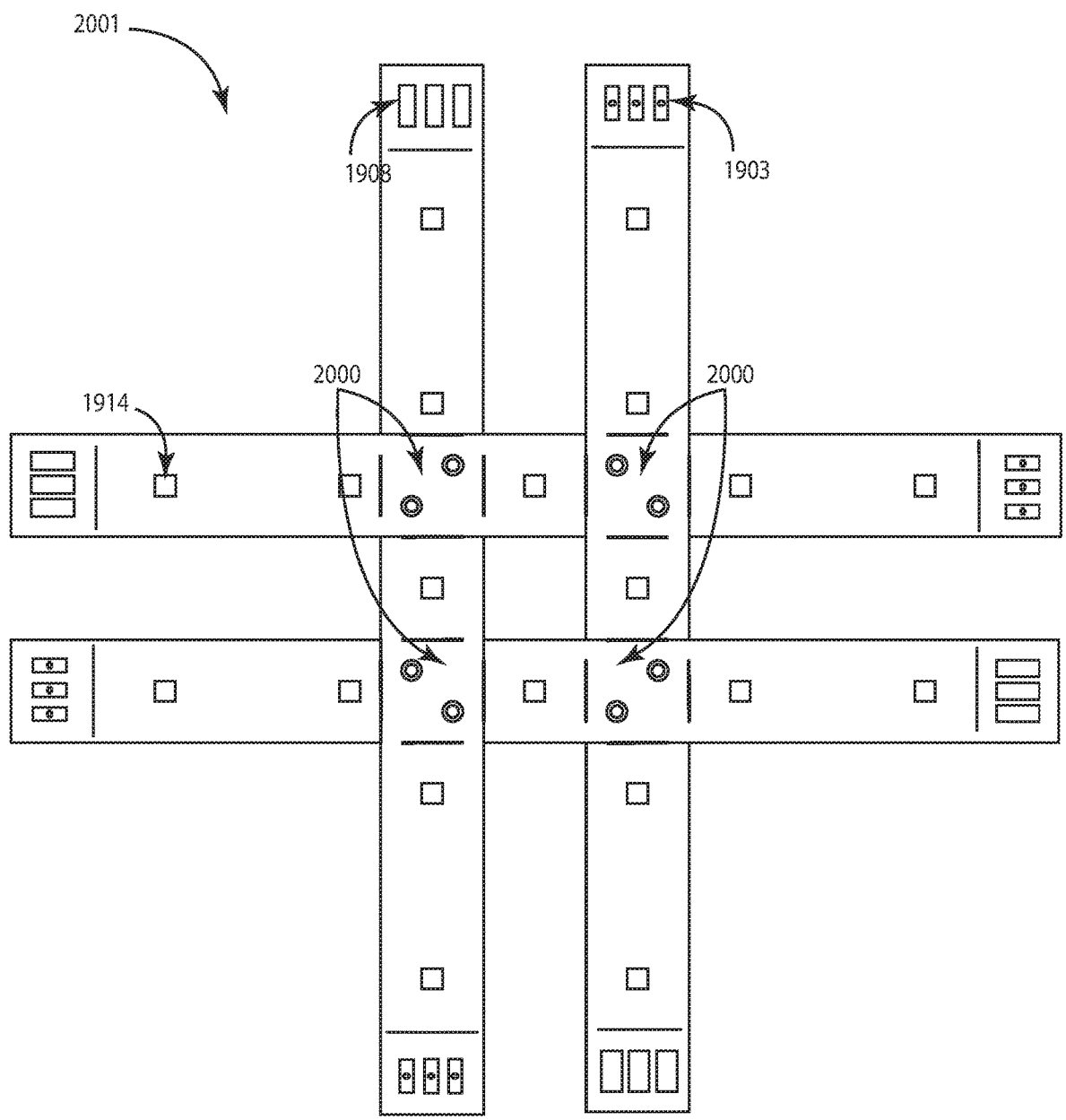
FIG. 28 shows a top view of the construction of a two board by two board grid array in an embodiment of the present invention.

With reference to FIG. 28, additional connections are made allowing the construction of a two board by two board array 2001. The connection joint 2000 is repeated four times in this embodiment. Additional connection pads 1908 and 1903 are indicated at the ends of the boards that can be used for connection to other boards or arrays.

The construction of circuit board arrays in accordance with this invention are particularly useful in SSL lighting applications because they reduce or eliminate wire and mechanical connector attachments and allow LEDs to be placed in specific geometric patterns without requiring as much printed circuit board material be used.

Figure 29:
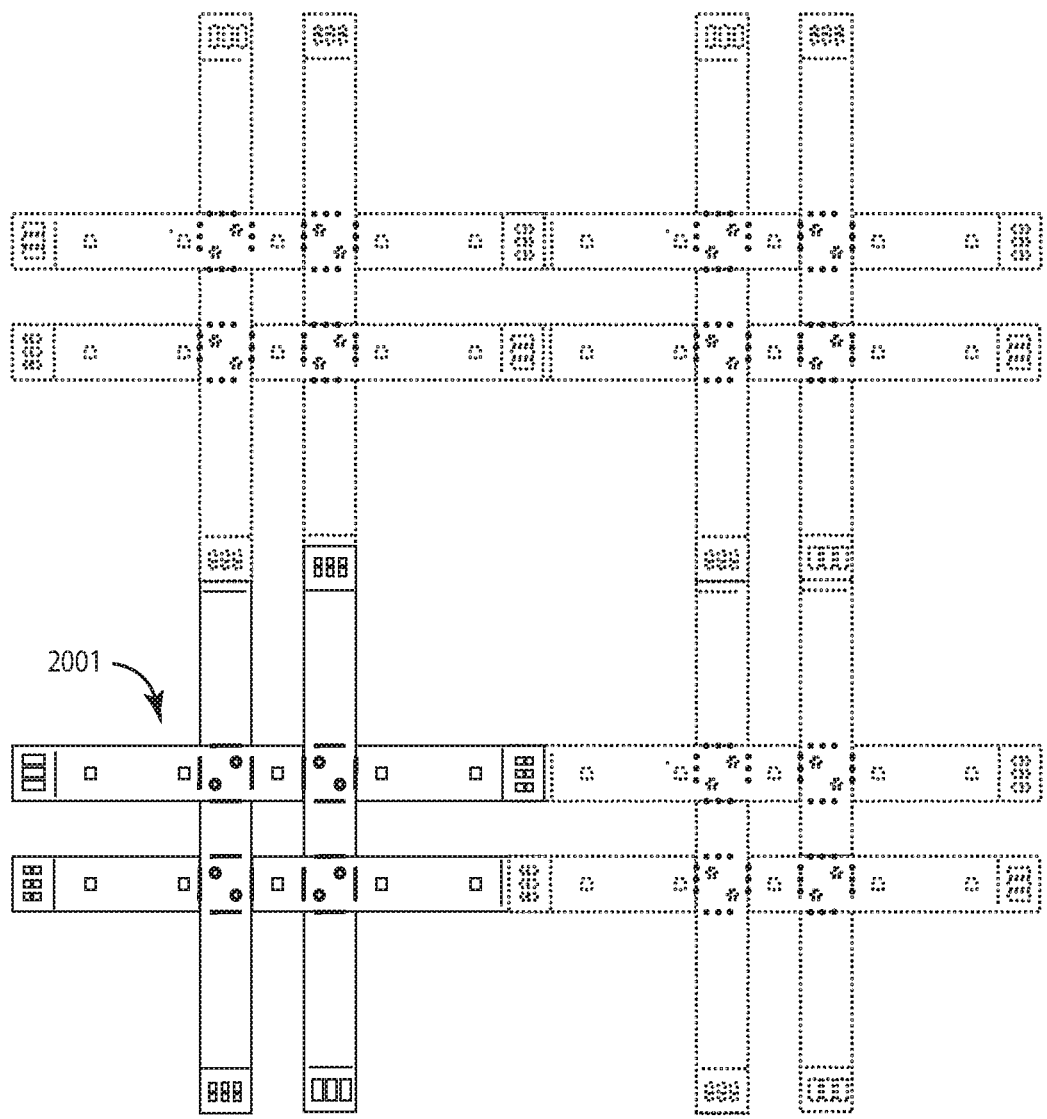
FIG. 29 shows construction of a larger grid using a two board by two board grid array in an embodiment of the present invention.

With reference to FIG. 29, construction of larger arrays and grids using building block arrays and circuit boards is conceived. In this embodiment, multiple two by two circuit board arrays 2001 are connected to form a larger area array.

Figure 30:
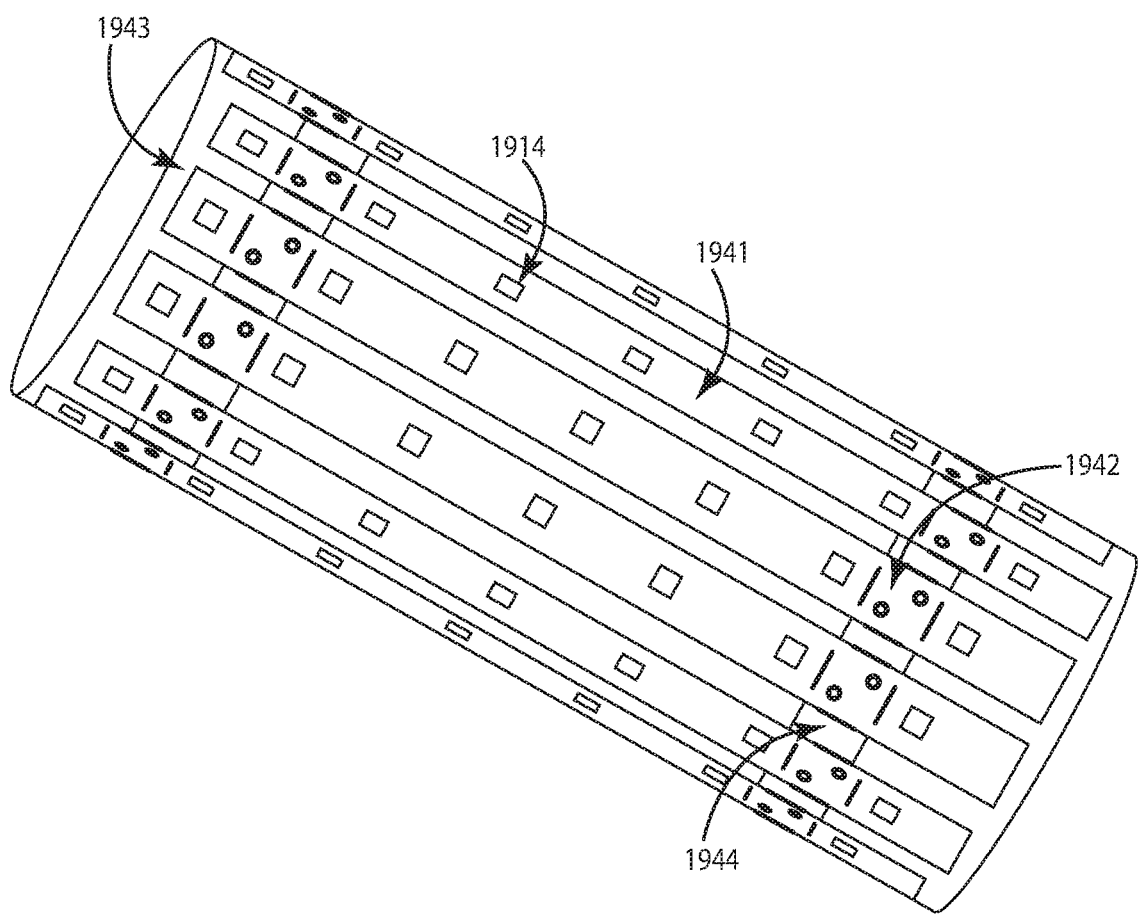
FIG. 30 shows another type of grid array wrapped around a cylindrical heat sink as an embodiment of the present invention.

With reference to FIG. 30, an alternate embodiment of an array is wrapped around a cylindrical drum 1943. In this embodiment, elongated circuit boards 1941 are joined to additional circuit boards 1944 wrapping around the cylinder 1943. The individual boards are joined at connection joints 1942 similar to those already described.

Circuit boards of various shapes and sizes may be joined to create a wide variety of two and three dimensional arrays. The connection designs and methods conceived in the present invention makes it possible to assemble geometries and shapes of circuit board arrays distributing electronic devices and circuits spatially and enable them to be positioned and aimed for optimal effectiveness.

An aspect of the utility of constructing strips and arrays of circuit boards is the ability to shape them to size immediately prior to installation in a chassis or housing. Long strips and large arrays are preferable for shipment and stocking purposes, but it is highly desirable to be able to cut these into smaller strips and arrays fitting the fixtures and devices they are used in. The inventors have conceived a system of marking boards, strips and arrays to indicate safe locations for cutting. Further, the thin circuit board embodiments described above can be easily cut with simple shears or scissors 1937 (or any of a variety of tools or cutting processes).

Figure 31A:
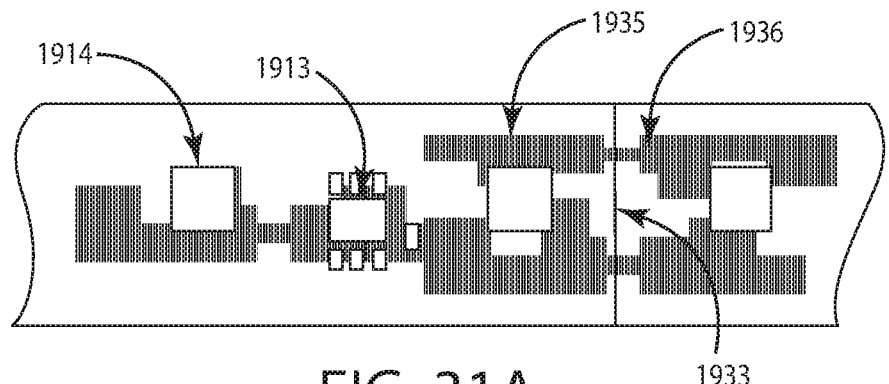
FIG. 31A shows a top view of a board with a cut mark line for board or array separation in an embodiment of the present invention.

With reference to FIG. 31A, a printed line is used to mark a safe location for circuit separation. Conductor patterns 1935 etched into the conductive layers of the circuit boards are used to provide power and interconnect electronic components 1913 such as LEDs 1914. At locations designed in the circuit cut marks 1933, 1934 indicate the safe locations for separating interconnected circuits. In one embodiment, the circuit is continuous through the intended cut location. Signal conductors or traces passing power and optionally control signals will be cut at the same time as the boards or arrays are separated.

In order to minimize conductor damage and to minimize the opportunity for short circuits, circuit traces are narrowed at in the immediate area 1936 of the cut marks 1933. Further, the narrower traces are easier to cut because they offer less mechanical resistance. In one implementation, 2 oz. copper conductors were used with a width of 0.030 inches in the area of cut. Outside of this area conductors are expanded to improve their current carrying and thermal conduction capability. Outside of this area are additional components and conductors which could be damaged and are not intended to be cut or stressed in the cutting process.

It is recognized by the inventors there may not be conductors spanning the cut marks. There may be one or more power conductors, and one or more control signals spanning the locations for cut.

Figure 31B:
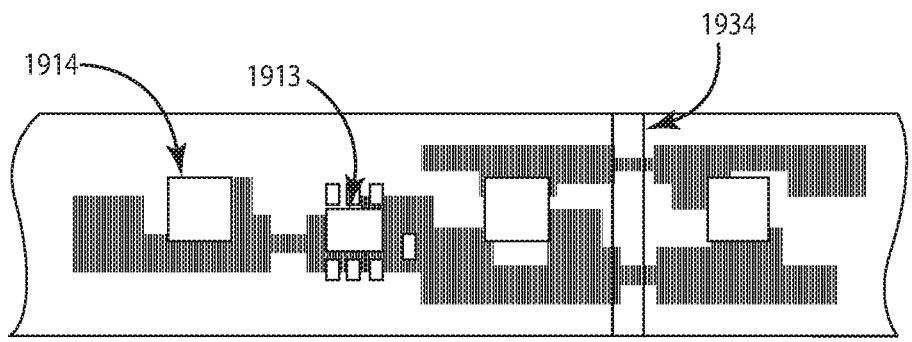
FIG. 31B shows a top view of a board with a double line cut mark for board or array separation in an embodiment of the present invention.
Figure 31C:
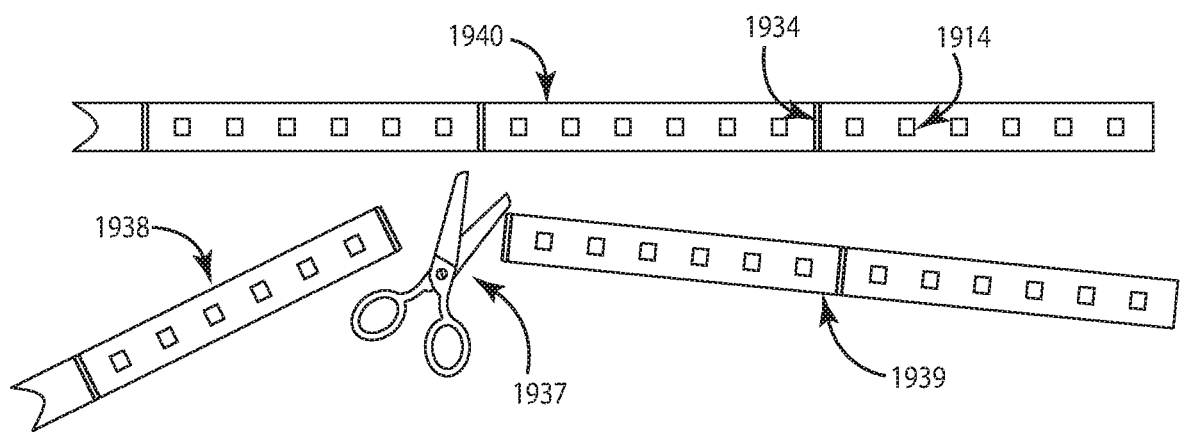
FIG. 31C shows the separation of two arrays of boards at one of the cut marks in an embodiment of the present invention.

With reference to FIG. 31B, a double line cut mark 1934 is shown. The double line cut mark 1934 has the advantage of showing the boundaries of the safe location for cutting the board or array. The inventors recognize other ways for indicating safe cutting area including dotted lines, areas of grey or colored printing, tick marks and hatch marks could be used.

With reference to FIG. 31C, circuit separation utilizing the cut marks is achieved with a simple scissors or shear 1937. A long strip 1940 or array is separated into two parts with one part 1939 being of desired length, size, and shape for final installation, and the second part 1938 either being the residual or another part ready for final installation.

The inventors conceive the cutting of strips or arrays assembled from multiple circuit boards may be conducted before or after the addition of electronic components onto these boards. Further, additional connections and wiring may be needed to complete the assembly. Also, after cutting, the resulting boards, strips, or arrays may again be assembled into other shapes and combinations using the connection designs described above.

It can be advantageous to construct long continuous circuits for use in linear lighting systems or other configurations constructed from linear strip systems. While certain methods can provide for the creation of long linear SSL circuits through manual soldering, these methods do not address how to build long continuous strips utilizing conventional techniques and equipment such as reflow soldering or wave soldering equipment.

While the soldering of individual electronic components onto circuit boards is readily accomplished with reflow or wave soldering equipment, the soldering together of individual or panelized circuit boards to each other using this same equipment and standard techniques is not easily accomplished for a number of reasons.

First, the solder connection of individual or panelized circuit boards to each other using conventional reflow or wave soldering equipment and techniques requires that the boards be held in some fashion throughout the entire soldering processes. The method and apparatus for holding needs to provide for adequate contact between the boards to allow the heated solder to flow and wet between the boards and intended solder pad areas.

The holding method and apparatus must also not interfere with the heating of the boards and solder paste material. Methods or apparatus laid directly on top of board solder joints would tend to interfere with heat flow to the solder joints resulting in incomplete to weak solder joints. Apparatus constructed from materials affected by the liquid solder would tend to interfere with the solder joint or become trapped as part of the joint interfering with the quality of the joint.

The holding method and apparatus also needs to provide adequate alignment of the circuit boards in order to maintain the relative position of solder pads through the entire process. Wave soldering approaches where waves of molten solder are passed over the boards is also particularly challenging for maintaining alignment. Reflow soldering techniques present challenges in alignment as the solder pasted circuit boards moving down a conveyor can be easily knocked out of position if simply laid onto of one another. Apparatus placed directly on top of boards would tend to interfere with heat flow and limit visual inspection of solder joint quality. Heating profiles along the conveyor along with the flow of solder present further challenges as parts move and change shape due to thermal expansion and contraction during heating and cooling through the reflow heating cycle along the conveyor. Parts would also need to be held from movement due to changes in surface tension as solder flux is heated and the liquid solder flows out over the board and throughout the intended solder joint. Solder cooling from liquid to solid in the later stages of the reflow heating cycle would further add force and movement to boards.

It would be further advantageous if the holding method and apparatus did not interfere with visual inspection of solder joints whether manual or automated. Large or opaque clamping apparatus would tend to prevent any visual inspection of the solder joint complicating inspection and quality control. Additionally, it would be advantageous that the holding method be removable so as to not interfere with the end use of the resulting electronic circuit.

Embodiments herein include a method for creating long and long continuous circuit strips utilizing reflow or wave solder processing equipment and techniques. Further included are methods for holding a plurality of circuit boards and an apparatus for holding a plurality of circuit boards together during reflow or wave solder processing for the purpose of constructing reliable and repeatable solder joints between the circuit boards.

In some embodiments a method for creating long and long continuous circuit strips by which a plurality of bottom circuit boards and a plurality of top circuit boards are prepared with solder paste, aligned for connection and held in place with a holding apparatus and processed through reflow or wave soldering process. The method disclosed addresses the connection of populated circuit boards with solder paste and electronic components for soldering, the connection of unpopulated plurality of circuit boards for later population with electronic components through a secondary soldering process and the connection of pre-populated and pre-soldered plurality of circuit boards for soldering of the board-to-board connection only.

In some embodiments a method is included for holding a plurality of circuit boards together that provides for alignment of mating solder locations held in position throughout a reflow or wave soldering process. The embodiment includes a plurality of top circuit boards (a) and plurality of bottom circuit boards (b). Top circuit boards (a) including solder pad features with plated holes through the top board at pad locations allow solder and heat to flow down into the connection both to facilitate solder connection and to enable rapid connection.

The method of holding applies a downward force on top of a prepared joint near the intended solder location point and an opposing downward force on the bottom of a prepared joint directly below the intended solder location. The forces are separated by a short distance and result in a moment force at the prepared solder joint connection. The applied forces and resulting moment force create sufficient friction force between the top and bottom circuit boards to resist movement due to lateral or longitudinal forces typical in reflow or wave soldering and are therefore sufficient to maintain alignment of the top board and bottom board pad locations throughout the process.

Some embodiments herein are directed to an apparatus for holding a plurality of circuit boards together to provide for alignment of mating solder locations held in position throughout a reflow or wave soldering process. The apparatus in some embodiments is in the form of a circuit board clamp. The circuit board clamp can include a fastener, such as a u-shaped fastener, to apply pressure to a plurality of top circuit boards and bottom circuit boards. The circuit board clamp can also include a spring tension arm connected to the u-shaped fastener. In addition, an attachment mechanism can be connected to the spring tension arm on the opposite end from the fastener. The attachment mechanism can serve to provide attachment to the lower circuit boards. In some embodiments, the attachment mechanism is a hook. The spring tension arm can provide spring force between the fastener end and the attachment mechanism.

In some embodiments, a method for creating long and long continuous circuit strips utilizing reflow or wave solder processing equipment and techniques is included. Further included are methods for holding a plurality of circuit boards and an apparatus for holding a plurality of circuit boards together during reflow or wave solder processing for the purpose of constructing reliable and repeatable solder joints between the circuit boards.

Figure 32:
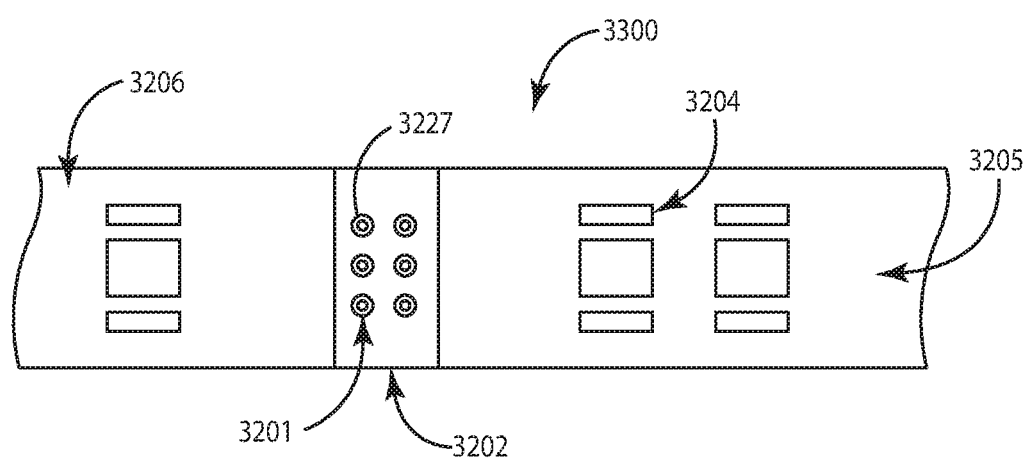
FIG. 32 is a schematic top view of two circuit boards connected with connector in accordance with various embodiments herein.

With reference to FIG. 32, a schematic top view of two circuit boards connected with a connector in an embodiment is shown. Circuit boards 3205 and 3206 are shown joined with connector board 3202 to create LED circuit 3300. While the embodiment shown in FIG. 32 is directed towards flexible lighting circuit boards and more directly towards flexible LED circuit boards, it will be appreciated that the scope of embodiments herein are not limited to flexible lighting circuit boards and can include many different types of circuit boards.

While connector board 3202 is shown coupling the top surfaces of circuit boards 3205 and 3206 it is fully contemplated connector board 3202 could be coupled between circuit boards 3205 and 3206 in most any fashion including on the bottom surface of circuit boards 3205 and 3206 and overlapping between a top surface and a bottom surface. Circuit boards 3205 and 3206 are shown with component pads 3204 for receiving LEDs or other components. Connector board 3202 has plated through holes 3201 disposed in conductive metal pads 3227. Plated through holes 3201 allow solder to flow through to connect circuit boards 3205 and 3206 as will be discussed in more detail below.

Figure 33:
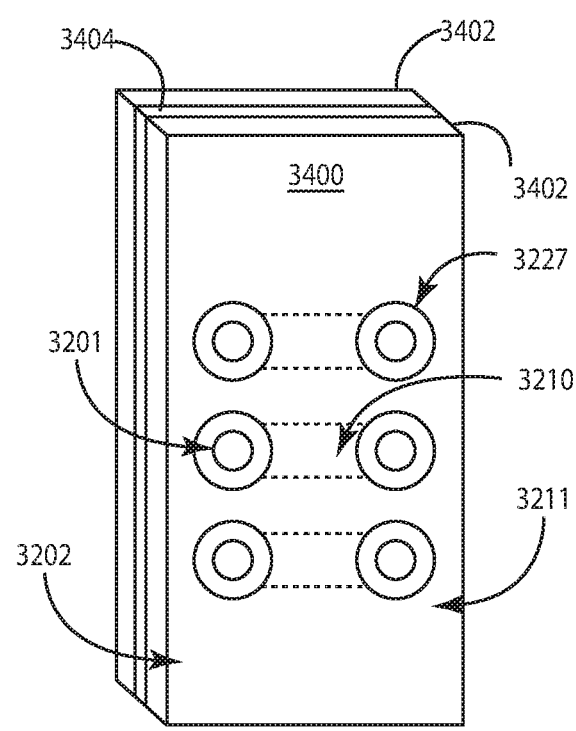
FIG. 33 is a schematic top view of a top profile view of a connector board in accordance with various embodiments herein.

With reference to FIG. 33, a top profile view of a connector board in an embodiment is shown. Connector board 3202 consists of a thin circuit board 3400 comprised of two electrically conductive layers 3402 with a thin electrical isolating material 3404 sandwiched in between. In some embodiments, the conductive layers can be made of a conductive metal in various thicknesses. By way of example, in some embodiments, the conductive layers can be made of copper. In a particular embodiment, the electrically conductive layers are 2 oz. copper. It will be appreciated that many different materials can be used for the electrical isolating material. Such materials can have various thicknesses. In some embodiments, the electrical isolating material can be fiberglass. In a particular embodiment the electrical isolating material is 0.012 inch thick fiberglass composite material.

Circuit paths 3210 of various designs can be etched into the top and/or bottom conductive layers to produce the circuit conductive paths. Plated through holes 3201 can be added at metal pads 3227 and plated through with conductive metal to form a connection between top and bottom. Thin layers of non-conductive solder repelling material 3211 (solder masks) can be added to the top and bottom of the board to restrict the movement of solder and protect the circuit paths from the pads.

Figure 34:
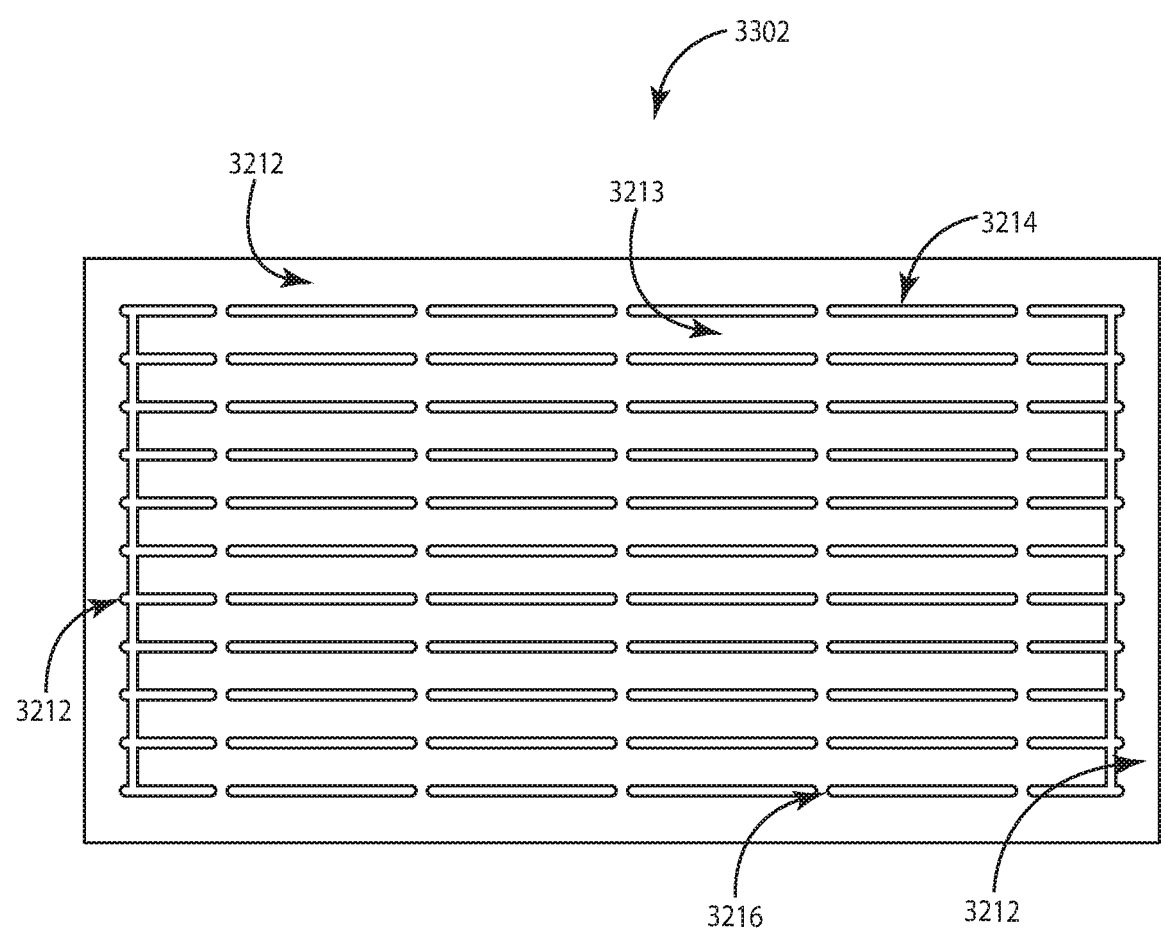
FIG. 34 is a schematic top profile view of an outline of routed panel ready for component assembly and cutting in accordance with various embodiments herein.

With reference to FIG. 34, a top profile view of an outline of a routed panel ready for component assembly and cutting in an embodiment is shown. Panels 3302 of thin, flexible printed circuit boards can be fabricated and routed so there is some amount of material 3212 remaining to keep multiple parallel boards 3213 in a parallel array. The material 3212 outside of the circuit board array further stiffens panel 3302 and may contain alignment marks or tooling holes for mechanical handling and alignment. Tabs 3216 in a repeating pattern can be used to hold circuit boards 3213 together.

Routed slits 3214 between tabs 3216 can be used to maintain mechanical alignment during assembly.

Panels 3302 can be configured to allow them to be cut with a conventional shear, scissors, or other cutting device at any of several locations enabling later trimming to length or separation. It is fully contemplated panels 3302 could be laser cut as well to obtain circuit boards 3205 and 3206. Circuit boards 3205 and 3206 can be part of panels 3302 as indicated by circuit board location 3213. Electrical components, including LED emitters and optionally thin board connectors can be assembled onto panels 3302 by conventional methods of electronic solder assembly. In some embodiments, the connector pad geometry can be incorporated into the board design so an additional connector board is not required, rather circuit boards 3205 and 3206 can be directly fastened together.

Figure 35:
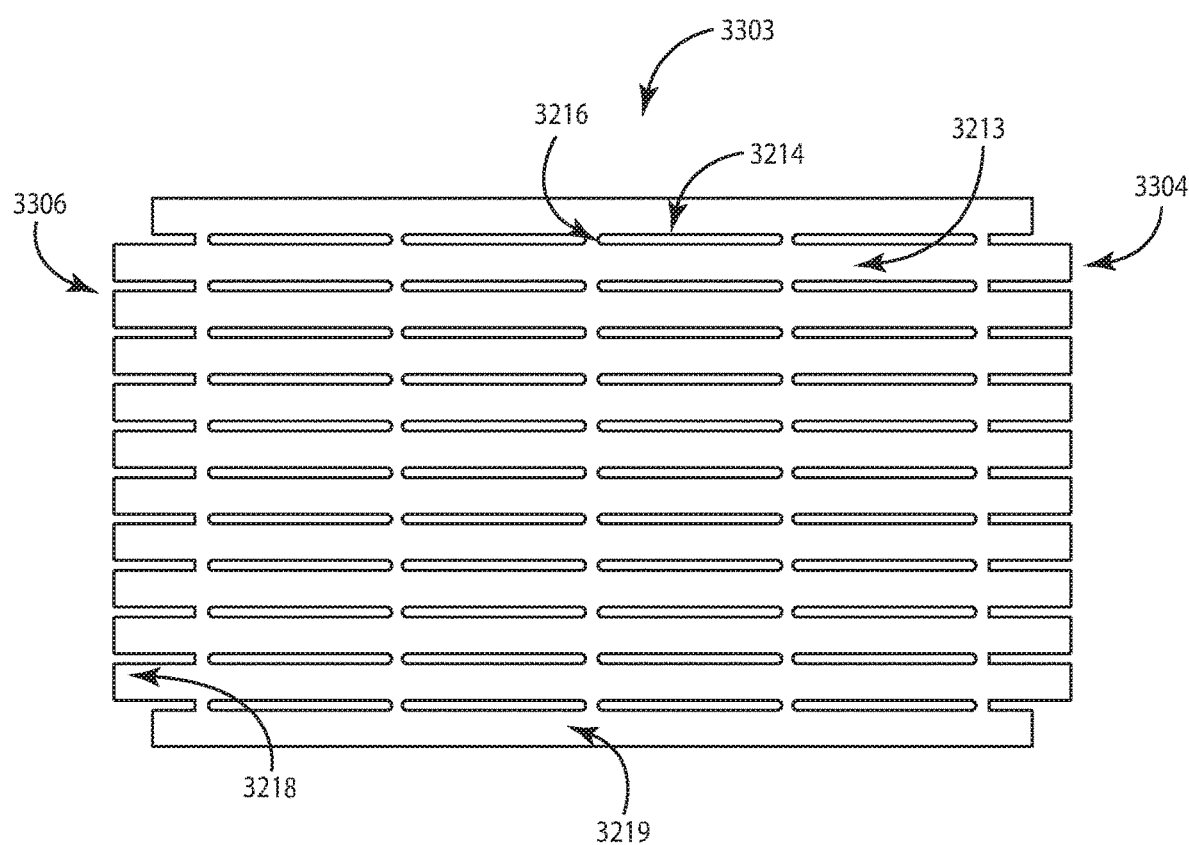
FIG. 35 is a schematic top profile view of a panel outline with ends sheared off to expose boards in accordance with various embodiments herein.

With reference to FIG. 35, a top profile view of a panel outline with ends sheared off to expose boards is shown in accordance with an embodiment. As shown, sheared panel 3303 frees up one or both ends 3306 and 3304 of each printed circuit board 3213. In some embodiments, this can be done during the original panel fabrication. In some embodiments, a portion of the frame 3219 may be retained to add stiffness to the assembly and may contain alignment marks and tooling holes used to maintain mechanical alignment during assembly.

Figure 36:
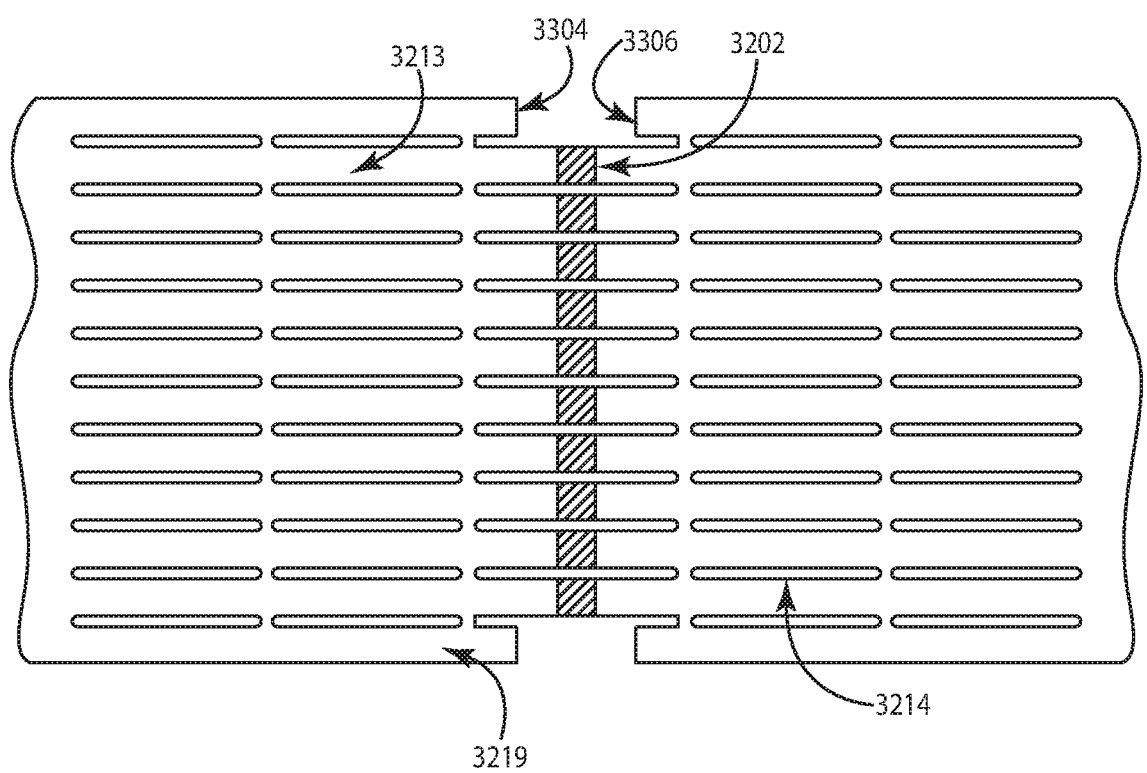
FIG. 36 is a schematic top profile view of panels joined by connectors in accordance with various embodiments herein.

With reference to FIG. 36, a top profile view of panels joined by connectors in an embodiment is shown. A free end 3304 of one panel can be butted against a free end 3306 of the other so several circuit boards can be joined by soldering or welding, thus forming a longer assembly with the same characteristic of parallel strips. Depending on desired length, the process can be repeated by adding additional panels 3303 to an elongated panel made up of multiple panels 3303. After the desired length is attained, the strips can be separated by shearing any remaining connecting material. As the long strips are joined, lined thermal adhesive tape 3228 (FIG. 39) can be affixed to the bottom of the strips in a continuous action. The exposed liner (not shown) can be later removed during application of the joined strips to a fixture or permanent mount. The addition of thermal adhesive tape 3228 can occur just before or after panels 3303 are joined together. The resulting elongated strips can then be wound onto large diameter reels so they can be easily protected, transported, and stored; ready for final assembly onto heat sinks or light fixtures. As an alternative, the strips can be short enough to be packaged and shipped in flat form.

Figure 37:
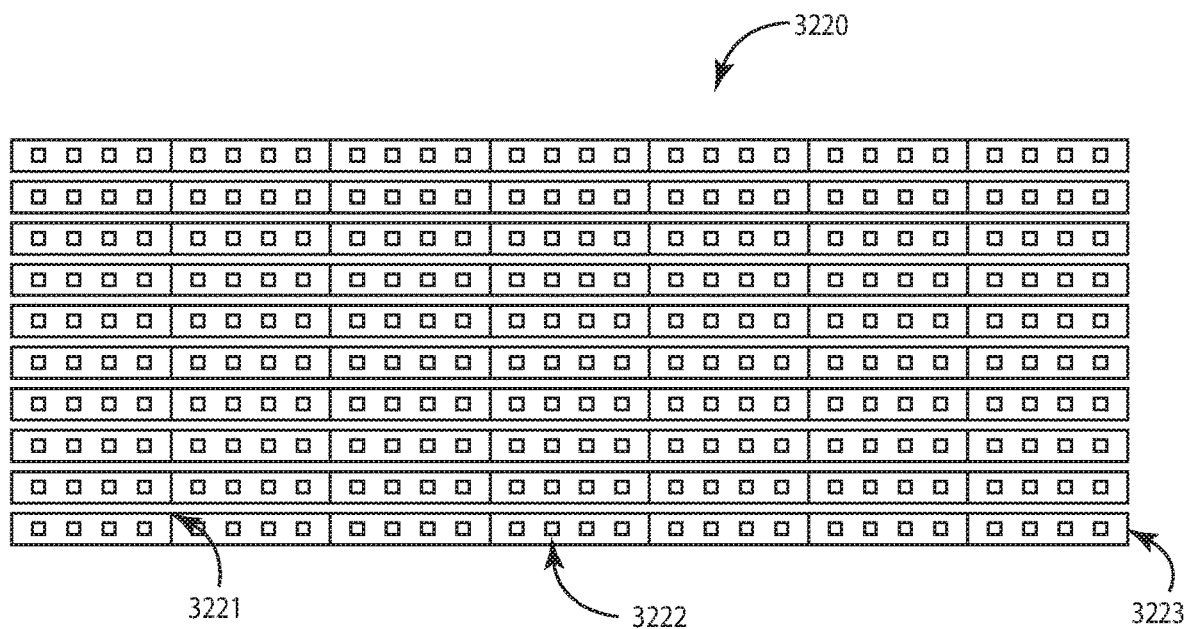
FIG. 37 is a schematic top profile view of circuit strips after separation in accordance with various embodiments herein.

With reference to FIG. 37, a top profile view of circuit strips after separation in an embodiment is shown. As shown, circuit strips 3220 can be separated from panels 3303. Connection point 3221 connecting two or more circuit strips can be a connector 3202 as discussed above or an overlap joint discussed in more detail below. LEDs 3222 or other components can be adhered or placed on circuit strips 3220 and circuit strips 3220 can terminate at ends 3223.

Figure 38:
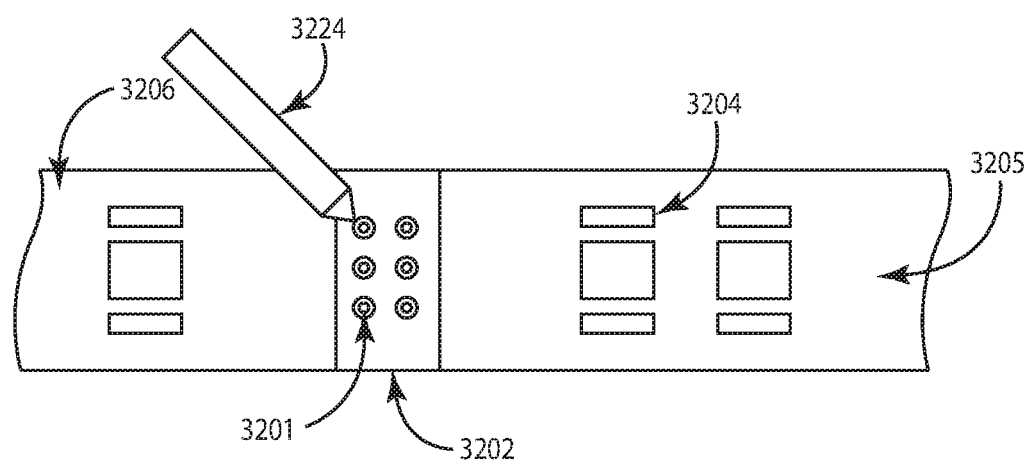
FIG. 38 is a schematic top profile view of soldering of connector joint in accordance with various embodiments herein.

With reference to FIG. 38, a top profile view of soldering of a connector joint in an embodiment is shown. Connector board 3202 can be flexible enough to conform to normal variations of board thickness, solder height and mechanical mounting height differences. In an embodiment, connector board 3202 is shown to bend with a radius 3242 of down to 1 inch (see FIG. 45). The connector board 3202 can allow heat and solder to easily flow through connector board 3202 from top to bottom as heat is applied. Solder may be introduced into through hole 3201 at the top of connector board 3202. Alternatively solder may be in paste or hard form deposited on receiving printed circuit board 3205 or 3206, in which case solder will flow from bottom to top.

Electrically insulating layer 3404 within the thin board is thin enough to both enable a high degree of thermal conductivity and is able to maintain high levels of electrical breakdown isolation. Electrical isolation between circuits is helpful to the general function of the connector; however, the amount of isolation may be changed to conform to the application requirements.

The material chosen for the electrical insulating layer can enhance thermal conductivity. In one embodiment the electrically insulating layer was chosen as a high temperature variant of FR4 fiberglass with a glass transition temperature of 170° C., although this is just one example and many other materials can be used. A higher than normal temperature rating of the material can be used to gain more thermal margin allowing for the very rapid heating (and probable overheating during manual assembly) of the thin boards due to their low thermal mass. Even higher temperature materials can be used in the case higher melting temperature solders are to be used. In some embodiments, the insulating layer is both durable at high temperatures and as highly thermally conductive as possible for this construction. Thermal conductivity can be helpful for the cases of solder iron or point heat source assembly because it aides in rapid transfer of heat from the top side of the connector to the joints below.

Thin connector 3202 board can add flexibility to connection 3221, reducing stress at the solder joint associated with the use of rigid pins and other types of connectors. This is helpful to prevent tearing of the printed circuit board pads on the board when bending stresses are introduced. In one implementation, connector boards 3202 can be used to form a continuous strip of boards which is then rolled into reel form. The bend radius 3242 of this implementation can be 6 inches or greater.

Thin board substrate materials and thicknesses can be selected to handle solder melt temperatures without delamination or damage. Alternate choices for board insulating material can include materials such as THERMAGON™ thermally conductive materials in cases where higher temperature resilience and higher thermal conductivity are needed. An embodiment was developed for use with lower temperature solders (leaded). Copper pads 3231 can be on the bottom side of the connector or upper board and can be designed to match the pads 3233 of the receiving board—in spacing, in area, in thermal characteristics.

Figure 39:
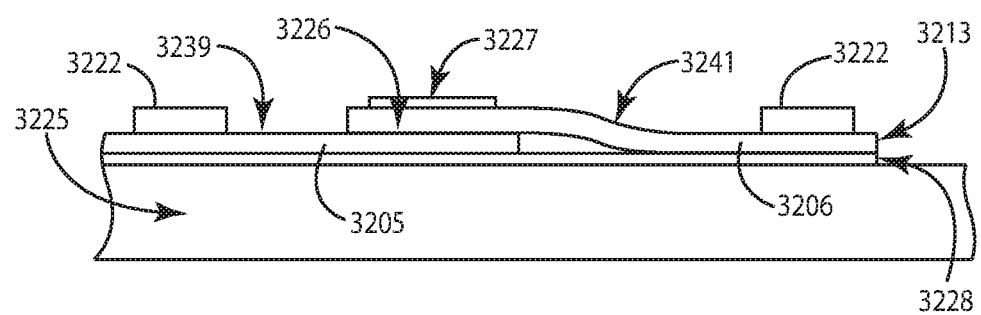
FIG. 39 is a schematic side profile view of an overlapping joint between boards in accordance with an alternate embodiment herein.
Figure 42A:
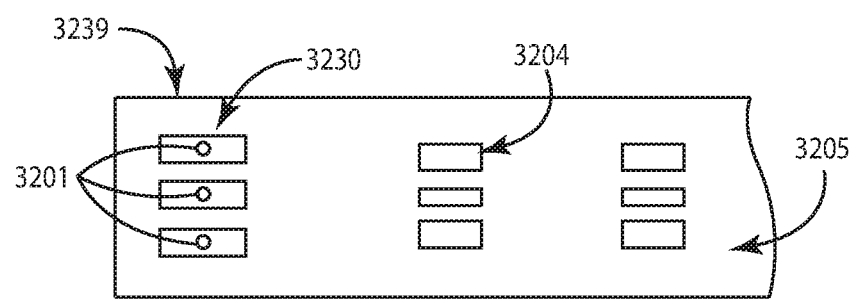
FIG. 42A is a schematic top view of top board pads and holes in accordance with various embodiments herein.
Figure 42B:
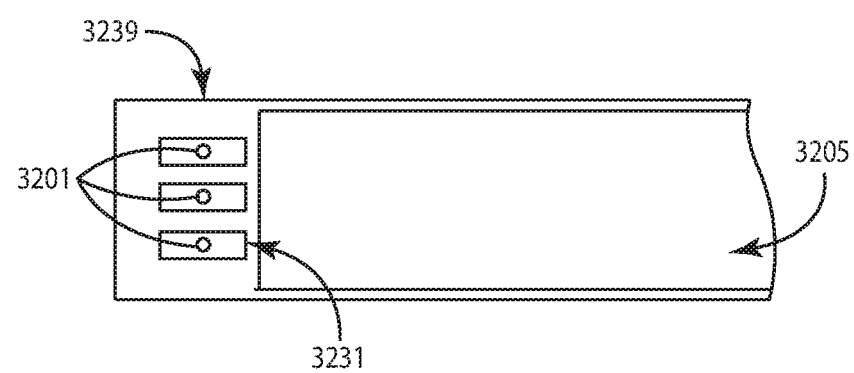
FIG. 42B is a schematic bottom view of top board pads and holes in accordance with various embodiments herein.
Figure 43:
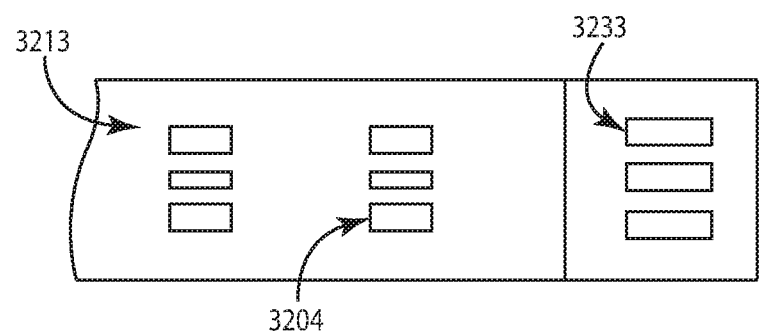
FIG. 43 is a schematic top view of bottom board receiving pad geometry in accordance with various embodiments herein.
Figure 44A:
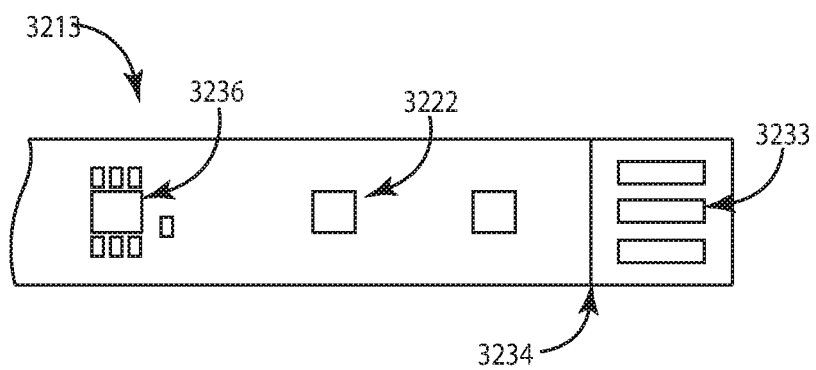
FIG. 44A is a schematic top view of an assembled board prior to joining in accordance with various embodiments herein.
Figure 44B:
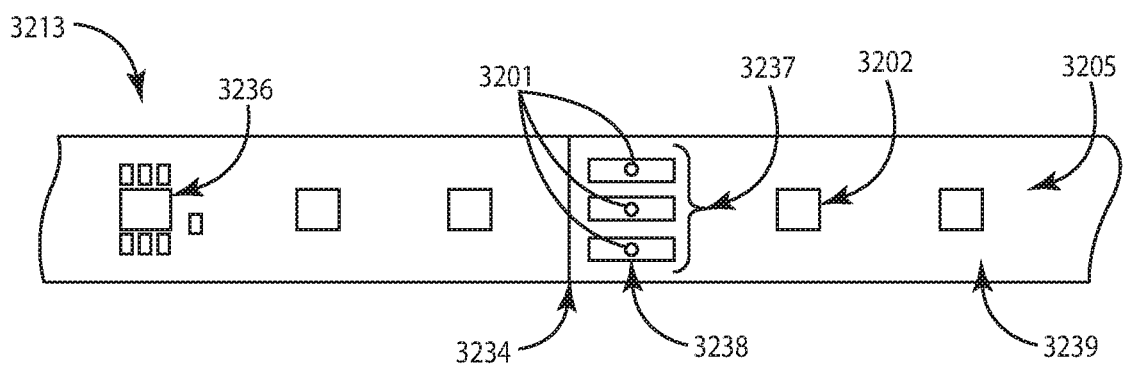
FIG. 44B is a schematic top view of joined boards in accordance with various embodiments herein.

With reference to FIG. 39, a side profile view of an overlapping joint between boards in an alternate embodiment is shown. In the embodiment of FIG. 39 no connector board 3202 is used to connect circuit boards 3205 and 3206. The bottom side of an end of circuit board 3206 is directly connected to the top side of an end of circuit board 3205. Conductive metal pads 3227 can be on the top side to receive heat (such as from a soldering iron 3224, shown in FIG. 38) and provide a path for conduction through the electrically insulating substrate and/or a plated through hole 3201 to conductive metal pads 3233 (shown for example in FIG. 43) on the bottom. The size of pads 3230, 3231 and 3233 (FIGS. 42A, 42B and 43) factor into both the quality of the connection and the mechanical stress the connection can sustain. In some embodiments, by embedding or closely connecting through holes 3201 to pads 3231, 3238, the mechanical performance can be improved. The metal plating and solder fill through hole 3201 links top side pads 3227 to bottom side pads 3233 making the bottom side very difficult to pull off (delaminate) from the insulating layer. Through holes can be of various sizes. In some embodiments, the through holes can be about 0.036 inches in diameter to promote heat transfer, conduct solder and add enough structure to strengthen the joint. Lapped joints add strength by adding additional contact area, by reducing leverage, and by changing certain forces from shearing and tensile to compressive.

The interconnect aspect of FIG. 39 allows for the coupling of circuit boards without a connector board or any other device between them. Thus circuit boards 3205 and 3206 can be created with ends 3304 and 3306 which have pads 3230, 3231 and 3233 with though holes 3201 to allow coupling of the circuit boards.

Copper conductors can be used for connecting pads 3227 to be mated to circuit path 3210. Circuit path 3210 can be printed in almost any pattern, such as those commonly used in circuit boards and can be patterned to receive electronic components such as LEDs 3222, integrated circuits 3236, or other electronic components. In some embodiments, the copper conductors can be very thick and wide to accommodate high currents. In a particular embodiment 2 oz. copper was used with a conductor width of 0.040 inch to enable a low voltage drop across the connector when carrying up to 3205 amps of current.

Copper foils are designed to maintain gap distances between connections for electrical isolation. In an embodiment, voltage isolations of up to 500 V were maintained by maintaining a distance of 0.025 inches between copper foils. By increasing the spacing, substantially higher isolations can be achieved. Copper conductors can be run on top of or under the connector insulating substrate, depending on requirements for isolation, current carrying capacity and protection. Connections and conductors are protected from damage or shorting by being covered by the connector body or overlapping joint 3226.

Connections and conductors can be further protected from moisture by the simple addition of an under fill layer of potting material or an encapsulent or an overcoat of potting material 3229 or encapsulent. Potting compounds or conformal coatings are commonly used in the industry to provide this type of protection. This type of connector is particularly suitable for these coatings because it is essentially flat with no recesses or areas which must be protected from contact with the coatings.

Plated through holes 3201 located at pad positions 3227, 3230 and 3231 through connector board 3202 allow solder and heat to flow down into the connection both to facilitate solder connection and to enable rapid connection. The rate of heat transfer being increased by this structure has the additional benefit of speeding up solder melting and cooling both during manual soldering and reflow processing. This can save time and result in better, more repeatable and stronger joints.

A number of experiments were conducted to determine solder wetting and flow paths for various pad geometries using the thin connectors in surface mount applications. After it is melted, solder tends to wet to the metal pads 3230 and exposed conductors of printed circuit boards 3205 and 3206. It moves by capillary action to actively fill small gaps and spaces between pads 3231 and 3233, particularly pads in flat surface-to-surface contact. The high degree of adhesion and capillary action exhibited by solder, combined with the mechanical weight of the thin board connector caused pads of connector board 3202 and circuit boards 3205 and 3206 to pull together pushing remaining solder outward between pads 3231 and 3233. If solder was applied in exactly the correct amount, the solder would simply fill the joints. But even in small excess, the solder would press outside of the pad areas promoting shorts and lower electrical isolation. Holes, recesses or pockets between the pads were tried and did take up the excess solder. However, the approach was to design in plated holes 3201 within the area of the pads taking up the solder through capillary action, effectively pulling excesses into rather than out of the joint. In a particular embodiment, the holes were approximately 50% of the diameter of the pad, giving ample room for significant variances in solder application. Though it will be appreciated that other hole size to pad diameter ratios can be used.

In some embodiments, plated holes 3201 can be used as receptacles for solder paste so connectors 3202 could be ready for joining by heat alone. Once aligned to printed circuit boards 3205 and 3206, connector 3202 (or selectively its pads) can be heated to cause the solder to begin melting for example using a soldering iron 3224. By capillary action and wetting, the solder quickly flows down into the space between connector 3202 and board pads completing the joint. Flux and activating resins, which are commonly incorporated into solder paste, are needed for high quality solder joints. In one embodiment, the same plated through holes 3201 used to store solder prior to thermal joining absorb excess solder. Further, the holes can be filled with either solder paste or separated layers of hard solder and flux resin. In one embodiment, solder wire with a core of flux resin can be press fit in holes 3201 and sheared to match the connector bottom surface 3226. It was experimentally determined that this was another effective way of putting solder and flux into plated holes 3201. Sealing of solder paste in holes 3201 at pad positions 3227 and 3226 can be helpful so paste remains fresh for later use. Sealing can include a thin solder layer, a thin flux layer or a thin plastic or metallic peel off material.

As part of the printed circuit board fabrication process, mask coatings 3211 can be placed over the top and the bottom of the connector board (open at the pads), reducing the opportunity for solder shorts and improving the appearance of the connector or overlapping joint. In some embodiments, the mask coating can be chosen to match the color and characteristics of the boards being jointed so to minimize the visibility of connector board 3202. Connector board 3202 can be implemented without mask coatings on the top surface as this is less critical to the solder flow protection function.

Connector boards 3202 can be easily mechanically formed for vertical step offsets 3241. In experiments run on these connectors 3202, bends up to a right angle could be performed with the conductors (or any foils crossing the bend) on the inside radius of the bend.

Connector boards 3202 can incorporate other circuits, including pads and geometries for wire or other conventional types of connectors, as well as being able to incorporate terminations and active circuitry. Connector board 3202 is particularly well suited because of its highly thermally conductive structure for power and heat creating circuits. In one implementation, the circuitry included a high current driver (One Semiconductor #NUD4001 operating at 3224 VDC) along with an LED string added to the top side of the board. Both the top (FIG. 42*a*) and bottom side (FIG. 42*b*) of the board were designed with large metal (such as copper) pads 3230 and 3231 that could translate heat through the thin insulating material by effectively creating a large area for heat transfer from the top copper layer through the less thermally conductive insulating layer and to the bottom copper layer. Further, a thermally conductive adhesive tape 3228 (e.g., 3M product #8810) can be applied to the back side. The assembly can then be adhered to a heat sink 3225. The resulting structure was found to maintain excellent heat transfer to the heat sink, which is particularly important in high brightness LED applications.

Because this connector can be easily fabricated in many shapes, it can be used for connection between boards directly abutted (FIG. 36) or some distance apart. Also, since the conductors can be on either top or bottom, or embedded in a center layer, electrical isolation from neighboring structures can be high and possible shorting points can be readily avoided. Connector boards 3202 are stackable and can be soldered one to another.

In cases where additional mechanical support is needed, the connector can extend well beyond the pad providing maximum overlap. It may be necessary to shape the connector or have it fabricated with clearance holes if components on the underlying board may interfere. Connector board 3202 can be fabricated with additional pads and holes (not connected to the circuits) to give additional strain relief. Pad geometries may match existing pinned connectors to allow the option to alternate use of a pinned connector or thin board connector. Thin connector boards may be used to join circuit boards into strips 3220 or matrixes with multiple connectors or connections 3221 in each assembled length (See FIG. 37).

Figure 40:
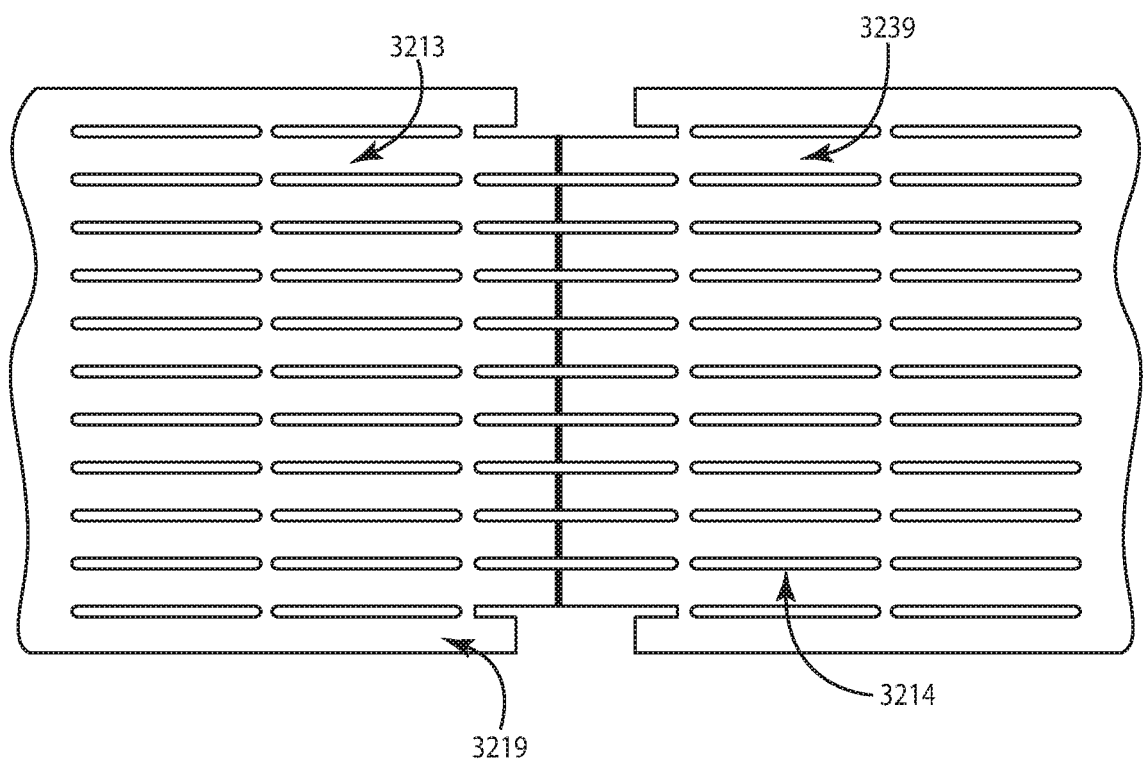
FIG. 40 is a schematic top profile view of panels joined by overlapping joints in accordance with various embodiments herein.

Thin connector boards can be overlapped for interconnection (See FIG. 39). This is very useful if the connector board contains active circuitry and it is beneficial to connect multiple boards, such as in the fabrication of a continuous strip of boards (See, e.g., FIG. 37). The thin connector boards can be highly advantageous to the assembly of strips consisting of multiple circuit boards (See FIG. 40). In a practical application, they can be used to make long circuit board strips of solid state lighting circuits (e.g., high power LED emitters used as the individual light sources), amongst other applications.

Thin circuit board 3213 can include a thin, low thermal mass substrate base material comprised of two electrically conductive layers with a thin, electrically isolating material sandwiched in between. In some embodiments, the conductive layers can be made of a conductive metal in various thicknesses. By way of example, in some embodiments, the conductive layers can be made of copper. In a particular embodiment, the electrically conductive layers are 2 oz. copper. It will be appreciated that many different materials can be used for the electrical isolating material. Such materials can have various thicknesses. In some embodiments, the electrical isolating material can be fiberglass. In a particular embodiment the electrical isolating material is 0.012 inch thick fiberglass composite material. Circuit patterns of various designs can be etched into the top and bottom conductive layers to produce the circuit conductive paths. Holes can be added at the pad locations and plated through with conductive metal to form a connection between top and bottom. Additional thin layers of non-conductive, solder repelling material (solder masks) can be added to the top and bottom of the board to restrict the movement of solder and protect the circuit paths away from the pads.

Angled or other geometric patterns in the pad and copper conductors can be included and can support connections for offset or angled printed circuit boards. Multiple pad sets and associated conductor connections can be included and can allow for splitting of conduction paths.

Figure 45:
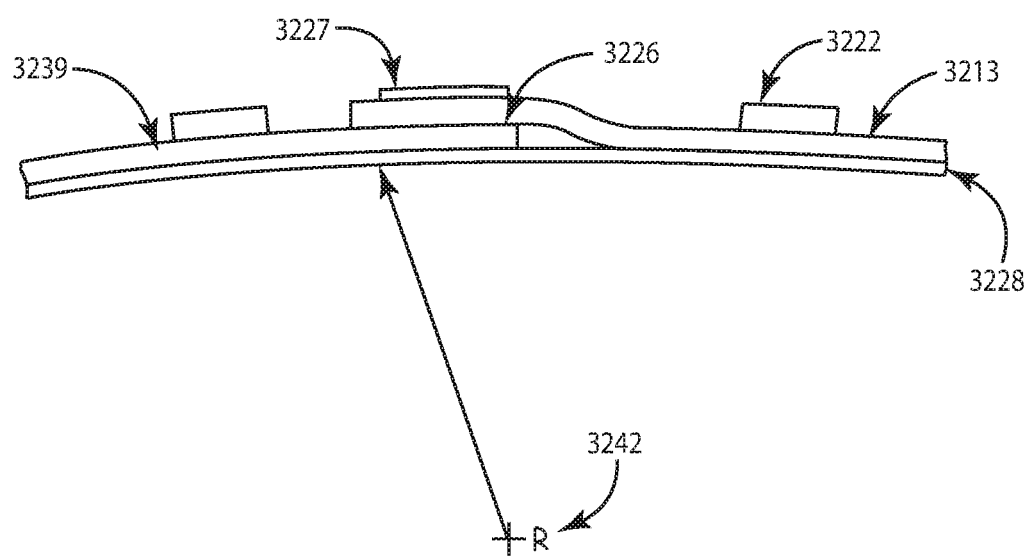
FIG. 45 is a schematic side view of a joint assembly of a flexible strip with curvature in accordance with various embodiments herein.

The thin circuit board as described can be flexible enough to conform to normal variations of board thickness, solder height, and mechanical mounting height differences (See FIG. 45). Goals for high reliability connections include robustness, both in mechanical strength and in integrity of the electrical connection. By increasing the number of pads 3230, 3231 and 3233 used in the connector, mechanical strength was increased. Simple multiplication of the number of contacts added to the strength by spreading stress across the added contacts. Redundant parallel contacts reduce electrical resistance and add to the general integrity of electrical connection.

Intimate contact between metal pads with minimal fill layer of solder increases joint 3226 strength. A thick layer of solder decreases strength but adds some flexibility to the joint. Solder generally has a much lower tensile and shear strength than the conductors it joins. Further, it tends to have a course crystalline structure and is susceptible to fracturing. However, a thin layer of solder between copper pads (used the pad material) is much less susceptible to fracturing both because of smaller (or incomplete) crystal formation, and because stresses are transferred locally to the stronger copper, instead of into the solder itself.

Increasing the size of the pads 3231 and 3233 increases the strength both because of the larger solder contact area, but also because of the larger areas of contact and adhesion between pad and insulating substrate. In multiple trials, larger pads consistently increased the strength as measured in pull tests and in bending tests. Larger areas of conductor surrounding exposed, soldered pad apertures increase the strength both by offering more area for adhesion between the conductor and the insulating substrate, but also because they add to the conductor structure.

Increasing the distance across a set of pads 3237 or span increases the joint strength against shear and rotational forces and torques. Shear and rotational forces (torques) are common highest during handling of the joined boards. Of particular use, the assembly of multiple boards into long strips presents the opportunity to put very high torques on the joint connection because of the length and spring tension arm advantage. Preventing damage due to rotational forces is helpful to having reliable joints when the strips are packaged and used in their multiple forms including strips and continuous reeled lengths.

By increasing the distance of the pads from the overlapping edges of the board, the inventors have found a decreased leverage on the individual connections by converting stresses into surface pressures away from the joint. By increasing the number of through holes 3201 leading from top surface to the pads below, an increase in the strength is discovered by adding more copper cylindrical connections and rivet like columns of solder fill linking top to bottom. Increased number of holes also increases the probability of having a better percentage of solder fill between the boards. The choice of solder type and composition has a direct impact on joint strength. Lead baring solders have lower tensile strength then their lead free counterparts. Higher tensile strength increases the fracture strength of the connection.

Figure 41:
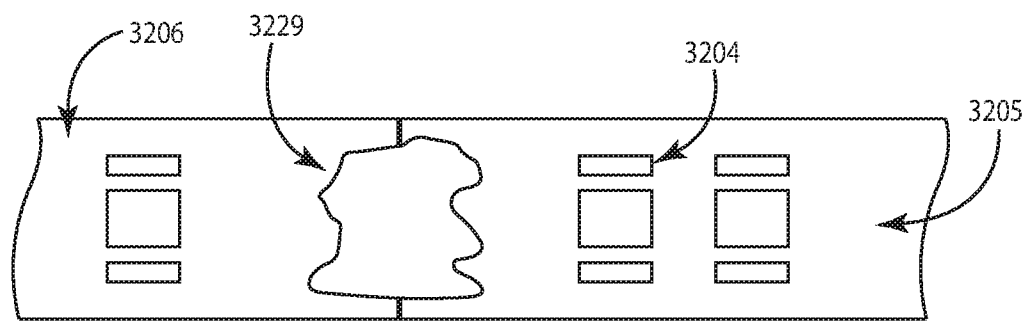
FIG. 41 is a schematic top profile view of potting material used to strengthen and protect connection joints in accordance with various embodiments herein.

The application of tape or adhesive 3228, across the bottom side of joint 3226, can further increase joint strength for handling. Viscous tapes act as a spring and dampener to certain stresses, moving forces away from the joint. The application of potting material 3229 or other adhesives or coatings of structure adds additional strength to joint 3226 as well as protection from mechanical damage and/or moisture (See FIG. 41).

In the areas of board overlap, excluding the conductive pad locations, adhesive applied between top and bottom board can be added to increase joint strength. Thin board connectors 3202 or thin circuit boards 3213 and 3239 with overlapping joints 3226 can be used to construct elongated strips of multiple circuit boards 3220. Mass parallel construction of long circuit board strips carrying high intensity LEDs for SSL applications has been demonstrated using these connection types.

Figure 46:
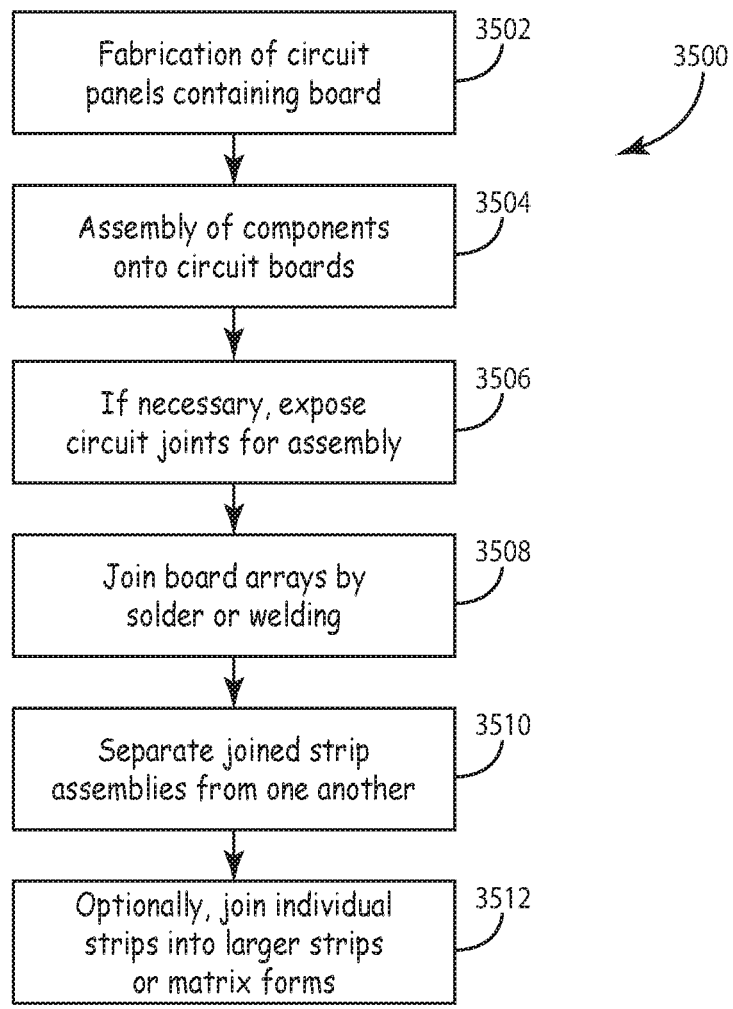
FIG. 46 is a process flow diagram for construction of multi-board assemblies in strip or matrix form in accordance with various embodiments herein.

With reference to FIG. 46, a process flow diagram for construction of multi-board assemblies in strip or matrix form in an embodiment is shown. Process 3500 starts at state 3502 where circuit panels 3302 are fabricated as discussed in detail above. At state 3504 components, such as LEDs are coupled to circuit boards 3205 and 3206, which are developed from panel 3302. If necessary, circuit joints 3218 are exposed for assembly at state 3506. At state 3508 board panels or arrays are joined by solder or welding. At state 3510 strip assemblies within the board panels or arrays are separated from each other. At state 3512 individual strips can be joined into longer strips or matrix (including, for example, some boards arranged perpendicularly to one another) forms.

In some embodiments a method is included for creating long continuous circuit strips in which a plurality of bottom circuit boards and a plurality of top circuit boards are mechanically and electrically connected together by way of a soldered lap joint connection. The soldered lap joint connection results from the processing of the bottom and top plurality of circuit boards through conventional reflow soldering or wave soldering processes.

Figure 47:
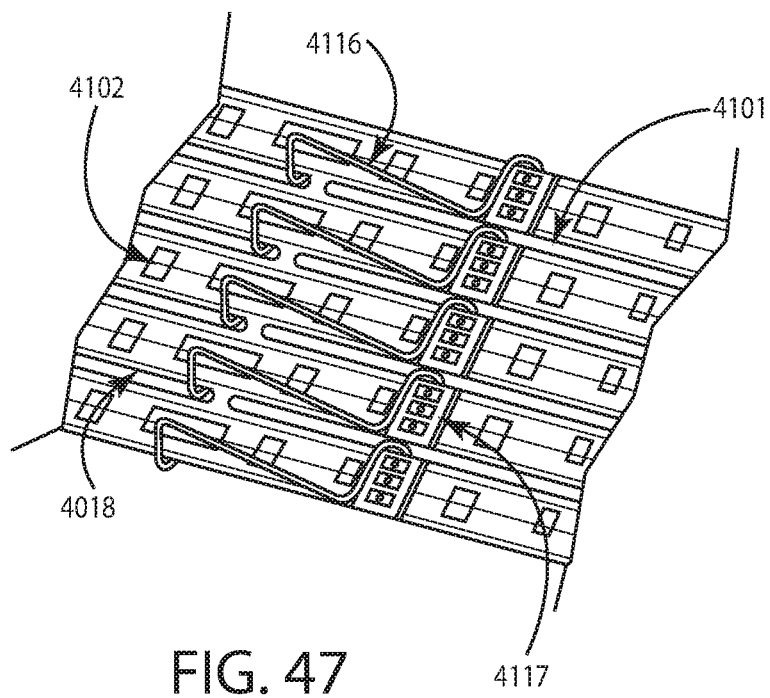
FIG. 47 is a schematic top view of a plurality of circuit boards with holding apparatus in accordance with various embodiments herein.

In reference to FIG. 47, the plurality of bottom circuit boards 4101 and a plurality of top circuit boards 4102 are aligned for connection with a prepared lap joint 4117 and held in place with a circuit board clamp 4116 and processed through either conventional reflow or wave soldering processes. The method disclosed addresses the connection of populated circuit boards with solder paste and electronic components for soldering, the connection of unpopulated plurality of circuit boards for later population with electronic components through a secondary soldering process and the connection of pre-populated and pre-soldered plurality of circuit boards for soldering of the board-to-board connection only.

In some embodiments a method is included for holding a plurality of circuit boards together that provides for alignment of mating solder pads held in position throughout a reflow or wave soldering process. In reference to FIG. 47, a plurality of bottom circuit boards 4101 can be placed onto a conveyor belt or table for advancing the boards into the reflow solder oven. A second plurality of top circuit boards 4102 can is placed on top of the first plurality of circuit boards 4101 with some area of overlap. The placement of the circuit boards is done with care to align the plurality of solder pad features of the top circuit boards 4102 with the bottom circuit boards 4101 to create a prepared joint 4117.

Figure 48:
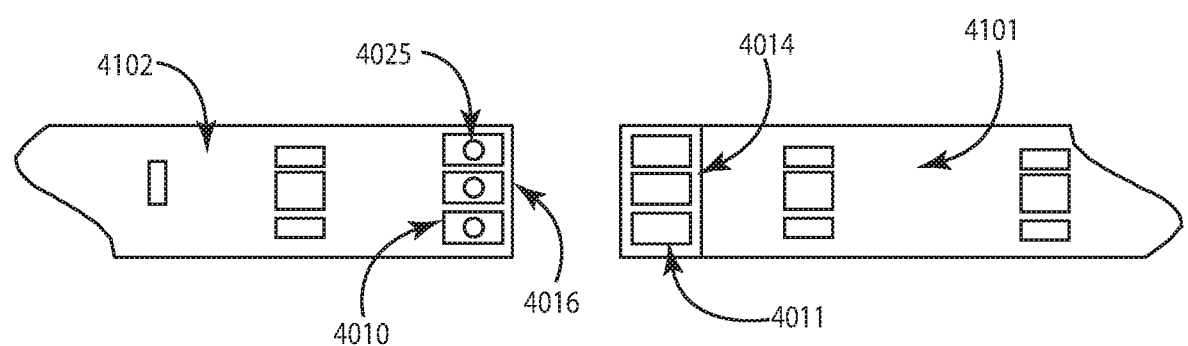
FIG. 48 is a schematic view of two circuit boards with solder pad and plated hole features in the top circuit board and with mating solder pad features on the bottom circuit board in accordance with various embodiments herein.

Referring now to FIG. 48, the alignment of the top and bottom plurality of circuit boards is such that the solder pads 4010 on the top plurality of circuit boards 4102 are aligned with the receiving solder pad 4011 on the bottom plurality of circuit boards 4101. Top circuit boards 4102 including solder pad features previously disclosed with plated holes 4025 through the top board at the pad locations. Plated holes 4025 in the top circuit board 4102 allow solder and heat to flow down into the connection both to facilitate solder connection and to enable rapid connection.

Figure 49:
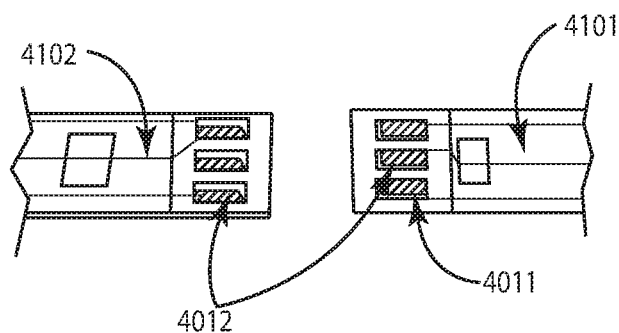
FIG. 49 is a schematic view of two circuit boards with prepared solder pads prior to attachment in accordance with various embodiments herein.

Referring now to FIG. 49, the top and bottom plurality of circuit boards may be prepared in advance with solder paste 4012 onto the solder pads of only the plurality of top circuit boards 4102, or with solder paste 4012 onto the solder pads 4010 of the plurality of top circuit boards 4102 and solder pads 4011 of the plurality of bottom circuit boards 4101, or with solder paste 4012 onto the solder pads 4011 of only the bottom plurality of circuit boards 4101. In some embodiments, the amount of solder paste used is controlled with precision.

Figure 50:
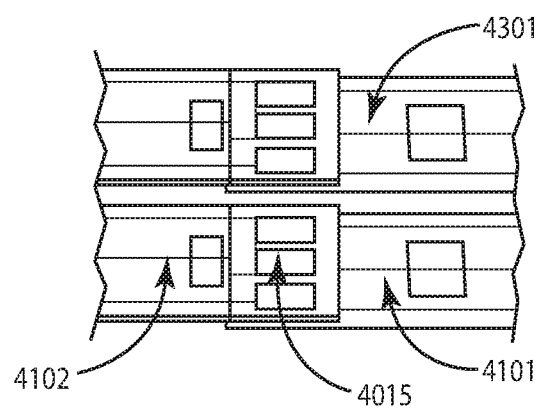
FIG. 50 is a schematic view of a successful solder joint resulting from reflow soldering of a prepared lap joint held by an apparatus and reflow or wave soldered in accordance with various embodiments herein.

Referring now to FIG. 50, the resulting soldered lap joint connection 4117 provides for a reliable mechanical and electrical board-to-board connection for the plurality of top circuit boards 4102 and bottom circuit boards 4101 creating a long circuit board assembly 4301 (or long circuit board strip). The process can be repeated by adding additional top circuit boards 4102 to the newly created long circuit board assembly 4301 to create a long continuous circuit board assembly 4302 (in FIG. 54) (or long continuous circuit board strip).

Figure 51:
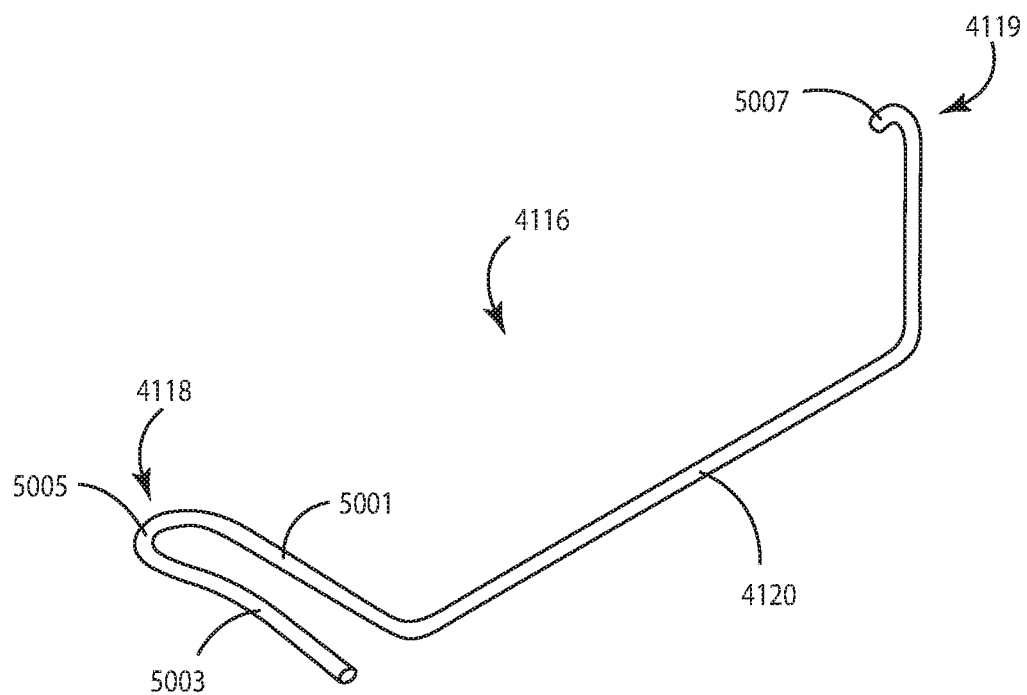
FIG. 51 is a schematic view of a circuit board clamp in accordance with various embodiments herein.

In some embodiments, an apparatus is included for holding a plurality of circuit boards together to provide for alignment of mating solder locations and held in position throughout a reflow or wave soldering process. In some embodiments, this apparatus can be a circuit board clamp. Referring to FIG. 51, the apparatus in some embodiments is in the form of a circuit board clamp 4116 with a fastener 4118, an attachment mechanism 4119 and a spring tension arm 4120. The fastener 4118 applies pressure to a plurality of top circuit boards 4102 and bottom circuit boards 4101. The attachment mechanism 4119 attaches to the bottom of the top circuit boards 4102 and a spring tension arm 4120 provides spring force between the fastener end 4118 and attachment mechanism end 4119. In some embodiments, the fastener 4118 is in the form of a u-shaped fastener. The fastener 4118 can include a top bar portion 5001, a bottom bar portion 5003, and an interconnection member 5005 disposed between the two. In some embodiments, the top bar portion 5001 and the bottom bar portion 5003 are substantially parallel to one another. In some embodiments, the spring tension arm 4120 has a major axis oriented substantially perpendicularly to the top bar portion 5001.

It will be appreciated that the circuit board clamp 4116 may take many shapes in order to accommodate differing boards and connector geometries. The embodiment of FIG. 51 illustrates the form of the circuit board clamp 4116 as constructed from small gauge wire. The selection of a small gauge allows for the fastener end 4118 to easily fit through a narrow routed slot 4121 in the bottom plurality of circuit boards 4102 and be rotated approximately 90 degrees at the intended holding points on the top circuit board at point 4201 and on the bottom circuit board at point 4202 on the overlapping boards (see FIG. 41). The small gauge wire allows for the attachment mechanism end 4119 to pass through the narrow routed slot 4121 in the top plurality of boards 4101. The resulting circuit board clamp 4116 provides the necessary forces as described above to hold the top and bottom plurality of circuit boards in alignment for processing through a reflow or wave soldering operation.

Figure 52:
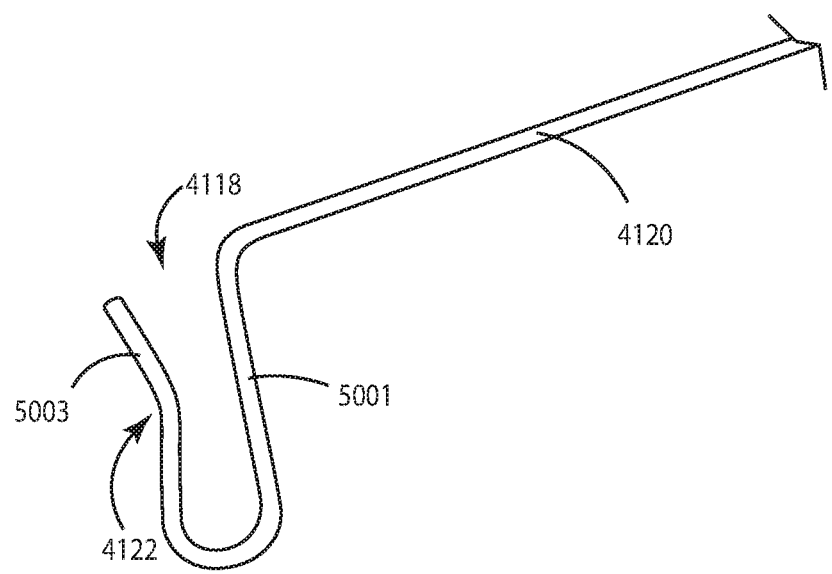
FIG. 52 is a schematic view of a circuit board clamp in accordance with various embodiments herein.

A number of experiments were conducted on the circuit board clamp 4116 embodiment. It was found that a reverse bend 4122 in the bottom bar portion 5003 of the fastener 4118 improved the ability to hold the top circuit board 4102 and bottom circuit board 4101 parallel to each other. The reverse bend 4122 is "reverse" in that it results in the distal end of the bottom bar portion 5003 being pointed away from the top bar portion 5001 as shown in FIG. 52.

Parallel surfaces in the prepared solder joint 4117 were found to improve solder wetting throughout the joint. Further experiments were conducted on the attachment mechanism end 4119 of the circuit board clamp 4116. It was found that a hook attached to the top circuit board 4102 through the narrow routed slot 4121 away from the routed tab between boards 4123 eliminated the need for the circuit board clamp 4116 to be sized specific to each board routing pattern 4121, 4123. In some embodiments, the attachment mechanism 4119 can comprise an attachment hook 5007.

Figure 55:
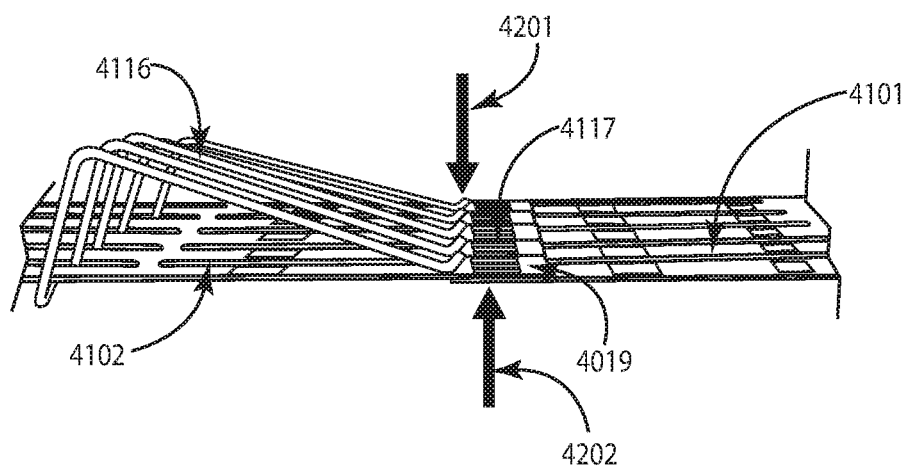
FIG. 55 is a schematic top view of a plurality of circuit board clamps holding top and bottom circuit boards together in accordance with various embodiments herein.
Figure 56:
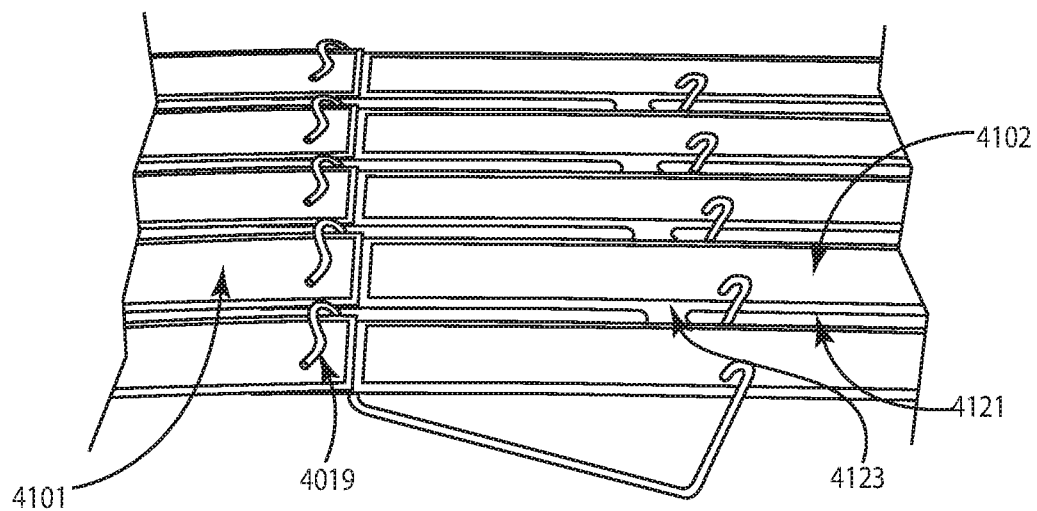
FIG. 56 is a schematic bottom view of a plurality of circuit board clamps holding top and bottom circuit boards together in accordance with various embodiments herein.

FIG. 55 is a schematic top perspective view of a plurality of circuit board clamps 4116 holding top 4102 and bottom 4101 circuit boards together in accordance with various embodiments herein. In reference to FIG. 55, the method of holding involves the application of a downward force 4201 with circuit board clamp 4116 on the top of a prepared lap joint 4117 of the top circuit board 4102 near the intended solder point 4019, an opposing upward force 4202 on the bottom of a prepared lap joint 4117 of the bottom circuit 4101 directly below the intended solder location. The forces are separated by some lateral distance resulting in a force moment at the prepared lap joint 4117 for solder connection. The applied forces and resulting force moment create friction force within the prepared joint. The resulting friction force is sufficient to resist movement due to forces typical in reflow or wave soldering processes and is therefore sufficient to maintain alignment of the top plurality of circuit boards 4101 and bottom plurality of circuit boards 4102 within the prepared lap joint 4117. FIG. 56 is a schematic bottom perspective view of a plurality of circuit board clamps 4116 holding top 4102 and bottom 4101 circuit boards together in accordance with various embodiments herein.

Figure 57:
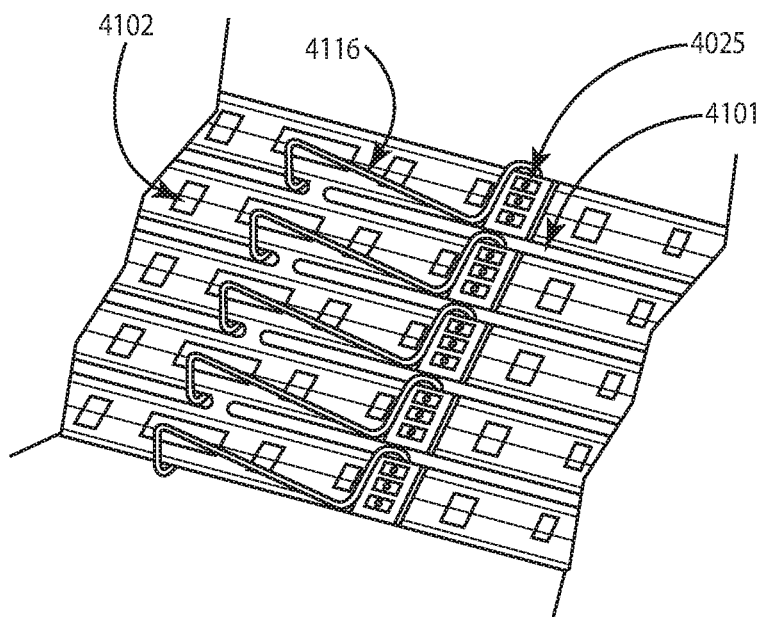
FIG. 57 is a schematic view of a circuit board with circuit board clamps allowing for a visual inspection step in accordance with various embodiments herein.

FIG. 57 is a schematic view of top 4102 and bottom 4101 circuit boards with circuit board clamps 4116 illustrating how the circuit board clamps 4116 allow for a visual inspection step of the through holes 4025 and solder therein in accordance with various embodiments herein.

Figure 58:
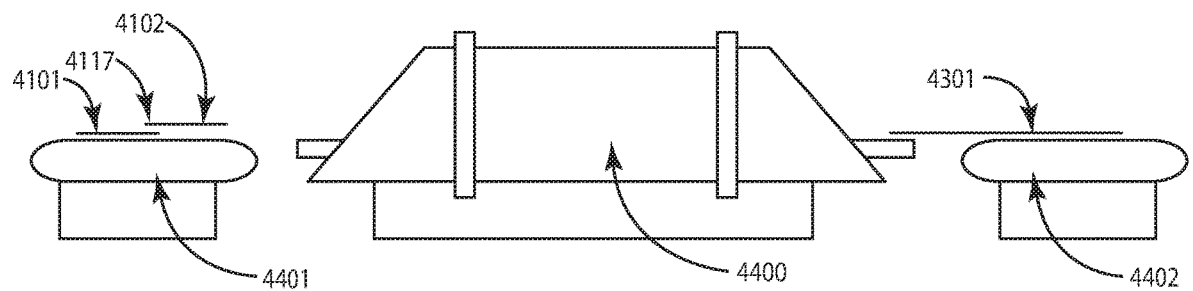
FIG. 58 is a schematic view of a reflow solder oven with conveyor belt feeds in and out of the machine in accordance with various embodiments herein.

In reference to FIG. 58, a reflow soldering process is shown where a plurality of top circuit boards 4102 and a plurality of bottom circuit boards 4101 are held together in a prepared lap joint 4117 and placed onto a conveyor belt 4401 for feeding into reflow solder oven 4400. The resulting reflow soldered long circuit boards 4301 and continuous soldered circuit boards 4302 with soldered lap joints 4015 exit reflow solder oven at conveyor belt 4402.

Figure 59:
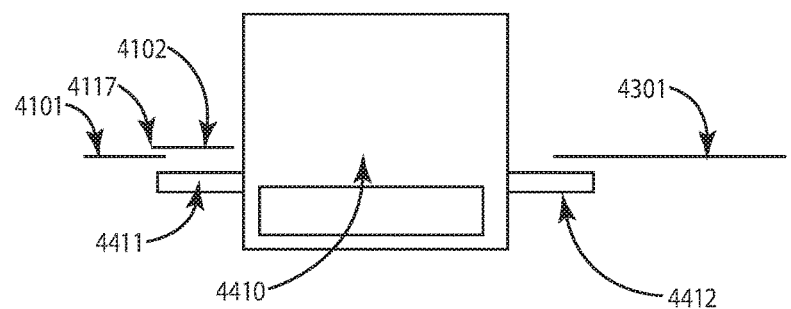
FIG. 59 is a schematic view of a wave solder machine with feeds in and out of tank in accordance with various embodiments herein.

In reference to FIG. 59, a wave soldering process is shown where a plurality of top circuit boards 4102 and a plurality of bottom circuit boards 4101 are held together in a prepared lap joint 4117 and placed onto a wave solder machine 4410 feeder table 4411. The resulting wave soldered long circuit boards 4301 and continuous soldered circuit boards 4302 with soldered lap joints 4117 exit reflow solder oven at exit table 4412.

Pre-Populated Circuit Boards

Figure 53:
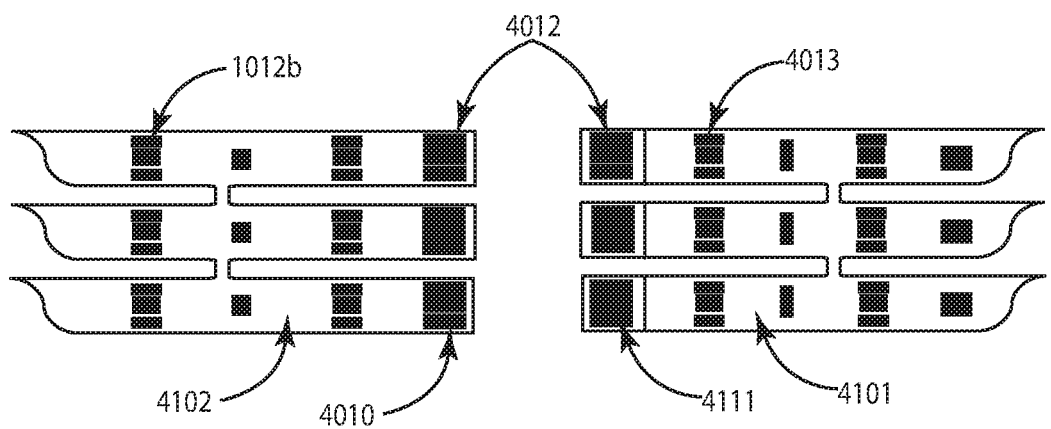
FIG. 53 is a schematic view of a plurality of top and bottom circuit boards each as part of an array of circuit boards arranged parallel to one another with electronic components prepared for soldering in accordance with various embodiments herein.

It will be appreciated that methods in accordance with embodiments herein can be performed with unpopulated circuit boards, pre-populated circuit boards, and pre-populated and pre-soldered circuit boards. By way of example, FIG. 53 shows an embodiment in which the top circuit boards 4102 and bottom circuit boards 4101 may be pre-populated with solder paste 4012b and electronic components 4013 as in conventional preparation of circuit boards for reflow or wave soldering on to the circuit boards. The plurality of populated top circuit boards can then be prepared with solder paste 4012 at the solder pads 4010. Solder paste 4012 may also be applied to the plurality of pre-populated bottom circuit boards 4101 at pads 4011 although tests conducted indicated the addition of solder paste on the bottom circuit board 4101 solder pads 4011 was not necessary to achieve reliable solder joints.

Figure 60:
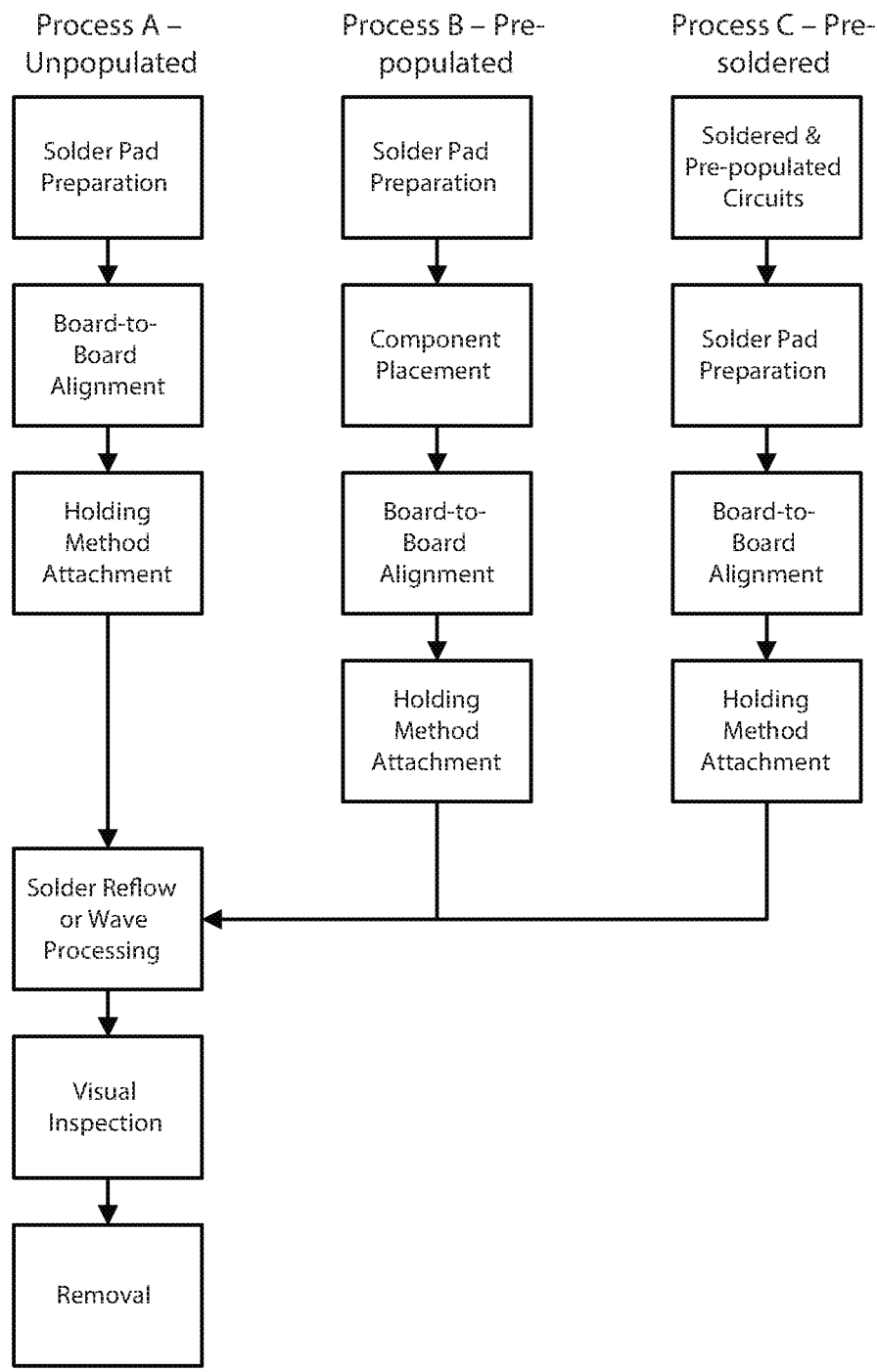
FIG. 60 is a flow diagram of a method with unpopulated, pre-populated, and pre-populated/soldered plurality of circuit boards in accordance with various embodiments herein.

The plurality of pre-populated top circuit boards 4102 can then be aligned over the top of the plurality of pre-populated bottom circuit board 4101 solder pads 4011 and held in place with an apparatus 4116 creating a prepared lap joint 4117 (see e.g., FIG. 47) ready for reflow or wave solder processing. The resulting reliable soldered lap joint 4015 (see, e.g., FIG. 54) can result in a long circuit board assembly 4301 (FIG. 50). The process can be repeated by adding additional top circuit boards 4102 to the newly created long circuit board assembly 4301 to create a long continuous circuit board assembly 4302 (see, e.g., FIG. 54). An example of one method for preparation, alignment, connection, soldering and removal for pre-populated circuit boards is described in FIG. 60 (identified as "Process B—Pre-populated"). It will be appreciated that soldering can include the steps of a heating cycle, solder flow, and a cooling cycle.

The alignment of the top and bottom plurality of circuit boards is aided through initial visual alignment of the solder pad 4010 to solder pad 4011 and board end 4016 and board alignment marks 4014. The top and bottom circuit board alignment for solder processing is then determined by long board edge 4018 and circuit board clamp 4116. The resulting prepared joint 4117 is aligned and held in place with circuit board clamp 4116 for reflow or wave soldering.

Pre-Populated and Pre-Soldered Circuit Boards

Figure 54:
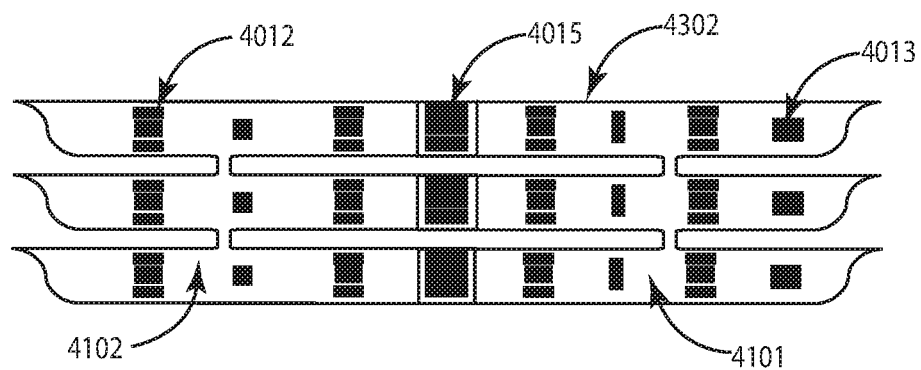
FIG. 54 is a schematic illustration showing the solder connecting a plurality of long continuous circuit boards forming circuit board strips in accordance with various embodiments herein.
Figure 61:
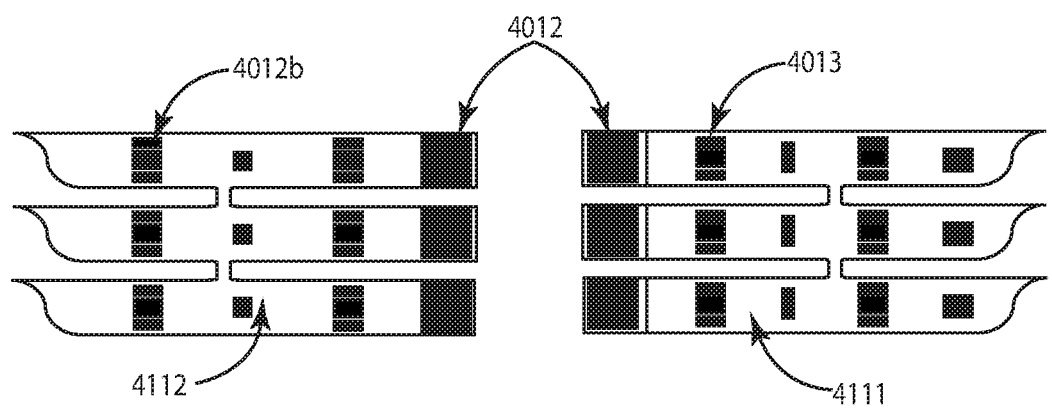
FIG. 61 is a schematic top view of top circuit boards and bottom circuit boards ready for attachment that are pre-populated and pre-soldered with electronic components.

FIG. 61 shows a further embodiment in which the top circuit boards 4112 and bottom circuit boards 4111 both may be pre-populated and pre-soldered with electronic components 4013 soldered onto the plurality of circuit boards. In this embodiment the pre-populated and pre-soldered top circuit boards 4112 can then prepared with solder paste 4012 at the solder pads 4010. Solder paste 4012 can also be added to the plurality of bottom circuit boards 4111, but was found to not be necessary to achieve reliable solder joints. The plurality of pre-populated and pre-soldered top circuit boards 4112 are then aligned over the top of the plurality of pre-populated and pre-soldered bottom circuit boards 4111 for soldering of the prepared lap joint 4117 (FIG. 47) ready for reflow or wave solder processing. The resulting reliable soldered lap joint 4015 (FIG. 54) resulting in a long circuit board assembly 4301 (FIG. 50). The process can be repeated by adding additional top or bottom circuit boards to the newly created long circuit board assembly to create a long-continuous circuit board assembly 4302 (FIG. 54). An example of one method for preparation, alignment, connection, soldering and removal of pre-populated and pre-soldered circuit boards is described in FIG. 60 (identified as "Process C—Pre-Soldered").

Unpopulated Circuit Boards

Figure 62:
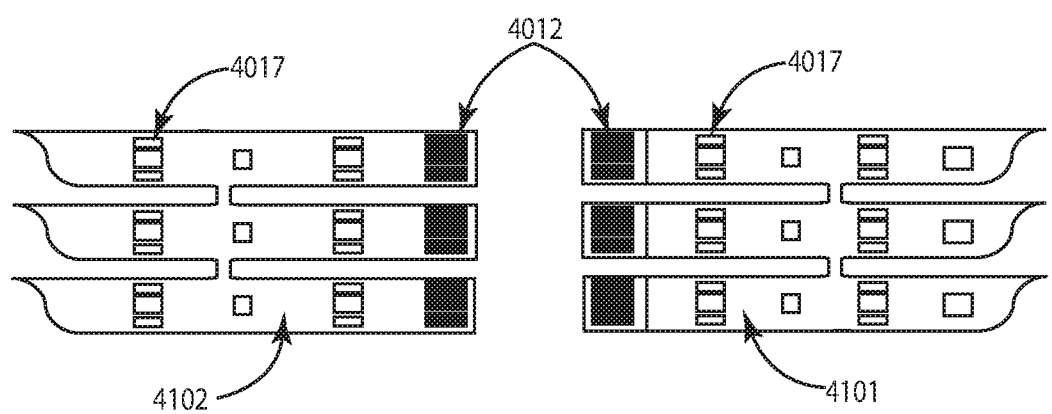
FIG. 62 is a schematic top view of top circuit boards and bottom circuit boards ready for attachment with electrical component positions that are left unpopulated.
Figure 63:
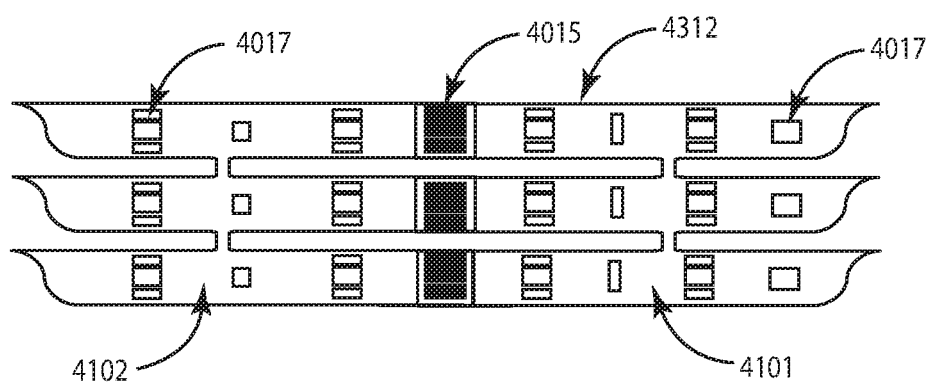
FIG. 63 is a schematic view of a continuous plurality of soldered panelized circuit boards in accordance with various embodiments herein.

FIG. 62 shows a further embodiment included herein where the top circuit boards 4102 and bottom circuit boards 4101 can be left unpopulated and specifically where electrical component positions 4017 can be left unpopulated. The plurality of top circuit boards 4102 can be prepared with solder paste 4012 at the solder pads 4010 for creation of prepared lap joint 4117. Solder paste 4012 can also be added to the plurality of bottom circuit boards 4101, but was found to not be necessary to achieve reliable solder joints. The plurality of pre-populated and pre-soldered top circuit boards 4102 are then aligned over the top of the plurality of pre-populated and pre-soldered bottom circuit boards 4101 for soldering of the prepared lap joint 4117 ready for reflow or wave solder processing. Referring to FIG. 63, the resulting reliable soldered lap joint 4015 resulting in a long circuit board assembly. The process can be repeated by adding additional plurality of top circuit boards 4102 to the newly created long circuit board assembly to create a long-continuous circuit board assembly 4312. An example of one method for the preparation, alignment, connection, soldering and removal of unpopulated circuit boards is described in FIG. 60 (identified as "Process A—Unpopulated").

Experiments conducted during reflow soldering demonstrated a plurality of circuit boards held by an apparatus 4116 in the form of a prepared joint 4117 (FIG. 47) could be successfully soldered together into a reliable solder joint (FIG. 50) providing mechanical and electrical connection between the top circuit board 4102 and bottom circuit board 4101.

A number of experiments were previously conducted to determine solder wetting and flow paths for various pad geometries using overlapped boards in surface mount applications. After melting, solder wets to the metal pads and exposed conductors of printed circuit boards. The solder moves through capillary action to actively fill small gaps and spaces between upper and lower board pads, particularly pads in flat surface-to-surface contact as previously disclosed. The high degree of adhesion and capillary action exhibited by liquid solder, combined with the mechanical force moment on the prepared joint 4117 (FIG. 55) provides for reliable soldering of the top circuit board 4102 and bottom circuit board 4101 into reliable solder joint (FIG. 50).

It should be noted that, as used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

It should also be noted that, as used in this specification and the appended claims, the phrase "configured" describes a system, apparatus, or other structure that is constructed or configured to perform a particular task or adopt a particular configuration to. The phrase "configured" can be used interchangeably with other similar phrases such as arranged and configured, constructed and arranged, constructed, manufactured and arranged, and the like.

All publications and patent applications in this specification are indicative of the level of ordinary skill in the art to which this invention pertains. All publications and patent applications are herein incorporated by reference to the same extent as if each individual publication or patent application was specifically and individually indicated by reference.

The invention has been described with reference to various specific and preferred embodiments and techniques. However, it should be understood that many variations and modifications may be made while remaining within the spirit and scope of the invention.

Further Embodiments

In some embodiments, an LED lighting system is included. The LED lighting system can include a flexible layered circuit structure including a top thermally conductive layer, a middle electrically insulating layer, a bottom thermally conductive layer, and a plurality of light emitting diodes mounted on the top layer. The system can further include a housing substrate and a mounting structure. The mounting structure can be configured to suspend the layered circuit structure above the housing substrate with an air gap disposed in between bottom thermally conductive layer of the flexible layered circuit structure and the housing substrate. The distance between the layered circuit structure and the support layer can be at least about 0.5 mm. The system can further include a plurality of light emitting diodes mounted on the bottom layer. The system can further include an optically translucent material layer disposed over the top thermally conductive layer. The distance between the layered circuit structure and the support layer can be between about 0.5 mm and 100 mm. The distance between the layered circuit structure and the support layer can be between about 40% and 60% of the width of the flexible layered circuit structure. The mounting structure can include a tensioner to apply tension to the flexible layered circuit structure. The tensioner can provide a spring force applied to the flexible layered circuit structure. The tensioner can include a spring. The tensioner can be configured to maintain a tension force of at least one ounce (0.28 N). The tensioner can be configured to maintain a tension force of at least one ounce (0.28 N) despite thermal expansion of the flexible layered circuit structure of up to 1 millimeter per meter in length of the flexible circuit structure. The mounting structure can include a fastener. The mounting structure can include a hook. The mounting structure can include a pin. The mounting structure can include a clip. The mounting structure can include a spring clip. The mounting structure can include a tab or tab receptacle. The mounting structure can be direct or indirectly attached to the housing substrate. The flexible layered circuit structure can include a first end and a second end, wherein the mounting structure engages the first end and the second end. The flexible layered circuit structure can be in a U shape such that the first end and the second end are disposed adjacent to one another. The flexible layered circuit structure can have a first lateral side and a second lateral side, wherein the mounting structure can engage at least one of the first lateral side and the second lateral side. The housing substrate can include a material that can be selected from the group consisting of organic and inorganic structural materials. The housing substrate can include a material that can be selected from the group consisting of a polymer, a cellulosic material, a composite, a glass, and stone. The housing substrate can include a metal. The light emitting diodes mounted on the top layer can have a power of between 0.25 and 3 watts per inch squared of the surface area of the bottom layer. The flexible circuit structure can have sufficient flexibility to achieve bending with a radius of curvature of at least 1 inch. The flexible layered circuit structure can define apertures, the mounting structure can be configured to engage the apertures to support the flexible layered circuit structure. The bottom thermally conductive layer can include a textured surface having a surface area greater than an equally sized substantially flat surface. The bottom thermally conductive layer can include a plurality of heat sink fins mounted thereon. The bottom thermally conductive layer can include a textured surface having a surface area at least 20 percent greater than an equally sized substantially flat surface. The system can further include a coating over the bottom thermally conductive layer, the coating can include a material with properties that enhance heat transfer. The coating can include tinning. The bottom layer can be covered with a thermally conductive and emissive material. The housing substrate can be coated with a material to enhance heat flow across the air gap. The top layer can include 0.5 to 4.0 ounces per square foot of copper, the intermediate layer can include fiberglass 0.005 to 0.020 inches thick, and the bottom layer can include 0.5 to 4.0 ounces per square foot of copper. The top, intermediate, and bottom layers, together, can have a thermal resistance of less than 10 degrees Celsius per Watt. The system can be configured to have thermal transfer properties sufficient to allow the system to maintain a thermal equilibrium at or below the critical junction temperatures for the LEDs without the addition of secondary heat sinking. The flexible layered circuit structure is attached to the mounting structure in a releasable manner. The flexible layered circuit structure can be releasable from the mounting structure without the use of tools. The flexible layered circuit structure can be configured for replacement.

In some embodiments, an LED lighting system is included. The LED lighting system can include a flexible layered circuit structure including a top thermally conductive layer, a middle electrically insulating layer, a bottom thermally conductive layer, a plurality of light emitting diodes mounted on the bottom layer, a housing substrate, and a mounting structure. The mounting structure can be configured to suspend the layered circuit structure above the housing substrate with an air gap disposed in between bottom thermally conductive layer of the flexible layered circuit structure and the housing substrate, wherein the distance between the layered circuit structure and the support layer is at least about 0.5 mm.

In some embodiments, a method for making an LED lighting system is included. The method for making an LED lighting system can include obtaining a flexible layered circuit structure that includes, a top thermally conductive layer, a middle electrically insulating layer, a bottom thermally conductive layer. The method can also include suspending the flexible layered circuit structure above a housing substrate with an air gap disposed in between the bottom thermally conductive layer of the flexible layered circuit structure and the housing substrate, wherein the distance between the layered circuit structure and the housing substrate is at least about 0.5 mm, and connecting the flexible layered circuit structure to a power source. Suspending can include attaching the flexible layered circuit structure to a mounting structure. The mounting structure can provide the connection to the power source. The method can further include cutting the flexible layered circuit structure to a desired length. The method can further include unwinding the flexible layered circuit structure from a storage reel prior to cutting. Suspending can include attaching the flexible layered circuit structure to a mounting structure that provides a tension force along the length of the flexible layered circuit structure. The method can further include applying a tension force of at least one ounce (0.28 N) to the flexible layered circuit structure. The method can further include removing the flexible layered circuit structure from the position suspended above a housing substrate. The step of removing can be accomplished without tools. The method can further include replacing the flexible layered circuit structure with another flexible layered circuit structure.

In some embodiments, a method for operating an LED lighting system is included. The method for operating an LED lighting system can include providing electrical current to an LED lighting circuit, the LED lighting circuit including a plurality of light emitting diodes, the LED lighting circuit disposed upon a flexible layered circuit structure. The flexible layered circuit structure can include a top thermally conductive layer, a middle electrically insulating layer, and a bottom thermally conductive layer. The method can further include dissipating heat from the light emitting diodes to ambient air through the top surface of the top thermally conductive layer and the bottom surface of the bottom thermally conductive layer.

In some embodiments, an LED lighting system is included. The LED lighting system can include a flexible layered circuit structure including a top thermally conductive layer, a middle electrically insulating layer, a bottom thermally conductive layer, and a plurality of light emitting diodes mounted on the top layer. The flexible layered circuit structure can be formed into a loop. The loop can be disposed within a housing. The loop can be separated from the housing by an air gap. The loop can be disposed sideways to the support structure.

The invention claimed is:
1. An interconnectable circuit board array, comprising:
a first flexible interconnectable circuit board, comprising:
a conductive layer between two electrically isolating layers;
a first electrically conductive pad disposed on a top surface of the first flexible interconnectable circuit board;
a second electrically conductive pad disposed on the top surface of the first flexible interconnectable circuit board;
a third electrically conductive pad disposed on the top surface of the first flexible interconnectable circuit board;
a fourth electrically conductive pad disposed on the top surface of the first flexible interconnectable circuit board; and
a first LED of the first flexible interconnectable circuit board disposed on the top surface, wherein the first LED of the first flexible interconnectable circuit board is conductively connected to the conductive layer; and
a second flexible interconnectable circuit board, comprising:
a conductive layer between two electrically isolating layers;
a first electrically conductive pad disposed on a top surface of the second flexible interconnectable circuit board;
a second electrically conductive pad disposed on the top surface of the second flexible interconnectable circuit board;
a third electrically conductive pad disposed on the top surface of the second flexible interconnectable circuit board;
a fourth electrically conductive pad disposed on the top surface of the second flexible interconnectable circuit board; and
a first LED of the second flexible interconnectable circuit board disposed on the top surface, wherein the first LED of the second flexible interconnectable circuit board is conductively connected to the conductive layer;
wherein the first flexible interconnectable circuit board is arranged with the second flexible interconnectable circuit board such that a longitudinal axis of the first flexible interconnectable circuit board is aligned with a longitudinal axis of the second flexible interconnectable circuit board; and
wherein a portion of the first flexible interconnectable circuit board overlaps a portion of the second flexible interconnectable circuit board such that the first electrically conductive pad of the first flexible interconnectable circuit board is at least partially aligned with the third electrically conductive pad of the second flexible interconnectable circuit board, and the second electrically conductive pad of the first flexible interconnectable circuit board is at least partially aligned with the fourth electrically conductive pad of the second flexible interconnectable circuit board;

wherein the first electrically conductive pad of the first flexible interconnectable circuit board is conductively connected with the third electrically conductive pad of the second flexible interconnectable circuit board and the second electrically conductive pad of the first flexible interconnectable circuit board is conductively connected with the fourth electrically conductive pad of the second flexible interconnectable circuit board;

wherein a material is applied to the top surface of the first flexible interconnectable circuit board and to the top surface of the second flexible interconnectable circuit board, such that the material extends over an end of the first flexible interconnectable circuit board and onto the top surface of the second flexible interconnectable circuit board.

2. The interconnectable circuit board array of claim 1, wherein the material is a potting material.

3. The interconnectable circuit board array of claim 1, further comprising a third flexible interconnectable circuit board comprising:
- a conductive layer between two electrically isolating layers;
  - a first electrically conductive pad disposed on a top surface of the third flexible interconnectable circuit board;
  - a second electrically conductive pad disposed on the top surface of the third flexible interconnectable circuit board;
  - a third electrically conductive pad disposed on a top surface of the third flexible interconnectable circuit board;
  - a fourth electrically conductive pad disposed on the top surface of the third flexible interconnectable circuit board; and
  - a first LED of the third flexible interconnectable circuit board disposed on the top surface, wherein the first LED of the third flexible interconnectable circuit board is conductively connected to the conductive layer;
- wherein the second flexible interconnectable circuit board is arranged with the third flexible interconnectable circuit board such that the longitudinal axis of the second flexible interconnectable circuit board is aligned with a longitudinal axis of the third flexible interconnectable circuit board;
- wherein a portion of the second flexible interconnectable circuit board overlaps a portion of the third flexible interconnectable circuit board such that the first electrically conductive pad of the second flexible interconnectable circuit board is at least partially aligned with the third electrically conductive pad of the third flexible interconnectable circuit board, and the second electrically conductive pad of the second flexible interconnectable circuit board is at least partially aligned with the fourth electrically conductive pad of the third flexible interconnectable circuit board;
- wherein the first electrically conductive pad of the second flexible interconnectable circuit board is conductively connected with the third electrically conductive pad of the third flexible interconnectable circuit board and the second electrically conductive pad of the second flexible interconnectable circuit board is conductively connected with the fourth electrically conductive pad of the third flexible interconnectable circuit board;
- wherein a material is applied to the top surface of the second flexible interconnectable circuit board and to the top surface of the third flexible interconnectable circuit board, such that the material extends over an end of the second flexible interconnectable circuit board and onto the top surface of the third flexible interconnectable circuit board.

4. The interconnectable circuit board array of claim 1, wherein the interconnectable circuit board array is configured to be sufficiently flexible to achieve a radius of curvature of 6 inches.

5. The interconnectable circuit board array of claim 1, wherein the interconnectable circuit board array is configured to be sufficiently flexible to achieve a radius of curvature of 1 inch.

6. The interconnectable circuit board array of claim 1, wherein the interconnectable circuit board array is configured to be sufficiently flexible to be wrapped about a hub of a reel.

7. The interconnectable circuit board array of claim 1, wherein the first flexible interconnectable circuit board further comprises: a second LED of the first flexible interconnectable circuit board disposed on a bottom surface of the first flexible interconnectable circuit board, wherein the second LED of the first flexible interconnectable circuit board is conductively connected to the conductive layer.

* * * * *